(12) United States Patent
Ochiai et al.

(10) Patent No.: US 6,340,973 B1
(45) Date of Patent: Jan. 22, 2002

(54) MEMORY CONTROL UNIT AND MEMORY CONTROL METHOD AND MEDIUM CONTAINING PROGRAM FOR REALIZING THE SAME

(75) Inventors: Toshiyuki Ochiai, Ibaraki; Yosuke Furukawa, Neyagawa; Yutaka Tanaka; Kozo Kimura, both of Osaka; Makoto Hirai, Suita; Tokuzo Kiyohara, Osaka; Hideshi Nishida, Nishinomiya, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/244,036

(22) Filed: Feb. 4, 1999

(30) Foreign Application Priority Data

Feb. 4, 1998 (JP) ............................................ 10-023651
Dec. 3, 1998 (JP) ............................................ 10-344522

(51) Int. Cl.$^7$ ............................................. G06F 13/372
(52) U.S. Cl. ........................ 345/534; 345/531; 345/572; 711/5; 711/100; 711/154
(58) Field of Search .................................. 345/531, 572, 345/522, 536, 538, 534, 564, 530; 711/1, 5, 100, 104, 105, 154, 170–173

(56) References Cited

U.S. PATENT DOCUMENTS

| | | | | |
|---|---|---|---|---|
| 5,043,874 A | * | 8/1991 | Gagliardo et al. | 711/151 |
| 6,026,478 A | * | 2/2000 | Dowling | 712/24 |
| 6,044,206 A | * | 3/2000 | Kohn | 395/200.78 |
| 6,070,227 A | * | 5/2000 | Rokicki | 711/117 |
| 6,205,511 B1 | * | 3/2001 | Wen | 711/5 |

FOREIGN PATENT DOCUMENTS

JP 6-76567 3/1994 ........... G11C/11/34

OTHER PUBLICATIONS

NEC Datasheet, MOS Integrated Circuit μPD4516421A, 4516821A, 4516161A for Rev. P 16M–bit Synchronous DRAM (Document number: M12939EJ3VODSOO (3rd edition), Issue Date: Apr. 1998 N CP (K).

* cited by examiner

*Primary Examiner*—Kee M. Tung
(74) *Attorney, Agent, or Firm*—Wenderoth, Lind & Ponack, L.L.P.

(57) ABSTRACT

A transfer-target unit outputs commands for data reading and data writing. An address generator generates control signals in accordance with the commands, and outputs the number of bytes of data first transferred by read access. A command generator generates control commands in accordance with the control signals to control an SDRAM. At this time the command generator judges the number of transferred bytes to control so that the SDRAM executes instructions in order from an instruction which is the most efficient in data transfer. That is, in the case where data is read across a bank boundary, the command generator judges which is to be executed first between read processing in a bank 0 and active processing in a bank1, to control the SDRAM. A data processor mediates data transfer between the transfer-target unit and the SDRAM in accordance with the control commands.

In this way, it is possible to issue commands so as to terminate data transfer in the minimum number of cycles in the case where data read processing is continuously performed to different banks. The number of cycles required for two continuous access (access to the bank 0 and the bank 1) can be thus reduced, thereby increasing effective transfer rates of the SDRAM.

47 Claims, 34 Drawing Sheets

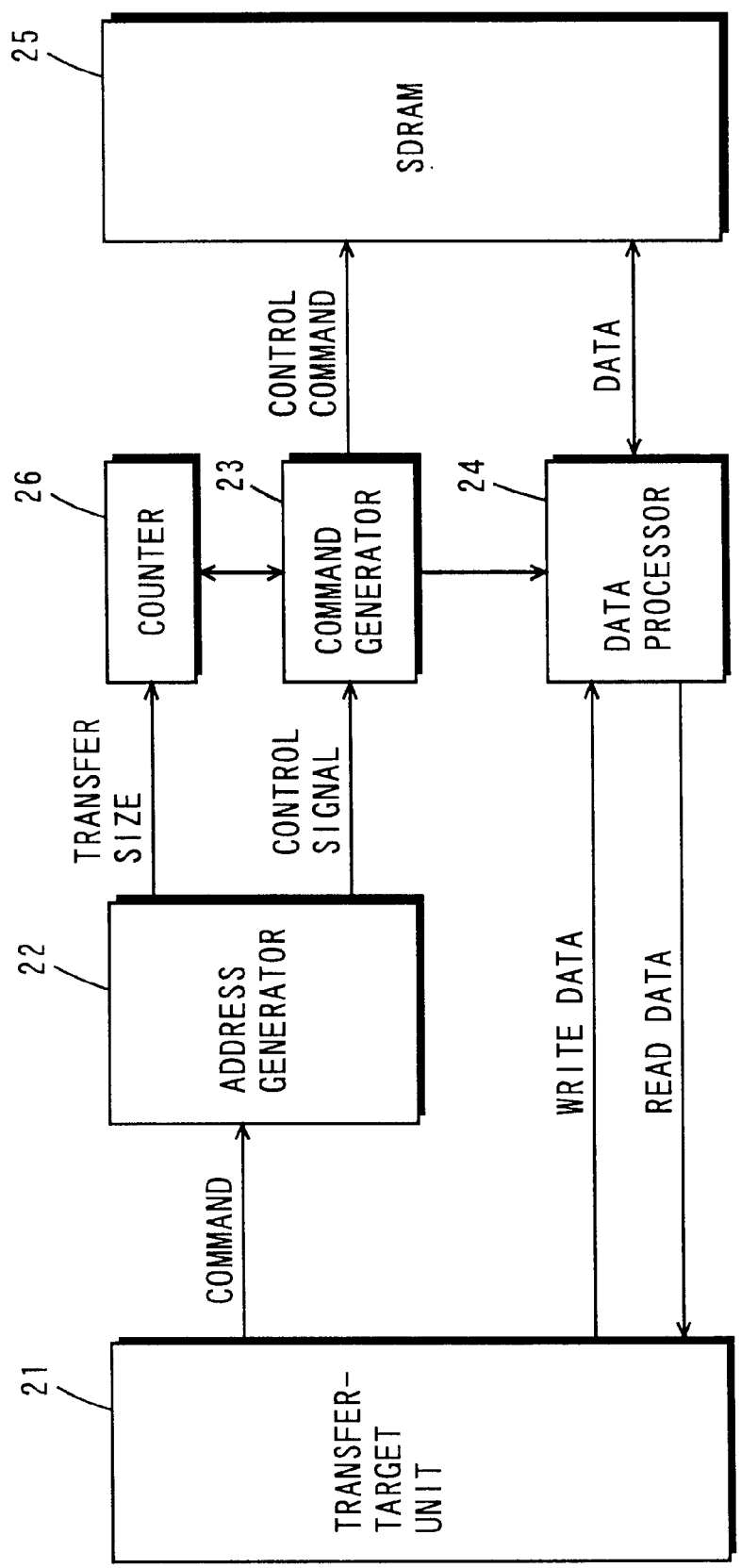
F I G. 5

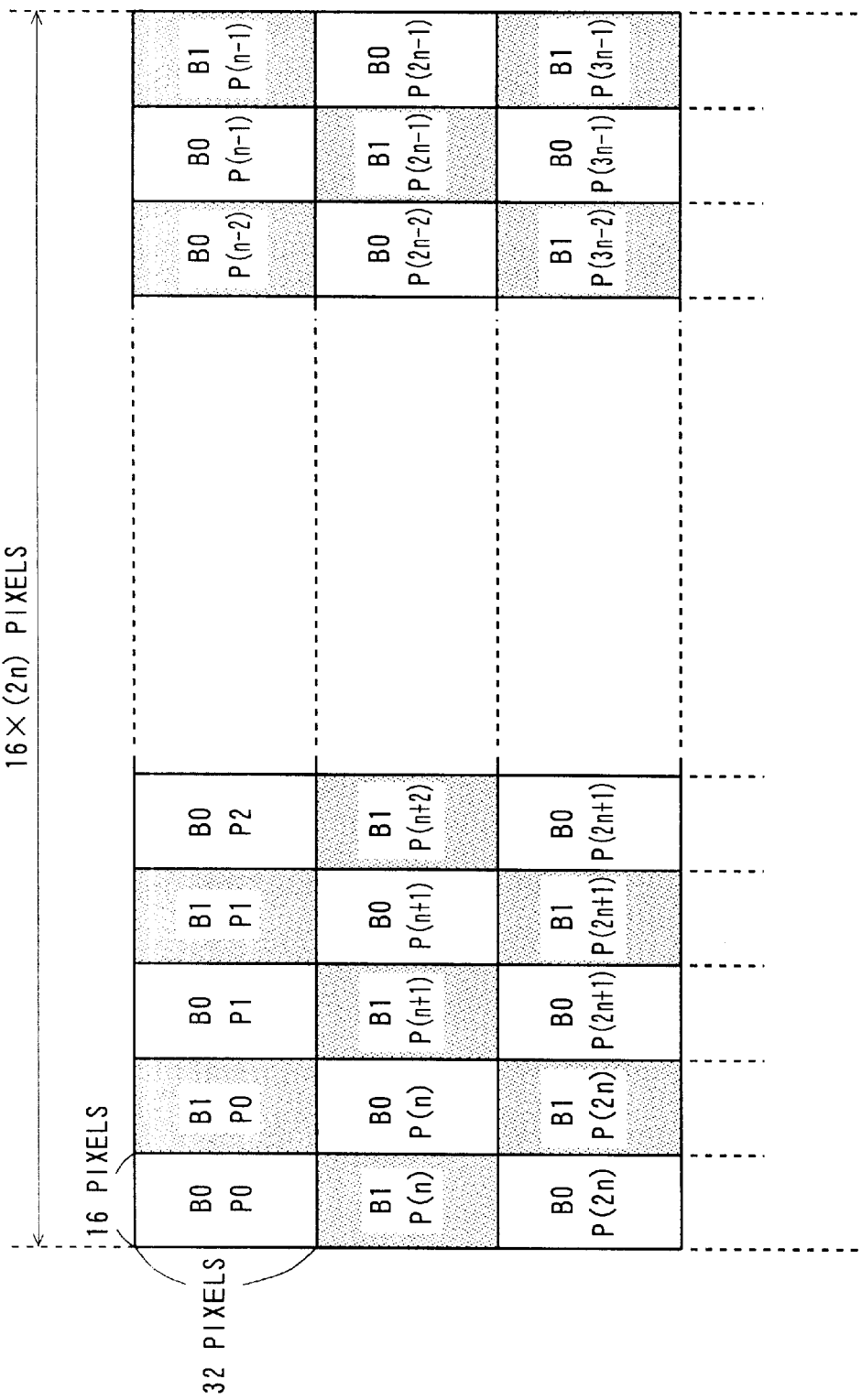
F I G. 26

F I G. 2 9  PRIOR ART

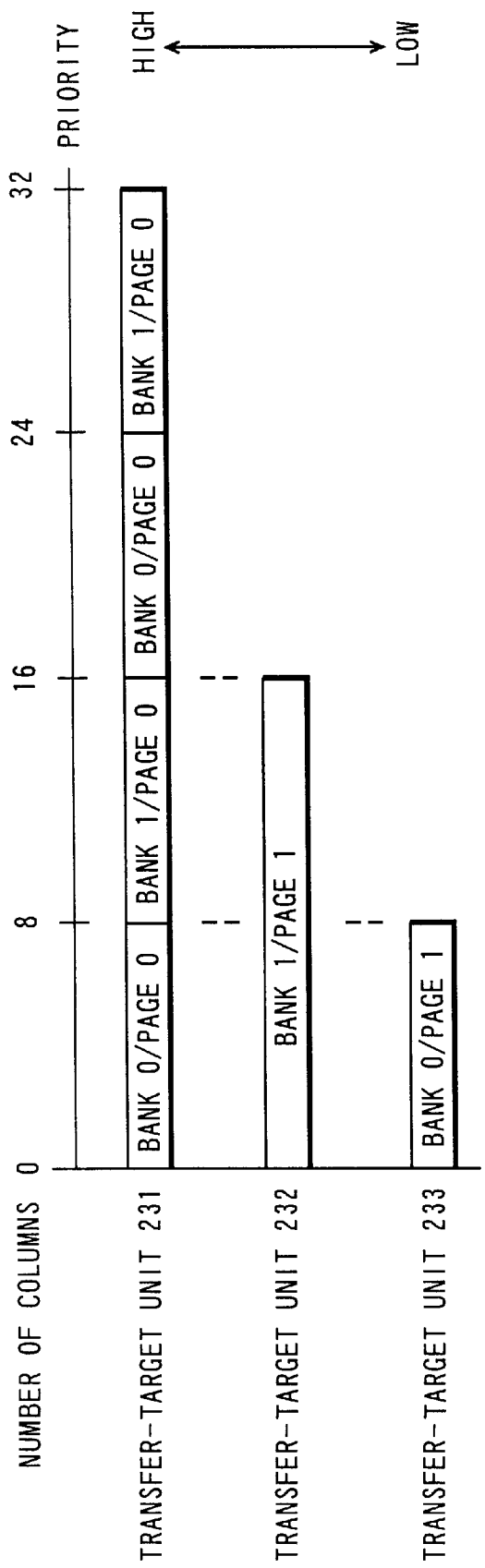

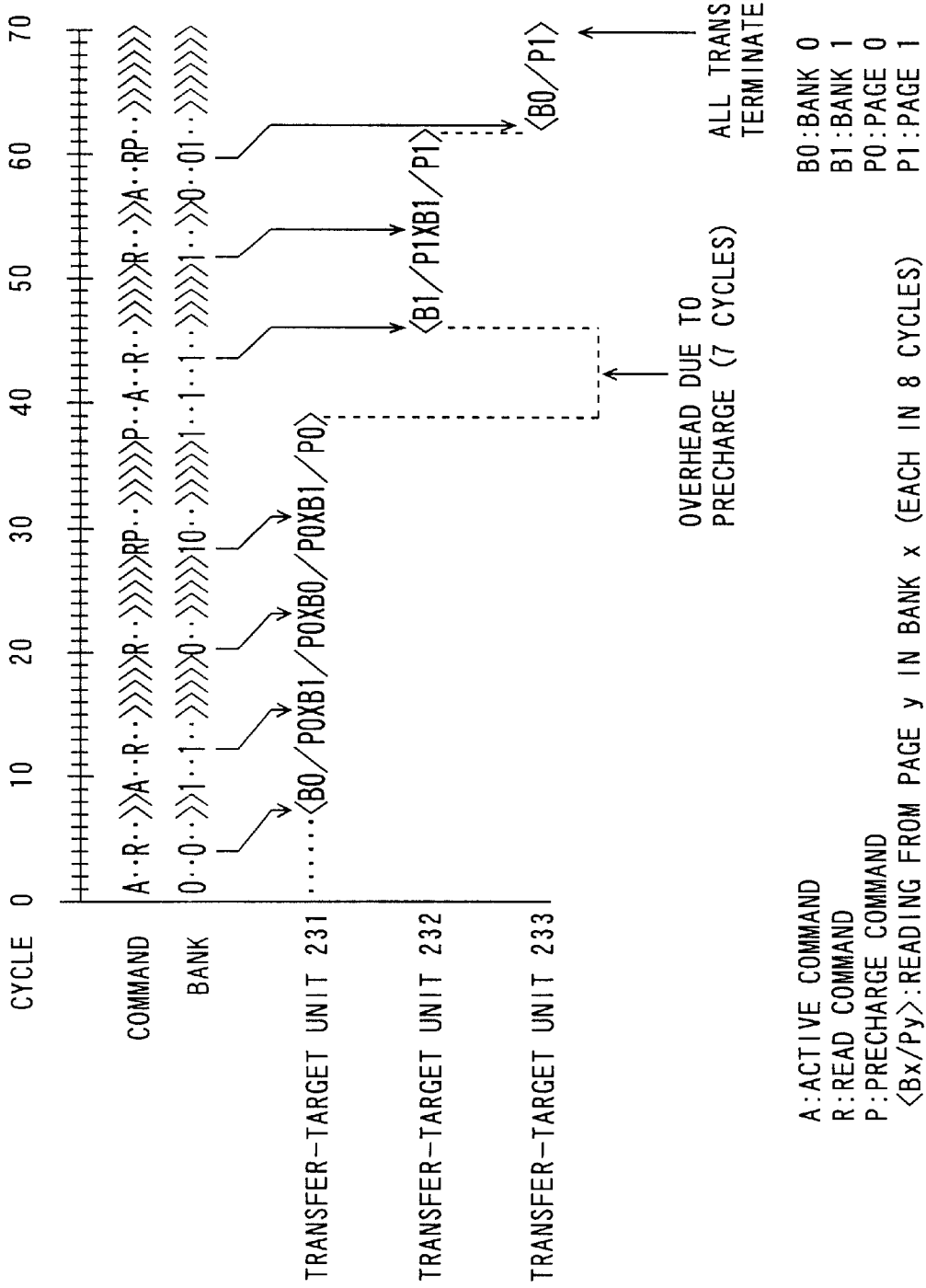

MEMORY CONTROL UNIT AND MEMORY CONTROL METHOD AND MEDIUM CONTAINING PROGRAM FOR REALIZING THE SAME

BACKGROUND OF THE INVENTION

1. Field of the Invention

The present invention relates to memory control units, memory control methods and media containing programs for realizing the same. More particularly, the present invention relates to a unit, a method and a medium containing a program, in a circuit controlling memory in which a delay develops depending on order of access thereto such as a dynamic random access memory (DRAM) that transfers data in synchronization with an operation clock to be a basis of operation, i.e., synchronous DRAM (SDRAM), for optimizing the access order to increase an actual bus bandwidth to SDRAM.

2. Description of the Background Art

The SDRAM has been conventionally in existence as one of apparatus for storing data. In SDRAM, burst transmission that continuously transfers data in synchronization with an operation clock can be designated, and the predetermined number of bits which is the smallest unit for read and write (hereinafter, referred to as a word length) can be continuously transferred the previously-specified number of times (hereinafter, referred to as a burst length) in one clock unit. Therefore, SDRAM has excellent usability.

FIG. 27 shows a memory area of a typical SDRAM. A memory area of an SDRAM is generally divided into banks composed of a plurality of pages. The SDRAM shown in FIG. 27 is divided into two banks, i.e., banks 0 and 1 which are each composed of "n" pages from a page 0 to a page (n−1). Each page is composed of "m" columns from a column 0 to a column (m−1). Here, n and m are both integers of not less than 1. Since data is read and written column by column, the word length is equal to the number of bits in one column. For example, one column is 8 bits, m is 512, and n is 2048.

FIG. 28 is a state-transition diagram of a typical SDRAM. The SDRAM generally comprises a "sense amplifier" in each bank. As is clear from FIG. 28, when data stored in a column is read or data is written into a column, data in a page including the column to be read or written is previously transferred to a sense amplifier (activate) in a bank to which the page belongs, afterwhich the data is read or written from/in the sense amplifier (hereinafter, "read and write" are simply referred to as "access"). When access is continuously made to columns included in the same page in the same bank, however, data in the corresponding page has been already transferred to the sense amplifier, and therefore it is not necessary to transfer the data again.

Moreover, when a column A included in a page A is accessed and then access is made to a column B included in a page B belonging to the same bank as the page A, it is required to transfer the contents of a sense amplifier previously holding data corresponding to the page A to the page A (precharge) once and then transfer data in the page B to the sense amplifier (activate). Accordingly, when access is continuously made to columns included in different pages in the same bank, it is required to precharge and activate, resulting in a decrease of actual transfer rates.

However, since the memory area of SDRAM is divided into a plurality of banks, the decrease of actual transfer rates can be avoided by accessing different banks in the case of continuous access and performing precharge and activation processing in each bank during accessing of the other bank.

The SDRAM is described in detail, for example, in "NEC DATASHEET, MOS Integrated Circuit μ PD4516421A, 4516821A, and 45116161A for Rev.P 16M-bit Synchronous DRAM (Document number: M12939EJ3V0DS00 (3rd edition), Issue date: April 1998, N CP(K))" and "Japanese Patent Laying-Open No.6-76567: Semiconductor Memory Device and Synchronism Type Semiconductor Memory Device".

As a memory control unit for efficiently controlling such a high-performance SDRAM, a unit as described below has been conventionally used. FIG. 29 is a block diagram showing an example of a structure of a conventional memory control unit. In FIG. 29, the conventional memory control unit comprises a transfer-target unit 81, an address generator 82, a command generator 83, a data processor 84, and an SDRAM 85.

The transfer-target unit 81 outputs commands such as a start address, a transfer size, read/write and the like to the address generator 82, to transfer data between the SDRAM 85. The address generator 82 generates a plurality of control signals for a start address, a burst length, read/write and the like based on the commands received from the transfer-target unit 81, and outputs the signals to the command generator 83. The command generator 83 generates control commands such as a clock (CLK), a row address strobe (RAS), a column address strobe (CAS), write enable (WE), addressing and the like based on the control signals received from the address generator 82, and thereby controls the SDRAM 85 and the data processor 84. The data processor 84 transfers read data from the SDRAM 85 to the transfer-target unit 81 according to the control commands received from the command generator 83, and also transfers write data from the transfer-target unit 81 to the SDRAM 85. The SDRAM 85 has features similar to those of a typical SDRAM as described above, and is controlled by the control commands acquired from the command generator 83.

As a memory system for efficiently controlling such a high-performance SDRAM, a system as described below has been conventionally used. FIG. 30 shows an example of a structure of a conventional memory system. In FIG. 30,the conventional memory system comprises transfer-target units 231 to 233, an arbiter 234, an SDRAM controller 235, and an SDRAM 85.

Each of the transfer-target units 231 to 233 outputs a transfer request signal to the arbiter 234 when required to transfer data with the SDRAM 85, and outputs transfer information to the SDRAM controller 235 when a transfer enabling signal is returned from the arbiter 234. When acquiring a transfer request signal from any one of the transfer-target units, the arbiter 234 returns a transfer enabling signal to the transfer-target unit which outputs the transfer request signal. Moreover, when acquiring transfer request signals from a plurality of transfer-target units, the arbiter 234 selects a higher-priority signal among the transfer request signals, then returns a transfer enabling signal to the transfer-target unit which outputs the selected transfer request signal. The same processing is performed to the remaining transfer request signals which are not selected. The SDRAM controller 235 is constituted by the address generator 82, the command generator 83, and the data processor 84 as described above. The SDRAM controller 235 generates control commands such as CLK, RAS, CAS, WE, an access address and the like based on the transfer information from the transfer target unit, and outputs the commands to the SDRAM 85, thereby realizing data transfer between the SDRAM 85 and the transfer-target unit which outputted the transfer information. The SDRAM 85 has features similar to those of a typical SDRAM described earlier, and is controlled by the control commands acquired from the SDRAM controller 235.

However, in controlling the SDRAM 85 in the conventional memory control unit structured as described above (see FIG. 29), the performance of the SDRAM can not be effectively utilized in some cases depending on conditions of data transfer.

Such case arises when, in the SDRAM 85, where its memory area is divided into banks 0 and 1, a total of ten pieces of data which is data a1 and a2 existing in the bank 0 and data b1 to data b8 existing in the bank 1 are continuously read across a bank boundary as shown in FIG. 31, for example.

In this case, the data a2 in the bank 0 and the data b1 in the bank 1 cannot be simultaneously read, therefore the order of commands to be issued from the command generator 83 to the SDRAM 85 is determined as shown in FIG. 32. In FIG. 32, precharge commands to the banks 0 and 1 are represented by "Pa" and "Pb", respectively, active commands to the banks 0 and 1 are represented by "Aa" and "Ab", respectively, and read commands to the banks 0 and 1 are represented by "Ra" and "Rb", respectively. Besides, it is assumed that CAS latency is "3" clocks, and a burst length is "8" data. Then, an interval in which a precharge command, an active command, and a read command can be issued to the same bank (that is an interval Pa→Aa→Ra, or an interval Pb→Ab→Rb), and an interval in which active commands are issued to the banks 0 and 1 (that is an interval Aa⇆Ab) are each 3 clocks since the intervals are constrained to the CAS latency which is a minimum transition time.

Referring to FIG. 32, the command generator 83 first issues the Pa command to the bank 0 including the data a1 and a2 to read the data (in the zeroth cycle). Since the Aa command cannot be continuously issued to the bank 0 due to the constraint of the CAS latency, the Pb command is issued to the bank 1 in the interval (in the first cycle). Afterwards, the Aa command is issued at the third clock from the issue of the Pa command (in the third cycle).

A command which can be issued next is the Ra command to the bank 0 or the Ab command to the bank 1, however, both commands must wait until three clocks have elapsed because of the constraint of the CAS latency. Note that there is such rule as the command generator 83 processes the control signals in the order that they are sent from the address generator 82. Accordingly, the command generator 83 issues the Ra command first after three clocks have elapsed (in the sixth cycle), and next issues the Ab command (in the seventh cycle). The Rb command, resultantly, is issued in the tenth cycle at the earliest.

By the processing described above, the data a1 and a2 are sequentially read from the ninth cycle which is at the third clock from the issue of the Ra command, and data b1 to b8 are sequentially read from the thirteenth cycle which is at the third clock from the issue of the Rb command. Accordingly, entire data reading is terminated in the twentieth cycle.

The conventional memory control unit, thus, has the fixed rule and constraint as described above. Therefore, since the data in the banks 0 and 1 cannot be continuously read (see the eleventh to twelfth cycles in FIG. 32), there occurs some cases that it takes a large amount of time to terminate the entire data reading. That is to say, when data is continuously transferred across the bank boundary from an arbitrary address in the SDRAM 85, such problem arises as the efficiency in data transfer is degraded due to the uniquely-determined procedure of issuing commands.

On the other hand, in the conventional memory system described above (FIG. 30), the SDRAM cannot be efficiently controlled in some cases.

FIG. 33 shows, column by column, numbers of pages including columns to be accessed in data transfer requested by transfer-target units, and numbers of banks to which the pages belong, in order that the columns are accessed. As shown in FIG. 33, it is assumed here that priority of data transfer becomes higher toward the upper transfer-target unit, and the transfer-target unit 231 requests for data transfer to alternatively access the page 0 in the bank 0 and the page 0 in the bank 1 four times in total in units of eight columns, the transfer-target unit 232 requests for data transfer to access the paged in the bank 1 twice in total in units of eight columns, and the transfer-target unit 233 requests for data transfer to access the page 1 in the bank 0 only once in eight columns.

FIG. 34 shows an order of the data transfer in operation clocks in the case where the data transfer as shown in FIG. 33 is simultaneously requested from the transfer-target units. It is assumed in FIG. 34 that the CAS latency is 3, and a burst length is 8. The CAS latency here represents latency (the number of clocks) from input of a read command to reading of the corresponding data. Also, the burst length here represents the number of words outputted or inputted in a read cycle or a write cycle. Since the CAS latency is 3 in the present example, read data until one clock after a precharge command is inputted is effective. Besides, it is assumed that an interval between a precharge command and an active command and an interval between an active command and a read command to the same bank must be both more than or equal to three clocks.

As shown in FIG. 34, data is transferred according to the priority, i.e., in order of the transfer-target unit 231, the transfer-target unit 232, and the transfer-target 233. In this example, a column to be transferred last in response to a request from the transfer-target unit 231 is included in the page 0 in the bank 1, and a column to be first transferred in response to a request from the transfer-target unit 232 is included in the page 1 in the bank 1. That is, the columns included in the different pages in the same bank are to be continuously accessed. Accordingly, since precharge and active processing cannot be performed while accessing the other bank, overhead is produced in the interval, thereby decreasing actual transfer rates.

Furthermore, when the SDRAM as described above is used as memory for temporarily storing decoded image data decoded by a video decoder decoding coded image data, or as memory for temporarily storing coded image data coded by a video encoder encoding image data, decoded image data or coded image data which extends across a plurality of banks is read in the decoding and encoding. In this case, however, the data is read in an order of address as in the conventional way, which often leads to a case where columns in different pages in the same bank are continuously accessed. As a result, there arises the same problem as in the above.

SUMMARY OF THE INVENTION

Therefore, an object of the present invention is to provide a memory control unit and method, and a medium containing a program for realizing the method which always optimizes an order of issuing commands to an SDRAM and an order of transferring data from/in each transfer-target unit in accordance with relation between contents to be accessed and a bank boundary so as to minimize a decrease in transfer rates and which can make full use of the data-transfer performance of the SDRAM.

Moreover, another object of the present invention is to provide a memory control unit and a medium containing a program for realizing the unit which optimizes an order of reading image data in a video decoder and a video encoder so as to minimize a decrease in transfer rates.

The present invention has the following features to attain the object above.

A first aspect of the present invention is directed to a memory control unit controlling synchronous memory composed of a plurality of banks for reading and writing data by using a clock, comprising:

a transfer-target device operable to output commands for data reading and data writing;

an address generating device operable to generate the commands, then generate previously-determined control signals in accordance with the commands, and output the number of transferred bytes of data to be first transferred by read access;

a command generating device operable to generate and output the clock, receive the control signals and the number of transferred bytes, then generating previously-determined control commands in accordance with the control signals to output, and thereby control the synchronous memory; and a data processing device operable to receive the control commands, and mediate data transfer between the transfer-target device and the synchronous memory in accordance with the control commands;

the command generating device, in a case where data read processing is continuously performed to different banks of the plurality of banks across a bank boundary, controls an order of issuing a read command to a first bank and an active command to a subsequent bank according to the number of transferred bytes.

Here, according to a preferable second aspect, the command generating device in the first aspect issues the read commands to the first bank prior to the active command to the subsequent bank when the number of transferred bytes is larger than the minimum number of clocks for transition between commands, and issues the active command to the subsequent bank prior to the read command to the first bank when the number of transferred bytes is smaller than the minimum number of clocks for transition between commands.

As described above, in the first and second aspects, the command generating device controls the processing of the SDRAM by judging, based on the transferred bytes generated in the address generating device which is to be first issued between the read command to the first bank and the active command to the subsequent bank. In this way, in the case where data read processing is continuously performed to different banks, it is possible to issue commands so as to always terminate the data transfer in the minimum number of cycles. That is, the number of cycles required for two continuous access can be reduced, thereby increasing effective transfer rates of the SDRAM.

A third aspect is directed to a memory control unit controlling synchronous memory composed of a plurality of banks for reading and writing data with using a clock, comprising:

a transfer-target device operable to output commands for data reading and data writing;

an address generating device operable to receive the commands, then generate previously-determined control signals in accordance with the commands to output, and output a transfer size of read data in one bank of the plurality of banks to which processing is to be performed;

a command generating device operable to generate and output the clock, receive the control signals, then generate previously-determined control commands in accordance with the control signals to output, and thereby control the synchronous memory;

a counter operable to count the number of times of issuing read commands by the command generating device, and receive the transfer size to subtract a burst length from the transfer size with each count; and a data processing device operable to receive the control commands, and mediate data transfer between the transfer-target device and the synchronous memory in accordance with the control commands;

the counter, when the transfer size after the subtraction becomes not more than the burst length, notifying the command generating device of the fact, and in response to the notification, the command generating device issues a next read command as a read command with precharge for automatically performing precharge processing after read processing is terminated.

As described above, in the third aspect, the counter counts the number of times of issuing read commands by the command generating device. The data transfer performed at the last in one bank of the plurality of banks to which processing is to be performed is thus detected, and the command generating device issues the read command with precharge in accordance with the result of the detection, to control the processing of the SDRAM. Then, in the bank in which the command with precharge is issued, after the read processing for one data is completed, the precharge processing for the other data is automatically performed, thereby making it possible to start the precharge processing without delay even when the timing of issuing the precharge command matches the timing of issuing the subsequent other command. As a result, the effective transfer rates of the SDRAM can be increased.

A fourth aspect is directed to a memory control method of controlling synchronous memory composed of a plurality of banks for reading and writing data with using a clock, comprising, when data read processing is continuously performed to different banks of the plurality of banks across a bank boundary, the following:

outputting commands for the data read processing;

receiving the commands, then generating previously-determined control signals in accordance with the commands to output, and outputting the number of transferred bytes of data to be first transferred by read access; and generating control commands based on the control signals and the number of transferred bytes to issue, and at the same time, controlling an order of issuing a read command to a first bank and an active command to a subsequent bank according to the number of transferred bytes.

Here, according to a preferable fifth aspect, the generating and outputting of the control commands in the fourth aspect issues the read command to the first bank prior to the active command to the subsequent bank when the number of transferred bytes is larger than the minimum number of clocks for transition between commands, and issues the active command to the subsequent bank prior to the read command to the first bank when the number of transferred bytes is smaller than the minimum number of clocks for transition between commands.

As described above, in the fourth and fifth aspects, it is judged, based on the number of bytes of data first transferred by read access, which is to be first issued between the read command to the first bank and the active command to the subsequent bank, to control the processing of the SDRAM. In this way, in the case where data read processing is continuously performed to different banks, it is possible to issue commands so as to always terminate the data transfer in the minimum number of cycles. That is, the number of cycles required for two continuous access can be reduced, thereby increasing the effective transfer rates of the SDRAM.

A sixth aspect is directed to a memory control method of controlling synchronous memory composed of a plurality of banks for reading and writing data with using a clock, comprising:

outputting commands for data reading and data writing;

generating previously-determined control signals in accordance with the commands to output, and outputting a transfer size of read data in one bank of the plurality of banks to which processing is to be performed;

counting the number of times of issuing read commands to the synchronous memory;

subtracting a burst length from the transfer size with each count, and outputting a previously-determined notification when the transfer size after the subtraction becomes not more than the burst length; and generating control commands based on the control signals and the notification, and at the same time, when receiving the notification, issuing a next read command as a read command with precharge for automatically performing precharge processing after read processing is terminated.

As described above, in the sixth aspect, the number of times of issuing read commands to the SDRAM is counted. The data transfer performed at the last in one bank of the plurality of banks to which processing is to be performed is thus detected, the read command with precharge is issued in accordance with the result of the detection, to control the processing of the SDRAM. Then, in the bank in which the command with precharge is issued, after the read processing for one data is completed, the precharge processing for the other data is automatically performed, thereby making it possible to start the precharge processing without delay even when the timing of issuing the precharge command matches the timing of issuing the subsequent other command. As a result, the effective transfer rates of the SDRAM can be increased.

A seventh aspect is directed to a memory control unit for controlling memory having memory areas divided into a plurality of banks, wherein:

each of the plurality of banks being split in a plurality of split banks;

a delay developing in the memory when access to memory areas in different split banks in a same bank is continuous; and wherein the memory control unit comprises:

an accepting device operable to accept, from an external apparatus, access information indicating two or more memory areas in a bank or banks to be accessed by a plurality of unit access;

an optimizing device operable to optimize and decide an order of access of the plurality of unit access based on whether the memory areas for the plurality of unit access indicated by the access information are in the same bank or different banks so as to decrease frequency of continuous access to the memory areas in the same bank; and a control device operable to control the memory so that the memory area in the memory is accessed according to the access order optimized and decided by the optimizing device.

As described above, in the seventh aspect, it is possible to decrease the frequency of continuous access to the same bank. Therefore, the overhead due to precharge processing and the like can be reduced, to increase the effective transfer rates of the SDRAM.

According to an eighth aspect, in the seventh aspect, the optimizing device optimizes and decides the order of access of the plurality of unit access based on whether the memory areas for the plurality of unit access indicated by the access information are in the same bank or different banks and in the same split bank or different split banks so as to decrease frequency of continuous access not to memory areas in the same bank but to memory areas in different split banks in the same bank.

As described above, according to the eighth aspect, in the seventh aspect, it is possible to decrease the frequency of continuous access to different pages in the same bank.

According to a ninth aspect, in the seventh aspect, the external apparatus is constituted by one or more transfer-target units, the access information is composed of two or more specific access information issued from the transfer-target units, each of the specific access information is composed of the one or more unit access, and the optimizing device comprises:

a tail specifying device operable to specify a tail bank to be accessed at the last in currently-accessed specific access information or in preceding specific access information to be accessed first;

a head specifying device operable to specify a head bank to be accessed first in each of the specific access information; and a selecting device operable to select access to a memory area indicated by specific access information corresponding to the head bank representing a different bank from the tail bank prior to access to a memory area indicated by specific access information corresponding to the head bank representing the same bank as the tail bank, and define an order of access immediately after access to a memory area indicated by the preceding specific access information.

As described above, according to the ninth aspect, in the seventh aspect, it is possible, when accepting two or more access information, to give first priority to the access information which first accesses to the bank different from the bank to be accessed at the last in the access information to be first accessed.

According to a tenth aspect, in the ninth aspect, the tail specifying device further specifies a tail split bank to be accessed at the last in the preceding specific access information, the head specifying device further specifies a head split bank to be accessed first in each of the specific access information, and the selecting device selects access to the memory area indicated by the specific access information corresponding to the head bank representing a different bank from the tail bank and access to a memory area indicated by specific access information corresponding to the head split bank representing the same split bank as the tail split bank, prior to an access to a memory area indicated by specific access information corresponding to the head bank representing the same bank as the tail bank and also corresponding to the head split bank representing a different split bank from the tail split bank, and defines the order of access immediately after the access to the memory area indicated by the preceding specific access information.

As described above, according to the tenth aspect, in the ninth aspect, it is possible, when accepting two or more access information, to give first priority to the access information which first accesses to the bank different from a bank to be accessed at the last in the access information to be first accessed, and the same page in the same bank as the bank to be accessed at the last in the access information to be first accessed.

According to eleventh and twelfth aspects, respectively in the ninth and tenth aspects, the specific access information each includes limit information indicating time limits for transfer pending, and the selecting device judges whether each of the specific access information is to exceed the limits indicated by the limit information or not, and selects with the highest priority access to a memory area indicated by specific access information judged to most likely exceed the limits.

As described above, according to the eleventh and twelfth aspects, respectively in the ninth and tenth aspects, it is judged whether each access information is to exceed the limit or not. When judged to likely exceed, the corresponding access information can be selected with the highest priority. Therefore, the overhead due to precharge processing and the like is reduced while assuring real time characteristics of each access information to some extent, thereby increasing the effective transfer rates of the SDRAM.

According to thirteenth and fourteenth aspects, respectively in the eleventh and twelfth aspects, the memory comprises amplifiers operable to transfer each provided for each of the banks for holding data in one predetermined split bank, and access to the memory area in the memory is always made through the amplifiers for transfer, the delay is a sum of "time required to transfer data held in an amplifier for transfer to one split bank which is accessed just before" and "time required to transfer data stored in one split bank which is currently accessed to an amplifier for transfer", the limit information is the number of limit cycles representing limits for the number of cycles permitted from when specific access information is issued to when transfer is completed, and the selecting device includes:

a remaining-cycle-number holding device operable to hold, for each of the specific access information, the number of remaining cycles representing limits for the number of cycles permitted from a present time to when transfer is completed;

an initial-value setting device operable to make the remaining-cycle-number holding device hold the number of limit cycles as an initial value of the number of remaining cycles when specific access information is issued;

a subtraction device operable to subtract one from the number of remaining cycles held in the remaining-cycle-number holding device in one cycle unit;

a calculation device operable to calculate for each of the specific access information "(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access)=the number for prospective cycles for completion" by time when the currently-executed access is completed; and a judging device operable to judge, in a case of "the number of prospective cycles for completion>the number of remaining cycles", that corresponding specific access information is to exceed the limits.

As described above, according to the thirteenth and fourteenth aspects, respectively in the eleventh and twelfth aspects, the number of limit cycles is defined for each access information as an initial value of the number of remaining cycles. Then, one is subtracted from the number of remaining cycles in one cycle unit, and the result is compared with the number of cycles required for access by the other access information selected with the higher priority. Then, it is judged whether the access information is to exceed the limits or not in the case where it is selected after the access by the other access information selected with the higher priority is terminated. The access information judged to likely exceed the limits can be selected with the highest priority. Therefore, the overhead due to the precharge processing and the like is reduced while assuring the real time characteristics of each access information even when the access information is selected after the access by the other access information is terminated, thereby increasing the effective transfer rates of the SDRAM.

According to fifteenth and sixteenth aspects, respectively in the eleventh and twelfth aspects, the memory comprises amplifiers for transfer, each provided for each of the banks for holding data in one predetermined split bank, and access to the memory area in the memory is always made through the amplifiers for transfer, the delay is a sum of "time required to transfer data held in an amplifier for transfer to one split bank which is accessed just before" and "time required to transfer data stored in one split bank which is currently accessed to an amplifier for transfer", the limit information is the number of limit cycles representing limits for the number of cycles permitted from when specific access information is issued to when transfer is completed, and the selecting device includes:

a counting device operable to count for each of the specific access information the number of queued cycles in one cycle unit since the specific access information is issued;

a calculation device operable to calculate for each of the specific access information "(the number of queued cycles)+(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access)=the number of prospective cycles for completion" by time when the currently-executed access is completed; and a judging operable to judge, in a case of "the number of prospective cycles for completion>the number of limit cycles", that corresponding specific access information is to exceed the limits.

As described above, according to the fifteenth and sixteenth aspects, respectively in the eleventh and twelfth aspects, the number of queued cycles is counted for each access information, and thereby it is judged whether the access information is to exceed the limits even after the access by the other access information selected with the higher priority is terminated. Thus, the access information judged to likely exceed the limits can be selected with the highest priority. Therefore, the overhead due to the precharge processing and the like is reduced while assuring the real time characteristics of each access information even when the access information is selected after the access by the other access information is terminated, thereby increasing the effective transfer rates of the SDRAM.

According to a seventeenth aspect, in the seventh aspect, the external apparatus is a video decoding apparatus decoding coded image data, or a video encoding apparatus encoding image data, generated image data is temporarily stored in the memory, and then part of the image data stored in the memory which is continuous in a display state thereof is read to generate new image data, the generated image data is distributed in unit areas in the memory each composed of a memory area in a single split bank, and stored in predetermined order that the unit areas are continuous in the display state, unit areas contiguous to each other in storage order are composed of different banks or the same split bank, the access information indicates a memory area including unit areas contiguous to each other in the display state and in the storage order, and unit areas contiguous to each other in the display state but not contiguous in the storage order, and is issued from the video decoding apparatus or the video encoding apparatus to generate new image data, and the optimizing device includes:

a dividing device operable to divide a memory area indicated by the access information into continuous single split bank areas each of which is a memory area in a single split bank;

a non-contiguous-boundary detecting device operable to detect a non-contiguous boundary representing a boundary between unit areas contiguous to each other in the display state but not contiguous in the storage order; and a relative-order deciding device operable to decide an order of access to the single split bank areas based on whether the unit areas contiguous to each other across the non-contiguous boundary are composed of the same bank or different banks.

As described above, according to the seventeenth aspect, in the seventh aspect, the order of access to single-page areas based on whether the unit areas contiguous to each other across the non-contiguous boundary are composed of the same bank or different banks.

According to an eighteenth aspect, in the seventeenth aspect, the relative-order deciding device defines order of access to the single split bank areas below the non-contiguous boundary as the same as order of access to the single split bank areas above the non-contiguous boundary when the unit areas contiguous to each other across the non-contiguous boundary are composed of the same bank, and defines the access order as the reverse when the unit areas are composed of different banks.

As described above, according to the eighteenth aspect, in the seventeenth aspect, the order of access to the single-page areas below the non-contiguous boundary can be optimized by defining it as the same as the order of access to the singlepage areas above the non-contiguous boundary when the unit areas contiguous to each other across the non-contiguous boundary are composed of the same bank, and as the reverse to the order of access to the single-page areas above the noncontiguous boundary when the unit areas are composed of different banks.

According to a nineteenth aspect, in the seventh aspect, the external apparatus is a video decoding apparatus decoding coded image data, or a video encoding apparatus encoding image data, generated image data is temporarily stored in the memory, and then part of the image data stored in the memory which is continuous in a display state thereof is read to generate new image data, the generated image data is distributed in unit areas in the memory each composed of a memory area in a single split bank, and stored in predetermined order that the unit areas are continuous in the display state, unit areas contiguous to each other in storage order are composed of different banks or the same split bank, the access information indicates a memory area including unit areas contiguous to each other in the display state and in the storage order, and unit areas contiguous to each other in the display state but not contiguous in the storage order, and is issued from the video decoding apparatus or the video encoding apparatus to generate new image data, and the optimizing device includes:

a dividing device operable to divide a memory area indicated by the access information into continuous single split bank areas each of which is a memory area in a single split bank;

a non-contiguous-boundary detecting device operable to detect a non-contiguous boundary representing a boundary between unit areas contiguous to each other in the display state but not contiguous in the storage order;

an address converting device operable to convert between a logical address in the image data and a physical address in the memory so that the unit areas contiguous to each other across the non-contiguous boundary are composed of different banks when the unit areas are composed of the same bank in a case where the generated image data is stored in predetermined order that the image data is continuous in the display state; and an order reversing device operable to define order of access to the single split bank areas below the non-contiguous boundary as the reverse to order of access to the single split bank areas above the non-contiguous boundary.

As described above, according to the nineteenth aspect, in the seventh aspect, when the generated image data is stored in the order that the image data is continuous in the display state, it is possible to convert between the logical address in the image data and the physical address in the memory so that the unit areas contiguous to each other across the non-contiguous boundary, when composed of the same bank, are composed of different banks. Therefore, in this case, the overhead due to precharge processing and the like is reduced, to increase the effective transfer rates of the SDRAM.

According to twentieth to twenty-second aspects, respectively in the seventeenth to nineteenth aspects, the optimizing device further includes:

a screen-size setting device operable to set the number of pixels which are continuous in the storage order and in the display state in image data to be stored in the memory as a screen size;

a configuration setting device operable to set a shape of the unit area; and a bank judging device operable to judge whether the unit areas contiguous to each other across the non-contiguous boundary are composed of the same bank or different banks based on the screen size and the shape in the case where the generated image data is stored in predetermined order that the image data is continuous in the display state.

As described above, according to the twentieth to twenty-second aspects, respectively in the seventeenth to nineteenth aspects, when the generated image data is stored in the order the image data is continuous in the display state, it is possible to judge based on the screen size of the image data and the shape of the unit area whether the unit areas contiguous across the contiguous boundary are composed of the same bank or different banks. Therefore, the overhead due to the precharge processing and the like is reduced according to the screen size of the image data and the shape of the unit area, thereby increasing the effective transfer rates of the SDRAM.

According to twenty-third to twenty-eighth aspects, respectively in the seventeenth to twenty-second aspects, the optimizing device further includes:

a contiguous-boundary detecting device operable to detect a contiguous boundary representing a boundary between the unit areas contiguous to each other in the display state and in the storage order;

a comparing device operable to compare size of memory areas obtained by dividing the memory area indicated by the access information by the contiguous boundary; and an initial-order deciding device operable to define order of access to the single split bank areas above the non-contiguous boundary as order that single split bank areas belonging to a memory area judged to be smaller by the comparison made by the comparing device are read first.

As described above, according to the twenty-third to twenty-eighth aspects, respectively in the seventeenth to twenty-second aspects, the order of access to single-page areas above the non-contiguous boundary can be defined as the order that the single-page areas belonging to the small memory area are first read. Therefore, the overhead due to the precharge processing and the like is reduced, to increase the effective transfer rates of the SDRAM.

A twenty-ninth aspect is directed to a recording medium, capable of reading from a computer, containing a program executed in the computer that is a program for realizing in the computer operational environment, when in synchronous memory composed of a plurality of banks for reading and writing data with using a clock, data read processing is continuously performed to different banks of the plurality of banks across a bank boundary, comprising:

outputting commands for the data read processing;

receiving the commands, then generating previously-determined control signals in accordance with the commands to output, and outputting the number of transferred bytes of data to be first transferred by read access; and issuing control commands based on the control signals and the number of transferred bytes, and at the same time, controlling order of issuing a read command to a first bank and an active command to a subsequent bank according to the number of transferred bytes.

According to a thirtieth aspect, in the twenty-ninth aspect, the generating and outputting of the control commands issues the read command to the first bank prior to the active command to the subsequent bank when the number of transferred bytes is larger than the minimum number of clocks for transition between commands, and issues the active command to the subsequent bank prior to the read command to the first bank when the number of transferred bytes is smaller than the minimum number of clocks for transition between commands.

A thirty-first aspect is directed to a recording medium, capable of reading from a computer, containing a program executed in the computer that is a program for realizing in the computer operational environment, in synchronous memory composed of a plurality of banks for reading and writing data with using a clock, comprising:

outputting commands for data reading and data writing;

generating previously-determined control signals in accordance with the commands to output, and outputting a transfer size of read data in one bank of the plurality of banks to which processing is to be performed;

counting the number of times of issuing read commands to the synchronous memory;

subtracting a burst length from the transfer size with each count, and outputting a previously-determined notification when the transfer size after the subtraction becomes not more than the burst length; and issuing control commands based on the control signals and the notification, and at the same time, when receiving the notification, issuing a next read command as a read command with precharge for automatically performing precharge processing after read processing is terminated.

A thirty-second aspect is directed to a recording medium, capable of reading from a computer, containing a program executed in the computer that is a program for realizing in the computer operational environment, when controlling memory, having a memory area divided into a plurality of banks each divided into a plurality of split banks, in which a delay develops due to continuous access to memory areas in different split banks in the same bank, comprising:

accepting, from an external apparatus, access information indicating two or more memory areas in a bank or banks to be accessed by a plurality of unit access;

optimizing and deciding order of access of the plurality of unit access based on whether the memory areas for the plurality of unit access indicated by the access information are in the same bank or different banks and in the same split bank or different split banks so as to decrease frequency of continuous access to the memory areas in the same bank; and controlling the memory so that the memory area in the memory is accessed according to the access order optimized and decided by the optimizing.

According to a thirty-third aspect, in the thirty-second aspect, the optimizing and deciding optimizes and decides the order of access of the plurality of unit access based on whether the memory areas for the plurality of unit access is indicated by the access information are in the same bank or different banks so as to decrease frequency of continuous access not to memory areas in the same bank but to memory areas in different split banks in the same bank.

According to a thirty-fourth aspect, in the thirty-second aspect, the external apparatus is constituted by one or more transfer-target units, the access information is composed of two or more specific access information issued from the transfer-target units, each of the specific access information is composed of the one or more unit access, and the optimizing and deciding step further includes:

specifying a tail bank to be accessed at the last in currently-accessed specific access information or in preceding specific access information to be accessed first;

specifying a head bank to be accessed first in each of the specific access information; and selecting access to a memory area indicated by specific access information corresponding to the head bank representing a different bank from the tail bank prior to access to a memory area indicated by specific access information corresponding to the head bank representing the same bank as the tail bank, and defining order of access immediately after access to a memory area indicated by the preceding specific access information.

According to a thirty-fifth aspect, in the thirty-fourth aspect, the tail-specifying step further specifies a tail split bank to be accessed at the last in the preceding specific access information, the head-specifying step further specifies a head split bank to be accessed first in each of the specific access information, and the order-defining step selects access to the memory area indicated by the specific access information corresponding to the head bank representing a different bank from the tail bank and access to a memory area indicated by specific access information corresponding to the head split bank representing the same split bank as the tail split bank, prior to access to a memory area indicated by specific access information corresponding to the head bank representing the same bank as the tail bank and also corresponding to the head split bank representing a different split bank from the tail split bank, and defines the order of access immediately after the access to the memory area indicated by the preceding specific access information.

According to thirty-sixth and thirty-seventh aspects, respectively in the thirty-fourth and thirty-fifth aspects, the specific access information each includes limit information indicating time limits for transfer pending, and the order-defining step judges whether each of the specific access information is to exceed the limits indicated by the limit information or not, and selects with the highest priority access to a memory area indicated by specific access information judged to most likely exceed the limits.

According to thirty-eighth and thirty-ninth aspects, respectively in the thirty-sixth and thirty-seventh aspects, the memory comprises amplifiers for transfer each provided for each of the banks for holding data in one predetermined split bank, and access to the memory area in the memory is always made through the amplifiers for transfer, the delay is a sum of "time required to transfer data held in an amplifier for transfer to one split bank which is accessed just before" and "time required to transfer data stored in one split bank which is currently accessed to an amplifier for transfer", the limit information is the number of limit cycles representing limits for the number of cycles permitted from when specific access information is issued to when transfer is completed, and the order-defining further includes:

holding for each of the specific access information the number of remaining cycles representing limits for the number of cycles permitted from a present time to when transfer is completed;

making the holding hold the number of limit cycles as an initial value of the number of remaining cycles when specific access information is issued;

subtracting one from the number of remaining cycles held in the holding in one cycle unit;

calculating for each of the specific access information "(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access)=the number for prospective cycles for completion" by time when the currently-executed access is completed; and judging, in a case of "the number of prospective cycles for completion>the number of remaining cycles", that corresponding specific access information is to exceed the limits.

According to fortieth and forty-first aspects, respectively in the thirty-sixth and thirty-seventh aspects, the memory comprises amplifiers for transfer, each provided for each of the banks for holding data in one predetermined split bank, and access to the memory area in the memory is always made through the amplifiers for transfer, the delay is a sum of "time required to transfer data held in an amplifier for transfer to one split bank which is accessed just before" and "time required to transfer data stored in one split bank which is currently accessed to an amplifier for transfer", the limit information is the number of limit cycles representing limits for the number of cycles permitted from when specific access information is issued to when transfer is completed, and the order-defining further includes:

counting for each of the specific access information the number of queued cycles in one cycle unit since the specific access: information is issued;

calculating for each of the specific access information "(the number of queued cycles)+(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access)=the number of prospective cycles for completion" by time when the currently-executed access is completed; and judging, in a case of "the number of prospective cycles for completion>the number of limit cycles", that corresponding specific access information is to exceed the limits.

According to a forty-second aspect, in the thirty-second aspect, the external apparatus is a video decoding apparatus decoding coded image data, or a video encoding apparatus encoding image data, generated image data is temporarily stored in the memory, and then part of the image data stored in the memory which is continuous in a display state thereof is read to generate new image data, the generated image data is distributed in unit areas in the memory each composed of a memory area in a single split bank, and stored in predetermined order that the unit areas are continuous in the display state, unit areas contiguous to each other in storage order are composed of different banks or the same split bank, the access information indicates a memory area including unit areas contiguous to each other in the display state and in the storage order, and unit areas contiguous to each other in the display state but not contiguous in the storage order, and is issued from the video decoding apparatus or the video encoding apparatus to generate new image data, and the optimizing and deciding further includes:

dividing a memory area indicated by the access information into continuous single split bank areas each of which is a memory area in a single split bank;

detecting a non-contiguous boundary representing a boundary between unit areas contiguous to each other in the display state but not contiguous in the storage order; and deciding order of access to the single split bank areas based on whether the unit areas contiguous to each other across the non-contiguous boundary are composed of the same bank or different banks.

According to a forty-third aspect, in the forty-second aspect, the deciding defines order of access to the single split bank areas below the non-contiguous boundary as the same as order of access to the single split bank areas above the non-contiguous boundary when the unit areas contiguous to each other across the non-contiguous boundary are composed of the same bank, and defines the access order as the reverse when the unit areas are composed of different banks.

According to a forty-fourth aspect, in the thirty-second aspect, the external apparatus is a video decoding apparatus decoding coded image data, or a video encoding apparatus encoding image data, generated image data is temporarily stored in the memory, and then part of the image data stored in the memory which is continuous in a display state thereof is read to generate new image data, the generated image data is distributed in unit areas in the memory each composed of a memory area in a single split bank, and stored in predetermined order that the unit areas are continuous in the display state, unit areas contiguous to each other in storage order are composed of different banks or the same split bank, the access information indicates a memory area including unit areas contiguous to each other in the display state and in the storage order, and unit areas contiguous to each other in the display state but not contiguous in the storage order, and is issued from the video decoding apparatus or the video encoding apparatus to generate new image data, and the optimizing and deciding further includes:

dividing a memory area indicated by the access information into continuous single split bank areas each of which is a memory area in a single split bank;

detecting a non-contiguous boundary representing a boundary between unit areas contiguous to each other in the display state but not contiguous in the storage order;

converting between a logical address in the image data and a physical address in the memory so that the unit areas contiguous to each other across the non-contiguous boundary are composed of different banks when the unit areas are composed of the same bank in a case where the generated image data is stored in predetermined order that the image data is continuous in the display state; and defining order of access to the single split bank areas below the non-contiguous boundary as the reverse to order of access to the single split bank areas above the non-contiguous boundary.

According to forty-fifth to forty-seventh aspects, respectively in the forty-second to forty-fourth aspects, the optimizing and deciding further includes:

setting the number of pixels which are continuous in the storage order and in the display state in image data to be stored in the memory as a screen size;

setting a shape of the unit area; and judging whether the unit areas contiguous to each other across the non-contiguous boundary are composed of the same bank or different banks based on the screen size and the shape in the case where the generated image data is stored in predetermined order that the image data is continuous in the display state.

According to forty-eighth to fifth-third aspects, respectively in the forty-second to forty-seventh aspects, the optimizing and deciding further includes:

detecting an contiguous boundary representing a boundary between the unit areas contiguous to each other in the display state and in the storage order;

comparing size of memory areas obtained by dividing the memory area indicated by the access information by the contiguous boundary; and defining order of access to the single split bank areas above the non-contiguous boundary as order that single split bank areas belonging to a memory area judged to be smaller by the comparison made by the comparing means are read first.

As described above, the twenty-ninth to fifty-third aspects are directed to a recording medium containing a program for realizing functions in the first to twenty-eighth aspects. By using the medium, the functions described in the first to twenty-eighth aspects can be realized as a software in a computer, to obtain the same effects as in the above.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a block diagram showing a structure of a memory control unit according to a second embodiment of the present invention;

FIG. 26 shows bank numbers and page numbers of memory areas in which image data is stored;

FIG. 33 shows, column by column, numbers of pages including columns to be accessed in data transfer requested by transfer-target units, and numbers of banks to which the pages belong, in order that the columns are accessed; and FIG. 34 shows order of data transfer in operation clocks in the case where the data transfer as shown in FIG. 33 is simultaneously requested by the transfer-target units.

DESCRIPTION OF THE PREFERRED EMBODIMENTS (First Embodiment)

Figure 1:
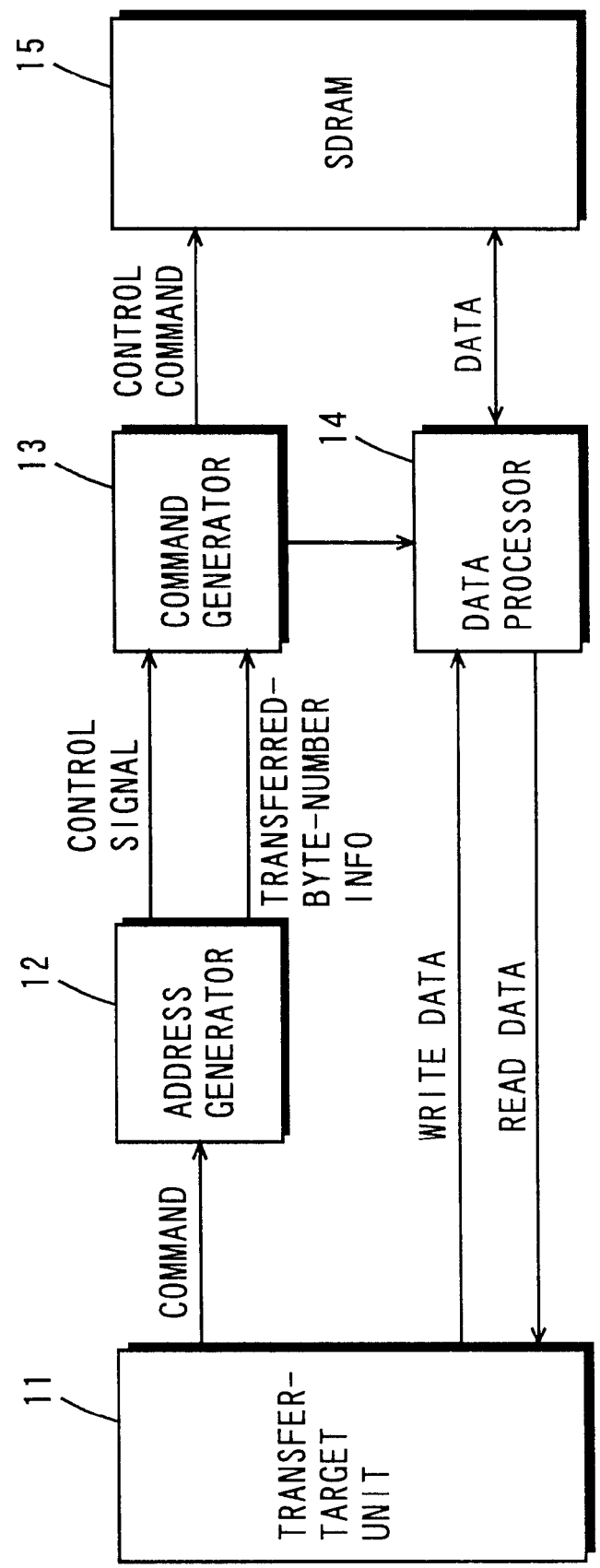
FIG. 1 is a block diagram showing a structure of a memory control unit according to a first embodiment of the present invention.

FIG. 1 is a block diagram showing a structure of a memory control unit according to a first embodiment of the present invention. In FIG. 1, the memory control unit according to the first embodiment comprises a transfer-target unit 11, an address generator 12, a command generator 13, a data processor 14, and an SDRAM 15.

Figure 27:
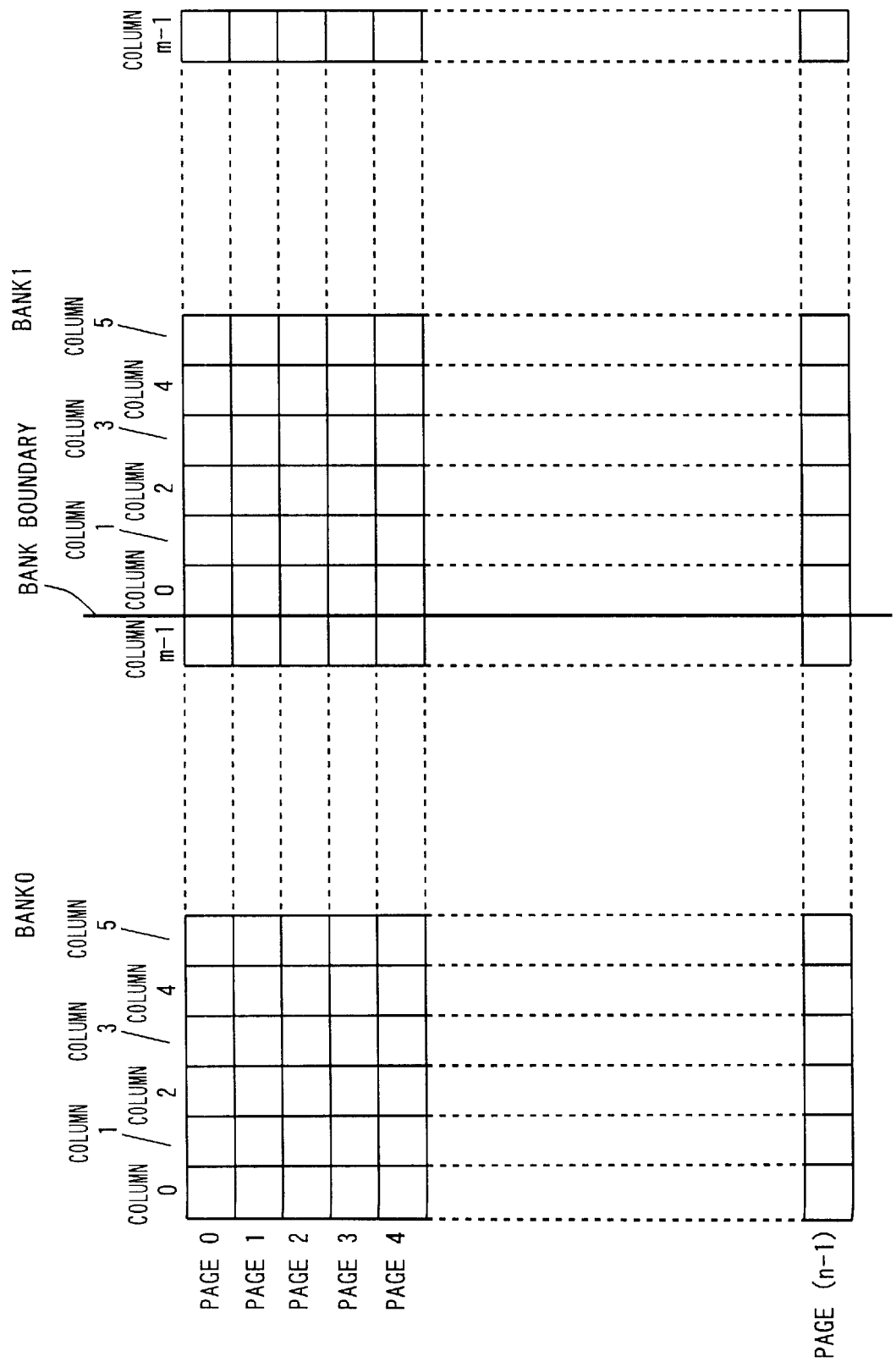
FIG. 27 shows a structure of a memory area of a typical SDRAM.
Figure 28:
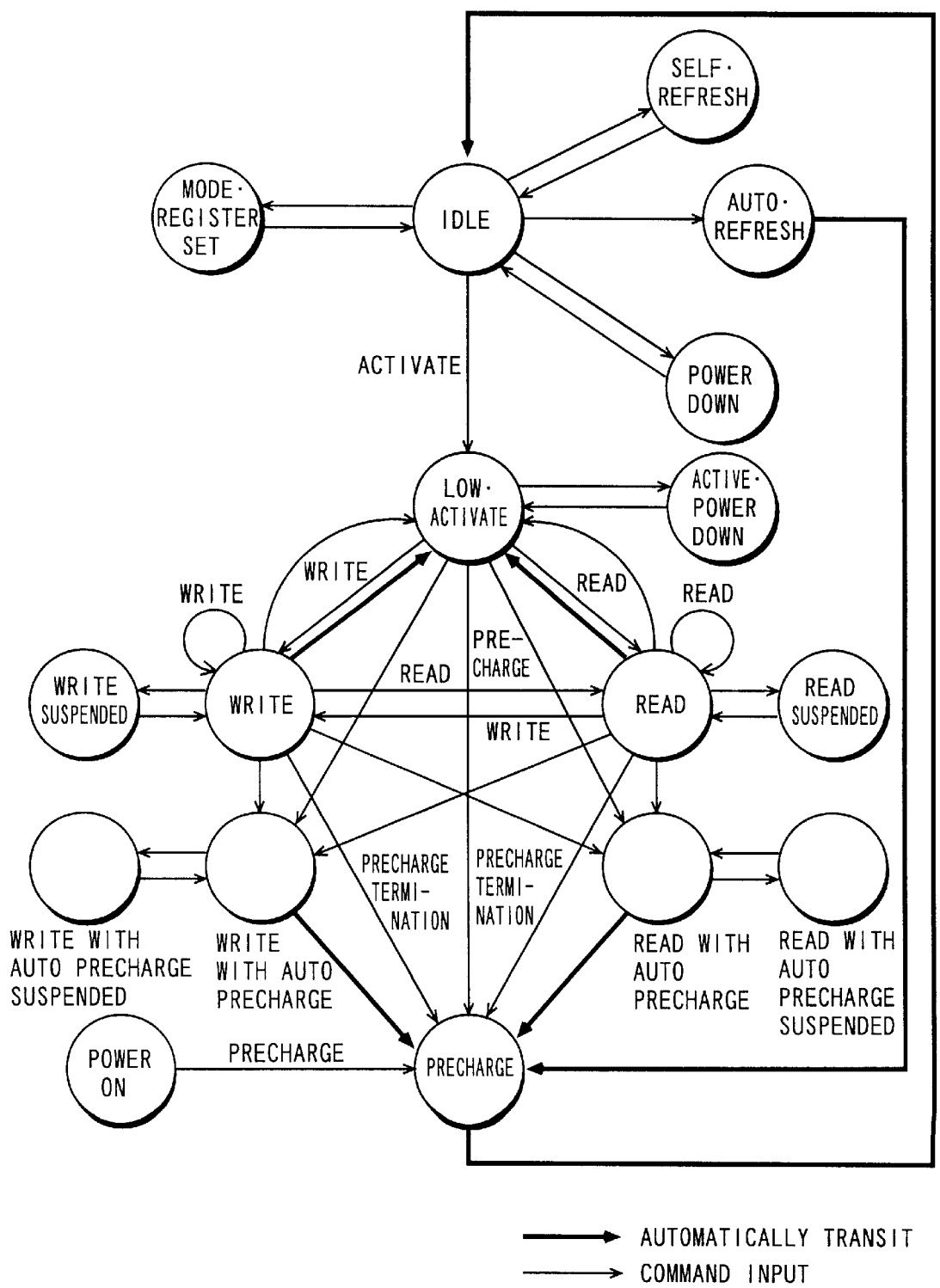
FIG. 28 is a state-transition diagram of a typical SDRAM.

The memory control unit according to the first embodiment of the present invention is effective in the case where data transfer is continuously performed across a bank boundary from an address in one bank (hereinafter, represented by a bank 0) to an address in the other bank (hereinafter, represented by a bank 1) in the SDRAM 15 (refer to FIG. 27), especially in the case where the number of bytes of the first data transfer with respect to the bank 0 is not more than the burst length.

The transfer-target unit 11 outputs commands such as a start address (a virtual address), a transfer size, and read (or write) for data to be read (or written), to the address generator 12.

The address generator 12 receives the commands from the transfer-target unit 11, then generates control signals for a start address (a physical address), a burst length, and read (or write) which are obtained by dividing the commands into a plurality of instructions for data transfer, and outputs the signals to the command generator 13. The address generator 12 also generates transferred-byte-number information representing the number of bytes of the data first transferred by read access up to a boundary in the burst length, and outputs the information to the command generator 13.

The command generator 13 generates a clock and control commands designating page (row)/column addresses in accordance with the control signals received from the address generator 12, and outputs them to the SDRAM 15. The command generator 13, at the same time, evaluates the number of bytes in the transferred-byte-number information, and thereby controls the SDRAM 15 so that it executes instructions in order from an instruction capable of increasing its data transfer rates. That is to say, when data is read across the bank boundary in the SDRAM 15 as in the above description, the command generator 13 judges which is to be first executed between read processing to the bank 0 and activation processing to the bank 1, thereby controlling the SDRAM 15. More specifically, when the number of transferred bytes of data read from the bank 0 is larger than the number of cycles of the CAS latency, a read command is executed so as to start reading of data in the bank 0 first, and when the number is smaller than the number of cycles of the CAS latency, an active command is executed so as to complete entire data reading in the minimum number of clocks. Moreover, the command generator 13 outputs control commands instructing read (or write) to the data processor 14.

The data processor 14 receives the control commands for data read from the command generator 13, then reads data from the SDRAM 15 in synchronization with the clock described above, and transfers the data to the transfer-target unit 11 (or receives the control commands for data write, then reads data from the transfer-target unit 11, and transfers the data to SDRAM 15 in synchronization with the clock described above).

The SDRAM 15 is synchronous dynamic random access memory operating in response to the control commands outputted from the command generator 13.

Figure 2:
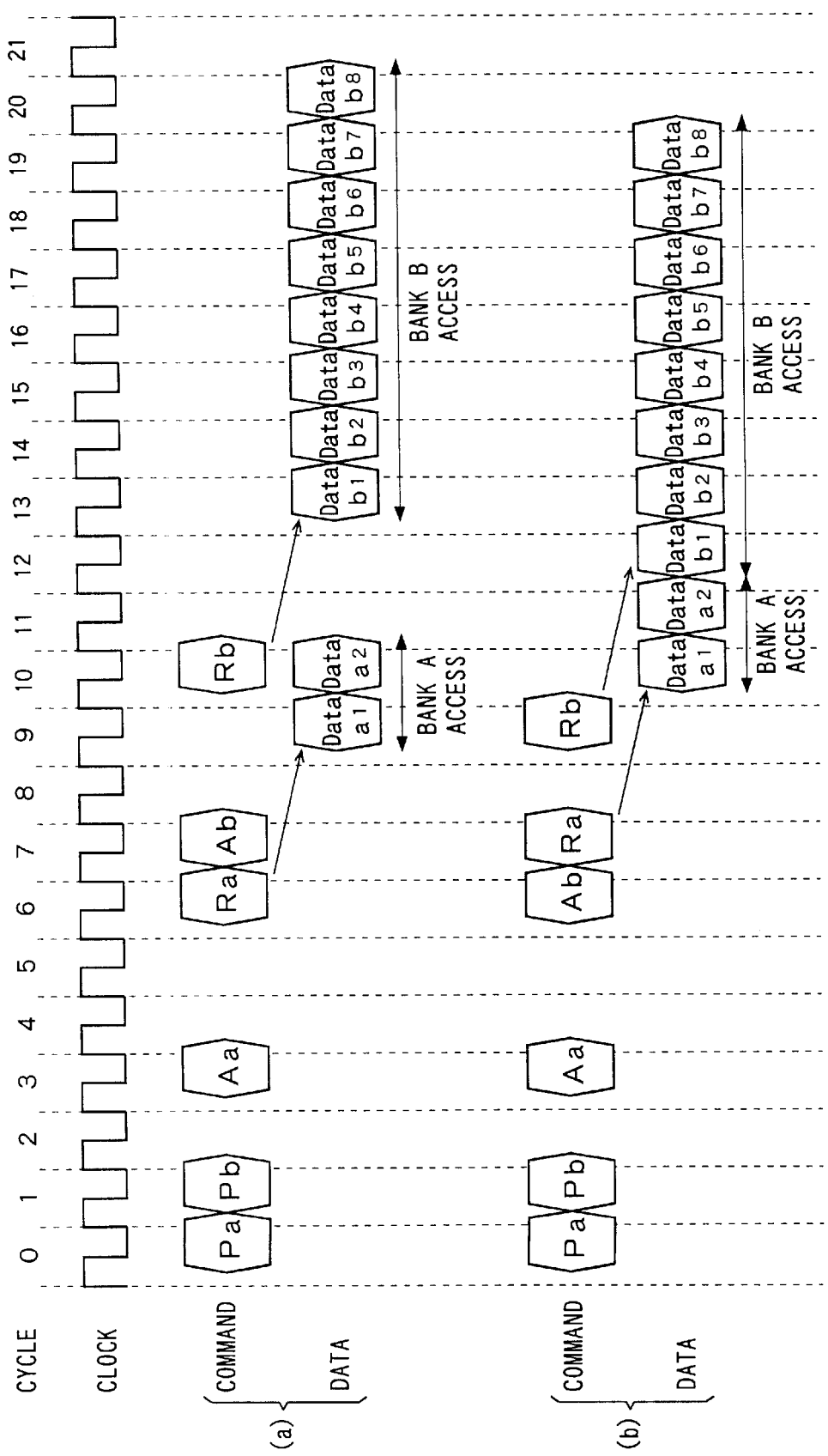
FIG. 2 shows examples of data read timing in the case where data is continuously read across a bank boundary.
Figure 3:
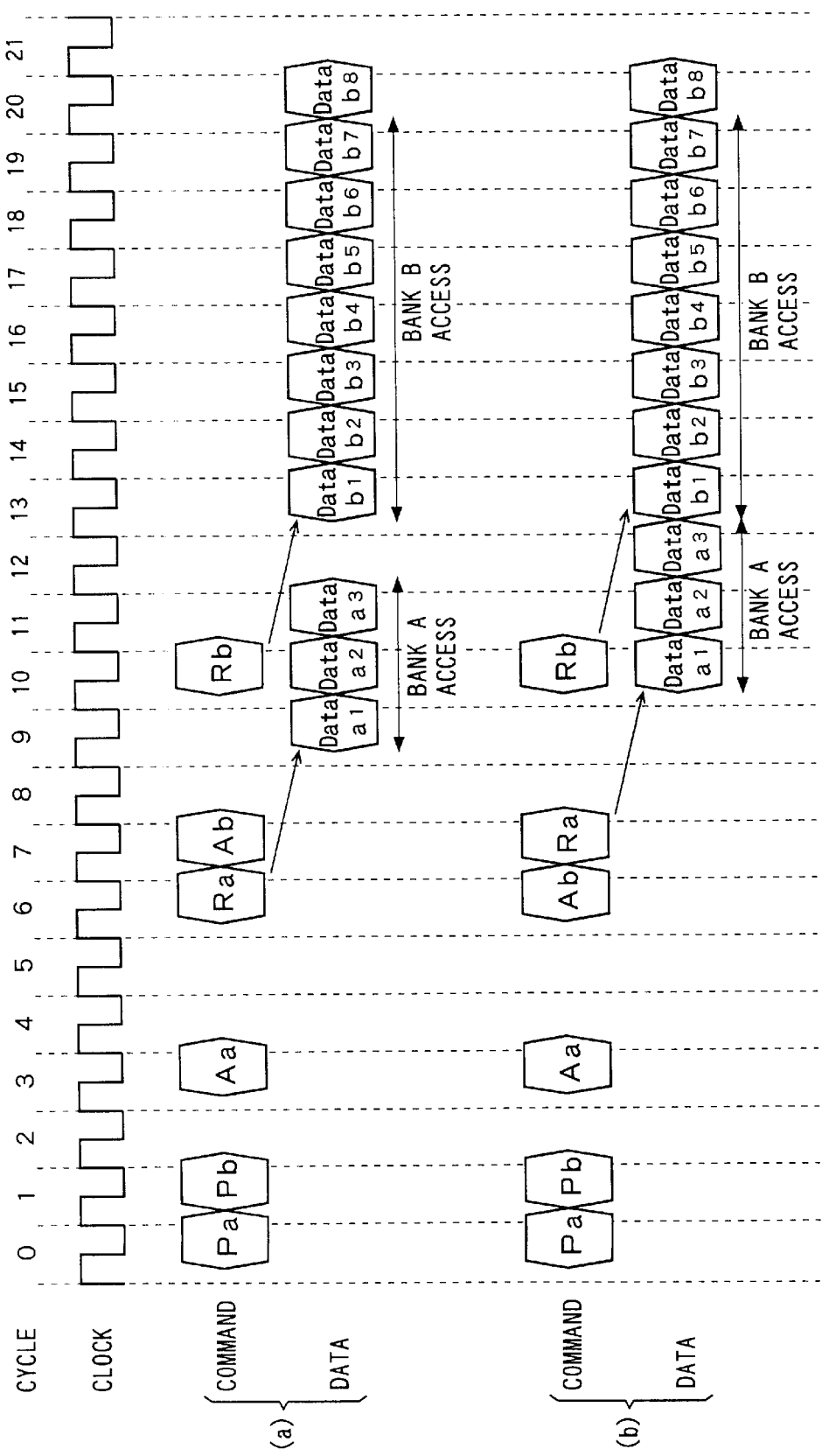
FIG. 3 shows examples of data read timing in the case where data is continuously read across a bank boundary.
Figure 4:
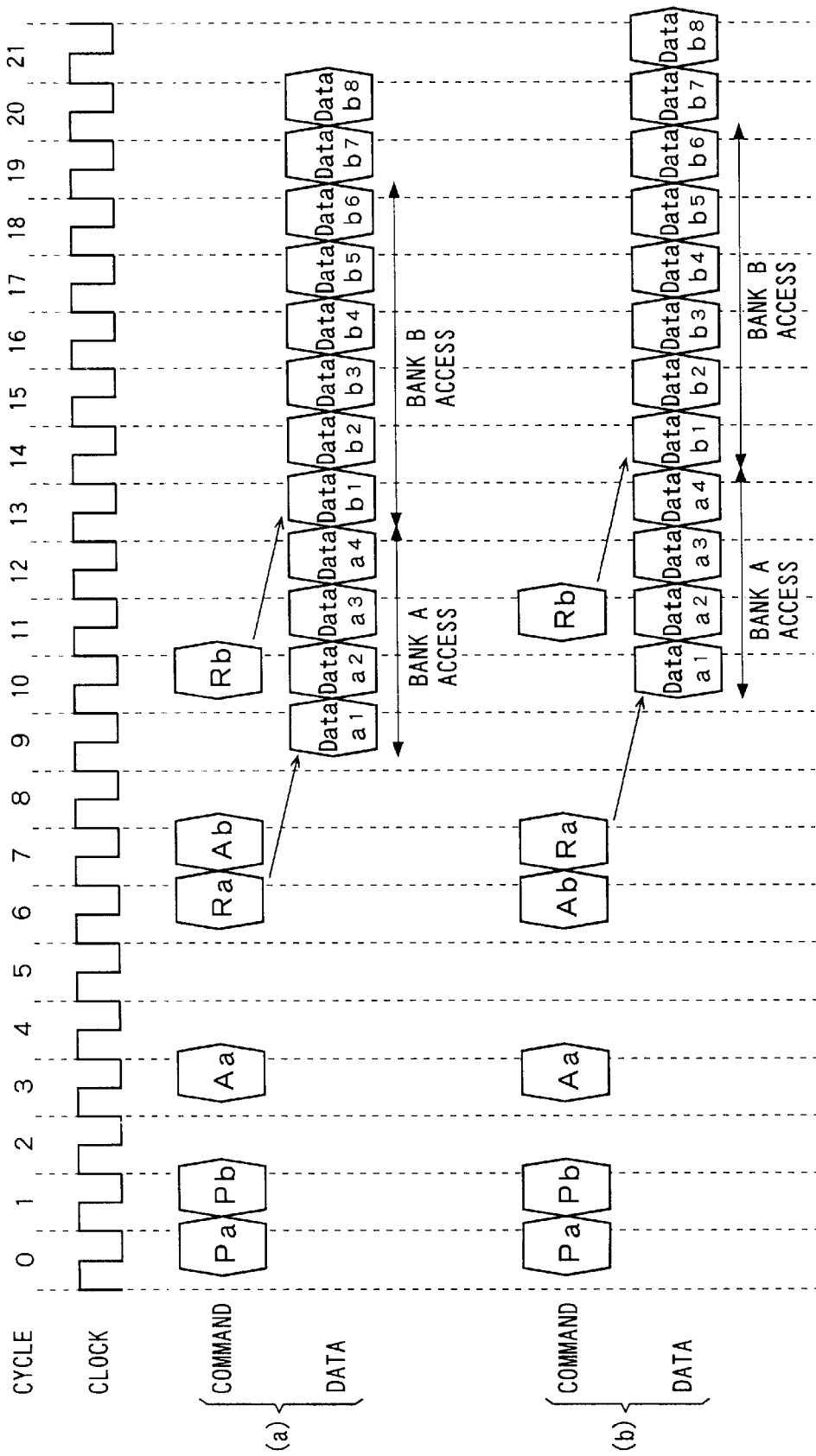
FIG. 4 shows examples of data read timing in the case where data is continuously read across a bank boundary.

Described next is increase in data transfer efficiency offered by the memory control unit according to the first embodiment, citing a specific example of data transfer. FIGS. 2 to 4 show examples of data read timing in the case where data is continuously read across the bank boundary.

FIG. 2 shows two types of data read timing in the case where a total of ten pieces of data, i.e., data a1 and a2 in the bank 0 and data b1 to b8 in the bank 1 are continuously read across the bank boundary. FIG. 3 shows two types of data read timing in the case where a total of eleven pieces of data, i.e., data a1 to a3 in the bank 0 and data b1 to b8 in the bank 1 are continuously read across the bank boundary. FIG. 4 shows two types of data read timing in the case where a total of twelve pieces of data, i.e., data a1 to a4 in the bank 0 and data b1 to b8 in the bank 1 are continuously read across the bank boundary.

It is also assumed that in each of FIGS. 2 to 4, CAS latency is "3" clocks and a burst length is "8" data. Note that in FIGS. 2 to 4, precharge commands to the banks 0 and 1 are represented by "Pa" and "Pb", respectively, active commands to the banks 0 and 1 are represented by "Aa" and "Ab", respectively, and read commands to the banks 0 and 1 are represented by "Ra" and "Rb", respectively.

The contents shown by FIGS. 2 to 4 are each described first.

Figure 32:
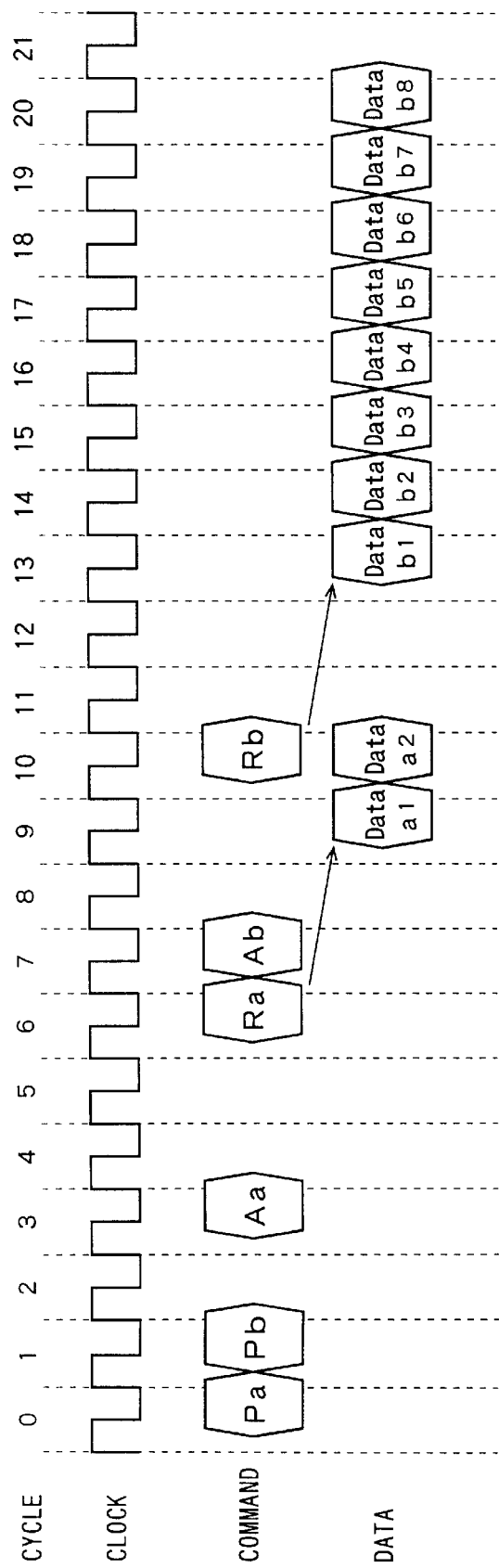
FIG. 32 shows an example of data read timing of a conventional memory control unit.

Processing shown in (a) of FIG. 2 is the same as that in FIG. 32 described above. The "Ra" command is first issued and then the "Ab" command is issued next, thereby taking twenty-one cycles to terminate entire data reading. On the other hand, in processing shown in (b) of FIG. 2, the "Ab" command is first issued and then "Ra" command is issued. Resultantly, a cycle in, which first data is read is delayed, however, it takes only twenty cycles to terminate the entire data reading.

In processing shown in (a) of FIG. 3 where the "Ra" command is first issued and then "Ab" command is issued and processing shown in (b) of FIG. 3 where the "Ab" command is first issued and then "Ra" command is issued, it takes twenty-one cycles to terminate entire data reading, which means that there is no difference in the number of cycles in both cases.

In processing shown in (a) of FIG. 4, the "Ra" command is first issued and then "Ab" command is issued, thereby taking twenty-one cycles to terminate entire data reading, whereas in processing shown in (b) of FIG. 4, the "Ab" command is first issued and then the "Ra" command is issued, taking twenty-two cycles to terminate the entire data reading by contraries.

As described above, in the case where data is transferred from an arbitrary address across the bank boundary, the number of cycles required to terminate the entire data reading changes depending on which is first issued between the Ra command and the Ab command, that is determined based on the number of bytes of data to be first transferred in the bank 0. From the specific examples in FIGS. 2 to 4, it is clear that the number of cycles changes depending on whether the data length of transferred data is larger or smaller than the CAS latency "3".

Accordingly, the conventional memory control unit can perform only the procedure of issuing the "Ra" command first and then the "Ab" command next (the processing shown in (a) of FIGS. 2 to 4) because of the fixed rule and constraint, resulting in degradation in data transfer efficiency in some cases.

On the other hand, in the present memory control unit, as described above, the address generator 12 calculates the number of bytes to be first transferred in the bank 0, and sends it as the transferred-byte-number information to the command generator 13. The command generator 13 then evaluates the number of transferred bytes obtained as the transferred-byte-number information for the data to be first transferred in the bank 0, and compares the number with the predetermined CAS latency, thereby controlling the SDRAM 15.

In the specific examples described above, the command generator 13, for example, is previously provided with a threshold value "3". Then, the command generator 13 controls the SDRAM 15 so that the SDRAM 15 issues the Ab command first (the processing shown in (b) of FIG. 2) in the case of the inputted number of transferred bytes X<3, or issues the Ra command first (the processing (a) of FIGS. 3 and 4) in the case of X≧3. It is thus possible to increase the data transfer efficiency of the SDRAM 15.

As in the above, in the memory control unit according to the first embodiment of the present invention, the command generator 13 judges which is first issued between the Ra command and the Ab command, based on the transferred-byte-number information generated in the address generator 12, thereby controlling the processing of the SDRAM 15. In this way, in the case where data reading is continuously performed in different banks, commands are issued such that data transfer can be always terminated in a minimum cycle. Thus, the number of cycles required for two continuous access (access to the banks 0 and 1) can be reduced, making it possible to increase actual transfer rates of the SDRAM 15.

Although the case where the CAS latency is "3" clocks and the burst length is "8" data is described as conditions in the above specific embodiment, the application of the present memory control unit is not limited to the above case and the data-transfer-cycle can be optimized in the other conditions by controlling commands according to the same ideas as in the above.

(Second Embodiment)

FIG. 5 is a block diagram showing a structure of a memory control unit according to a second embodiment of the present invention. In FIG. 5, the memory control unit according to the second embodiment comprises a transfer-target unit 21, an address generator 22, a command generator 23, a data processor 24, an SDRAM 25, and a counter 26.

The memory control unit according to the second embodiment of the present invention is effective in the case where data transfer is continuously performed with respect to an address in a bank 0 in the SDRAM 25, then an address in a bank 1 across a bank boundary, and next to another address in the bank 0.

The transfer-target unit 21 outputs commands such as a start address (a virtual address), a transfer size, and read (or write) which relate to data to be read (or written), to the address generator 22.

The address generator 22 receives the commands from the transfer-target unit 21, then generates control signals for a start address (a physical address), a burst length, and read (or write) which are obtained by dividing the commands into a plurality of instructions for data transfer, and outputs the signals to the command generator 23. The address generator 22 also outputs a transfer-data-size which represents a size of data to be first transferred from/into the bank 0, to the counter 26.

The counter 26 counts the number of times of issuing read (or write) commands in the command generator 23, and with each count subtracts a size of transferred data, i.e., the burst length which is a size of data capable of being transferred by one burst instruction to the SDRAM 25 from the transfer size supplied from the address generator 22. When the transfer size after the subtraction (that is the remainder of data to be transferred) becomes less than or equal to the burst length, the counter 26 then notifies the command generator 23 of the fact.

The command generator 23 generates control commands designating page (row)/column addresses in accordance with a clock and the control signals received from the address generator 22, and outputs control commands to the SDRAM 25. Here the command generator 23, upon receipt of the notification from the counter 26, converts a read (or write) command to the bank 0 to be issued to the SDRAM 25 into a read (or write) command accompanied by the next precharge command to the bank 0, and sends it to the SDRAM 25. The read (or write) command accompanied by the precharge command is, when the currently-performed transfer processing in the bank 0 is terminated, for performing the next precharge processing in the bank 0 without issuing a precharge command during performing transfer processing in the bank 1. The command generator 23 also outputs a control command instructing read (or write), to the data processor 24.

The data processor 24 reads data from the SDRAM 25 in synchronization with the clock in response to control commands for data read outputted from the command generator 23, and transfers the data to the transfer-target unit 21 (or reads data from the transfer-target unit 21 in response to control commands for data write and transfers the data to the SDRAM 25 in synchronization with the clock).

The SDRAM 25 is a synchronous dynamic random access memory which receives the control commands outputted from the command generator 23 to operate.

Next, an increase in data transfer efficiency offered by the memory control unit according to the second embodiment is explained in comparison with the data transfer in the conventional memory control unit, citing a specific example of data transfer.

Figure 6:
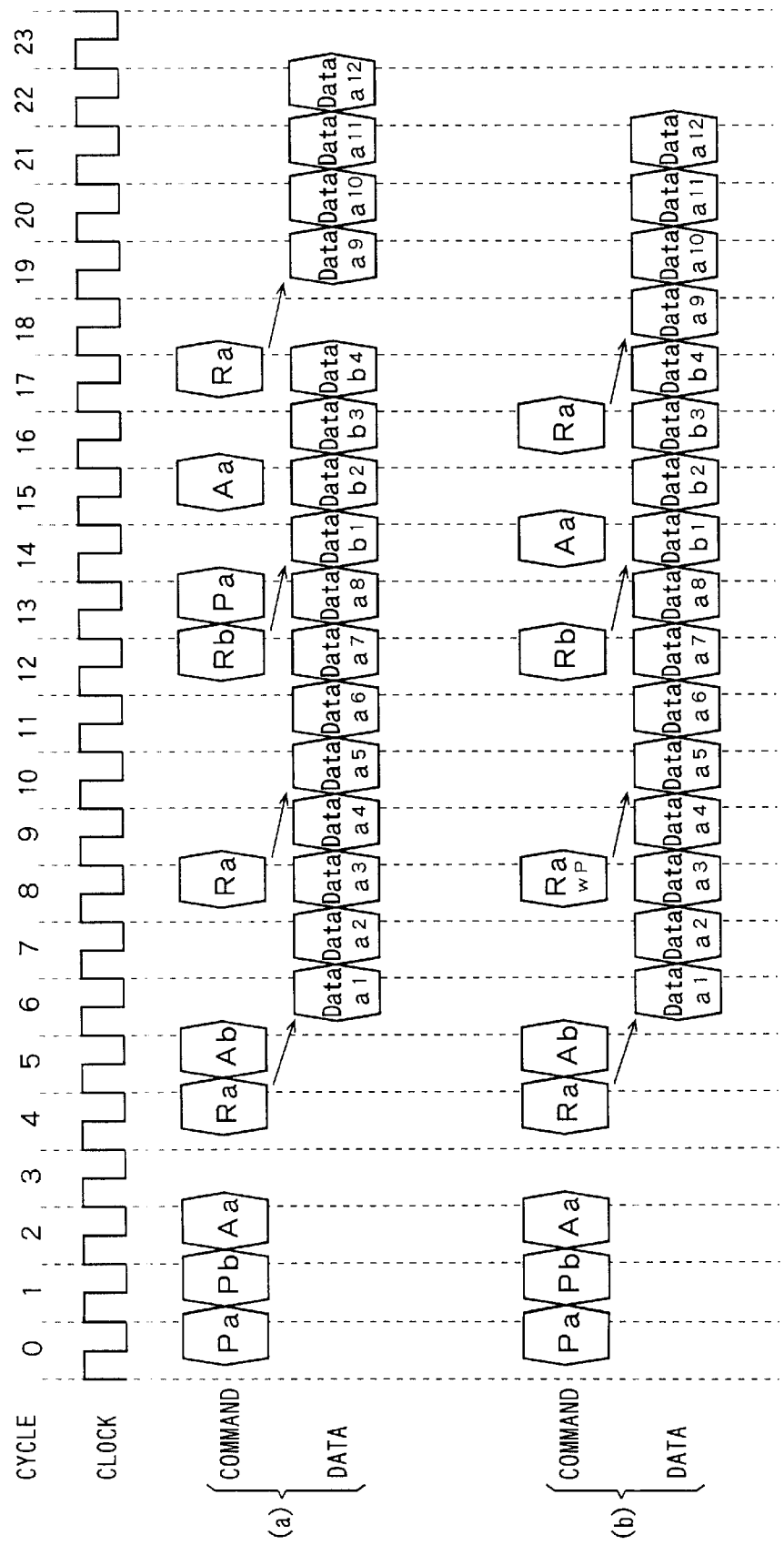
FIG. 6 shows examples of data read timing in the case where data is continuously read across a bank boundary.
Figure 29:
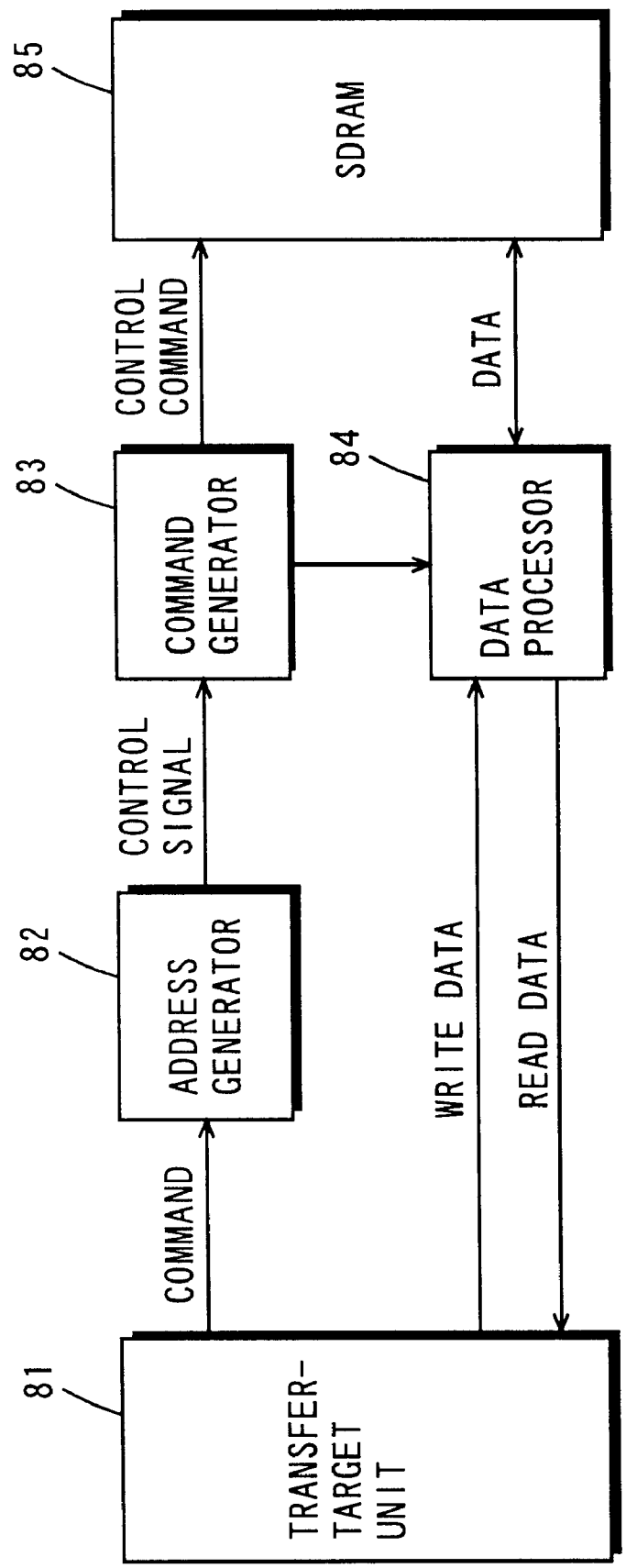
FIG. 29 is a block diagram showing a structure of a conventional memory control unit.
Figure 30:
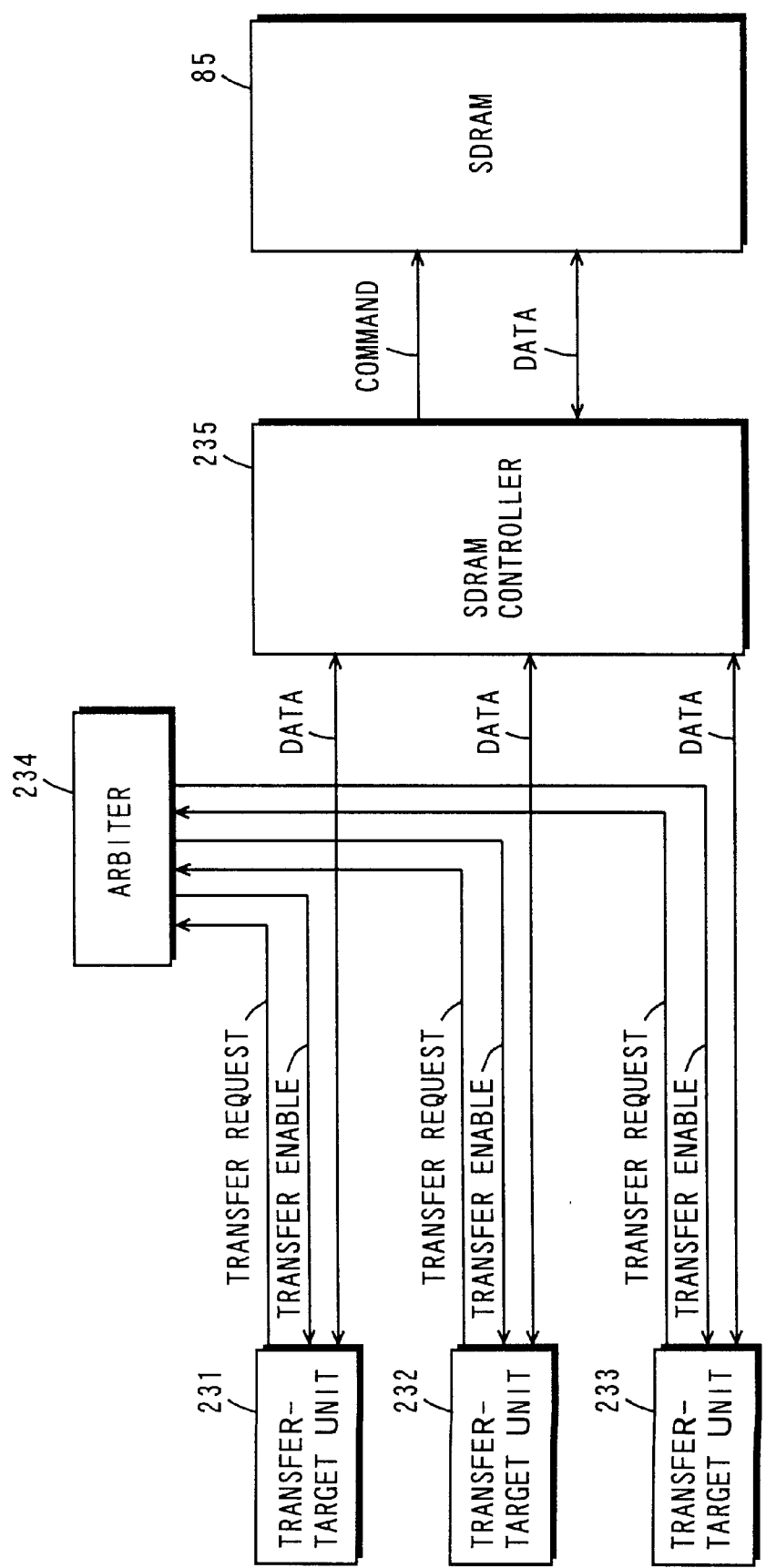
FIG. 30 is a block diagram showing a structure of a conventional memory system.
Figure 31:
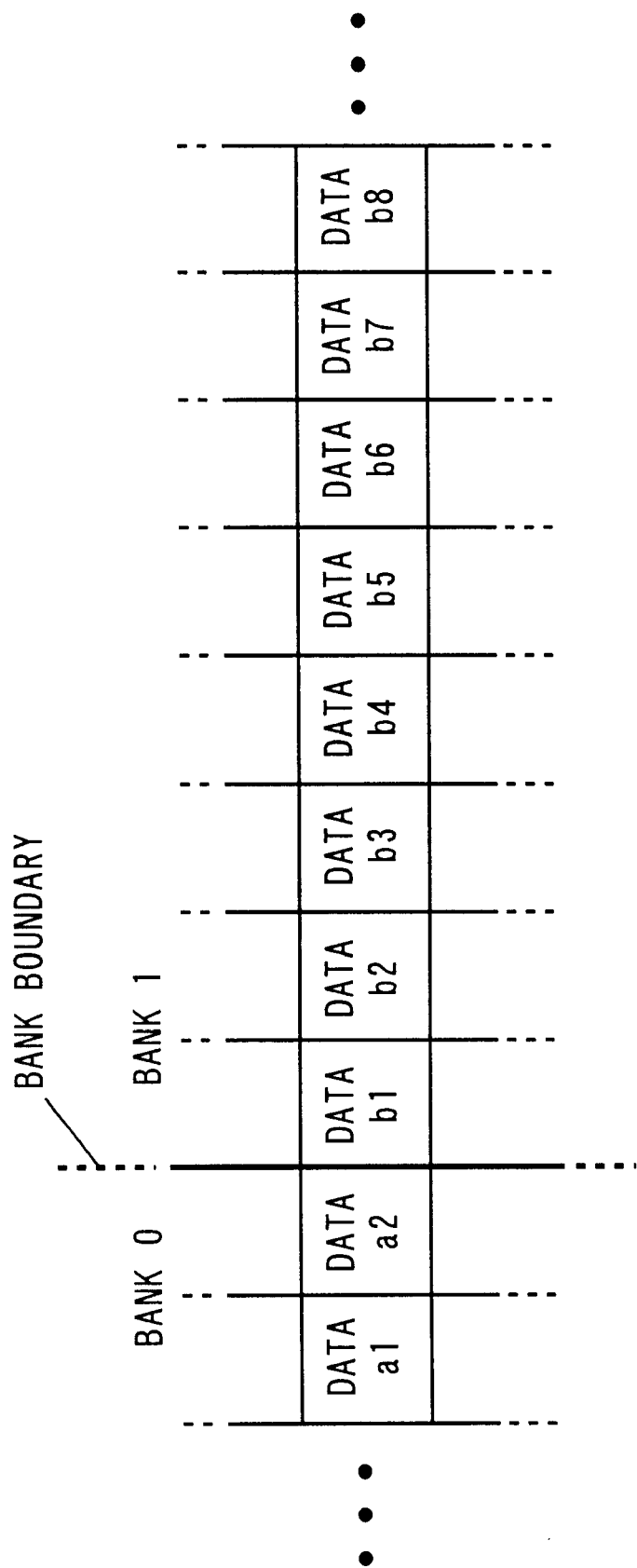
FIG. 31 shows layout of data used for describing operation of the conventional memory control unit in FIG. 29.

FIG. 6 is two types of data read timing in the case where a total of twelve pieces of data a1 to a8 in the bank 0 and data b1 to b4 in the bank 1 are continuously read across a bank boundary, and then data a9 to a12 in the bank 0 are read in succession. Processing in (a) of FIG. 6 shows the data read timing in the conventional memory control unit as shown in FIG. 29. Processing in (b) of FIG. 6 shows data read timing in the memory control unit according to the second embodiment.

Note that in FIG. 6, precharge commands to the banks 0 and 1 are represented by "Pa" and "Pb", respectively, active commands to the banks 0 and 1 are represented by "Aa" and "Ab", respectively, a read command to the bank 1 is represented by "Rb", and a read command with precharge to the bank 0 is represented by "RawP". Besides, it is assumed in FIG. 6 that CAS latency is "2" clocks and a burst length is "4" data.

With reference to the processing shown in (a) of FIG. 6, the command generator 83 issues the Pa command first to read data in the bank 0 containing data a1 to a8 (in the zeroth cycle). The Pb command to the bank 1 is then issued utilizing the CAS latency interval (2 clocks) (in the first cycle). After that, the Aa command is issued at the second clock from the issue of the Pa command (in the second cycle). At the second clock therefrom, the first Ra command is issued (in the fourth cycle), thereby transferring data a1 to a4 (because the burst length is "4"). Here, the Ab command is issued during the data transfer in the bank 0, so as to access the bank 1 any time (in the fifth cycle). Then the second Ra command is issued in the eighth cycle so as to start transferring data a5 to a8 immediately after the data a4 is transferred.

The command generator 83 then issues the Rb command in the twelfth cycle so that the data b1 to b4 in the bank 1 can be transferred immediately after the data transfer in the bank 0 is terminated. From then on, in order to transfer the data a9 to a12 existing in the other addresses in the bank 0, the Pa, Aa and Ra commands are issued at intervals of two clocks in accordance with the CAS latency (in the thirteenth, fifteenth and seventeenth cycles).

In this way, in the conventional memory control unit, a blank period in which no data is transferred occurs (in the eighteenth cycle) between the end of the transfer processing in the bank 1 and the start of the transfer processing in the bank 0. The reason is that since the Rb command and the Pa command cannot be simultaneously issued in the twelfth cycle, the Rb command is first issued to perform data reading in the bank 1, and then the Pa command is issued next.

On the other hand, the memory control unit according to the second embodiment solves the above problem with the following method. It should be noted that, as described earlier, the address generator 22 outputs "8" which is the number of the data a1 to a8 to be first transferred in the bank 0, to the counter 26 as the transfer size in the above condition (refer to FIG. 5).

The processing shown in (b) of FIG. 6 is the same as the above-described processing up to the fifth cycle in the drawing. In the processing shown in (b) of FIG. 6, however, when the first Ra command is issued in the fourth cycle, the counter 26 subtracts "4" (the number of data a1 to a4) from the transfer size "8" acquired from the address generator 22. Then the remainder of the data to be transferred, i.e., the transfer size after the subtraction (=4) becomes less than or equal to the burst length (=4), and therefore the counter 26 notifies the command generator 23 of the fact. The command generator 23 next issues the second Ra command in the eighth cycle so as to start transferring the data a5 to a8 immediately after the data a4 is transferred. Here, the second Ra command issued at this time is the RawP command which is the read command with precharge, and outputted in response to the notification received from the counter 26.

The RawP command allows the SDRAM 25 to perform precharge processing at its own discretion without receiving the Pa command again from the command generator 23, in the thirteenth cycle in which the data a8 can be transferred without problems.

In this way, the Aa command and the Ra command each can be issued one cycle earlier (in the fourteenth and sixteenth cycles). As a result, it is possible to terminate the entire data transfer by the twenty-first cycle, whereas in the processing (a) of FIG. 6 the entire data transfer is terminated in the twenty-second cycle.

As described above, in the memory control unit according to the second embodiment of the present invention, the counter 26 counts the number of times the read commands are issued by the command generator 23, thereby detecting the last data transfer in one bank to which processing is to be performed. In accordance with the detection result, the command generator 23 then issues the read command with precharge, to control the processing in the SDRAM 25. By this processing, in the bank receiving the command with precharge, after read processing for one data is completed, precharge processing for the other data is automatically executed. Accordingly, the precharge processing is started without delay even when the timing of issuing the precharge command matches the timing of issuing the other subsequent command, making it possible to increase the effective transfer rates of the SDRAM 25.

Although the case where the CAS latency is "2" clocks and the burst length is "4" data is described as conditions in the above specific embodiment, the application of the present memory control unit is not limited to the above case and the data-transfer-cycle can be optimized in the other conditions by controlling commands according to the same idea as in the above.

(Third Embodiment)

Figure 7:
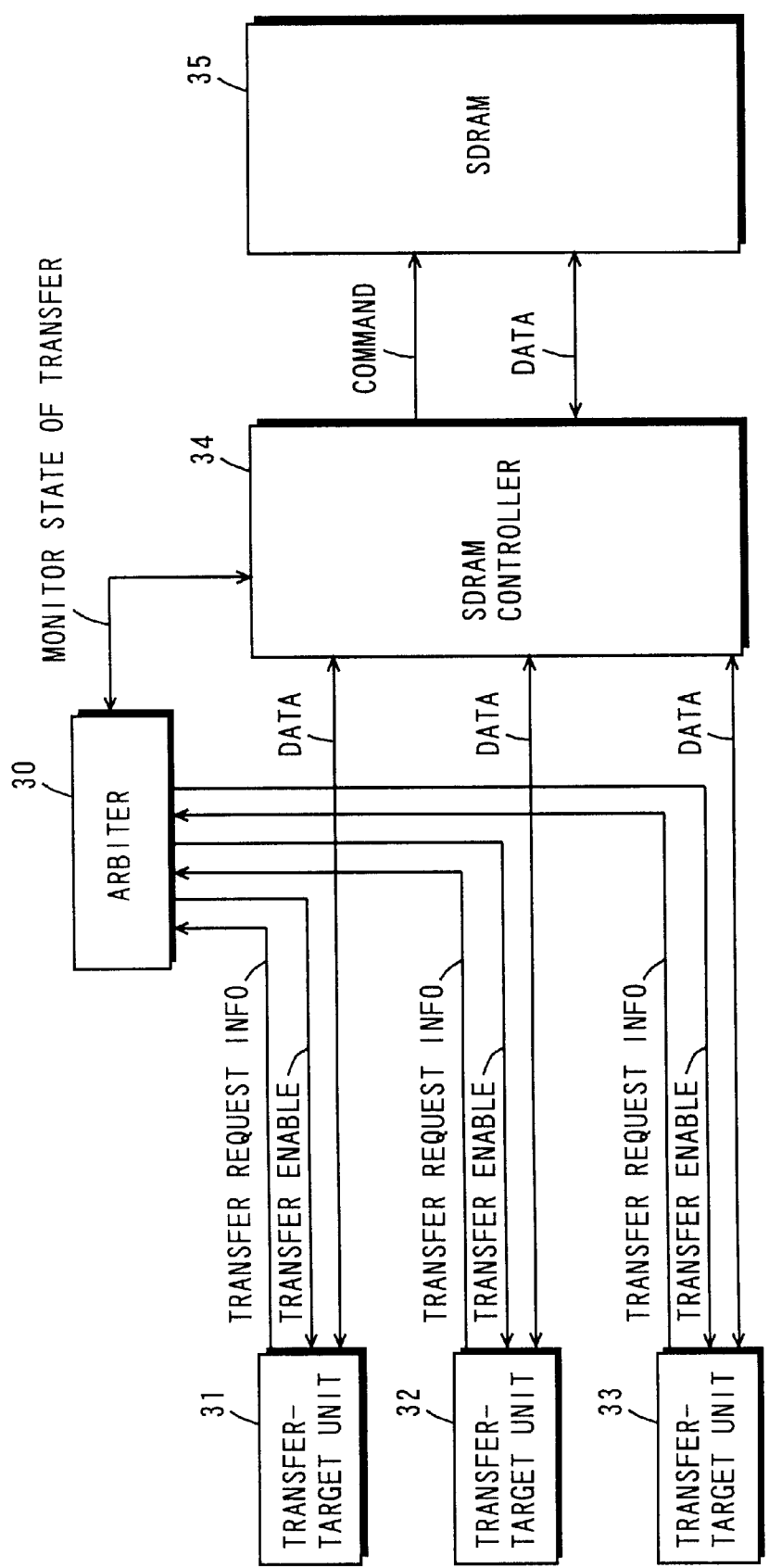
FIG. 7 is a block diagram showing a structure of a memory system according to a third embodiment of the present invention.

FIG. 7 is a block diagram showing a structure of a memory system according to a third embodiment of the present invention. In FIG. 7, the memory system according to the third embodiment comprises transfer-target units 31 to 33, an arbiter 30, an SDRAM controller 34, and an SDRAM 35.

Each of the transfer-target units 31 to 33 outputs a transfer request signal to the arbiter 30 when requested to transfer data with the SDRAM 35, and then outputs transfer information to the SDRAM controller 34 when receiving a transfer enabling signal returned from the arbiter 30.

The arbiter 30 always monitors whether each transfer-target unit is transferring data with the SDRAM 35 or not. When acquired transfer request information from any one of the transfer-target units, the arbiter 30 returns a transfer enabling signal to the transfer-target unit which outputs the transfer request information, at the time when data transfer to/from all transfer-target units is terminated. Moreover, when acquired transfer request information from a plurality of transfer-target units, the arbiter 30 selects one of them, then returns a transfer enabling signal to the transfer-target unit which outputs the selected transfer request information, and processes the other transfer request information which are not selected this time in the same way. The selection method here will be described later in detail.

The SDRAM controller 34 generates control commands such as CLK, RAS, CAS, WE and an access address and the like based on the transfer information outputted from the transfer-target unit, and outputs the commands to the SDRAM 35, thereby realizing data transfer between the SDRAM 35 and the transfer-target unit which outputs the transfer information. Some SDRAM controllers 34 are constituted by the address generator 12, the command-generator 13, and the data processor 14 as described in the first embodiment, and the other SDRAM controller 34 is constituted by the address generator 22, the command generator 23, the data processor 24, and the counter 26 as described in the second embodiment. The SDRAM 35 has the same features as a typical SDRAM described earlier, and is controlled by the control commands acquired from the SDRAM controller 34.

Figure 8:
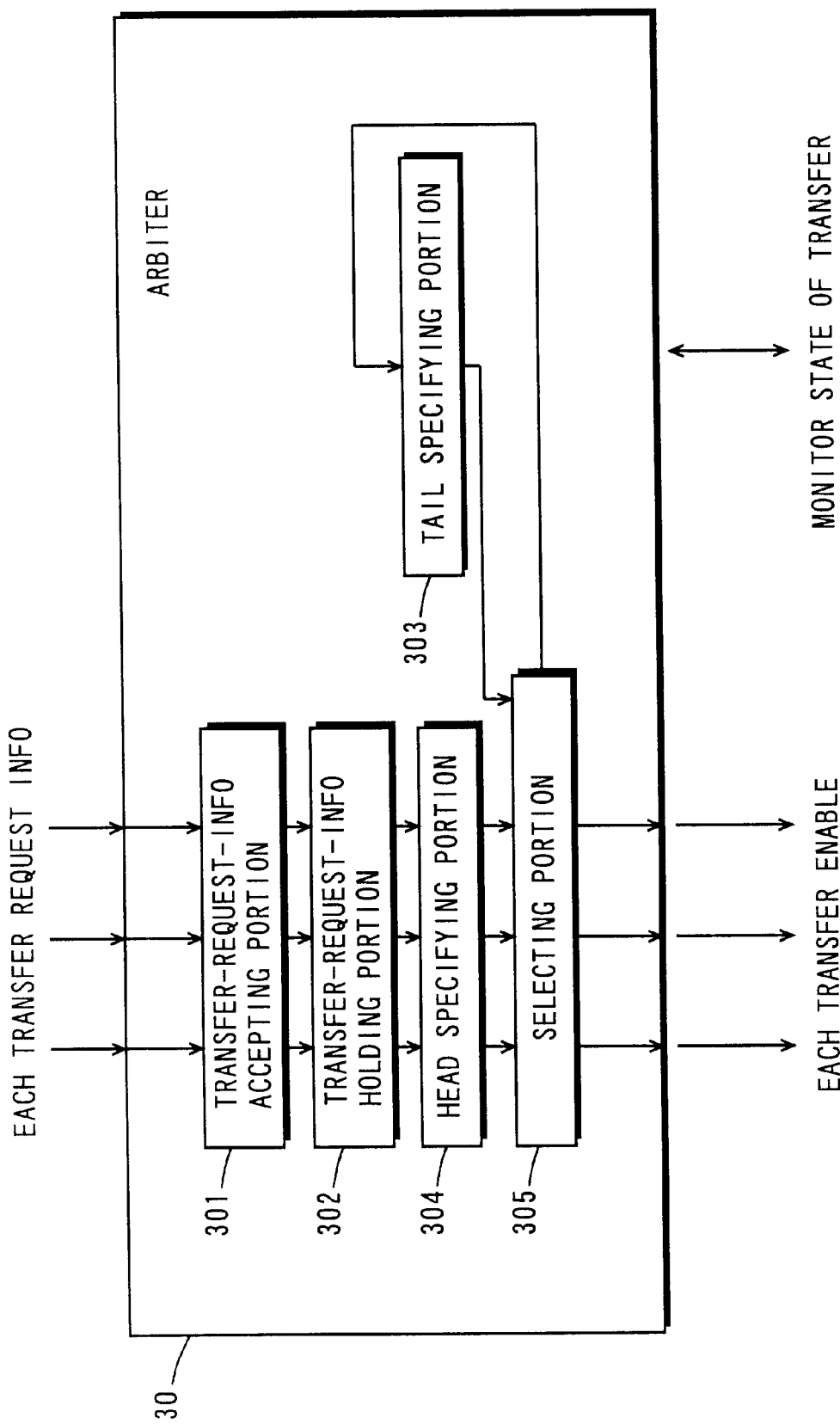
FIG. 8 is a block diagram showing a detailed structure of the arbiter 30 shown in FIG. 7.

FIG. 8 shows a detailed structure of the arbiter 30. In FIG. 8, the arbiter 30 comprises a transfer-request-information receiving portion 301, a transfer-request-information holding portion 302, a tail specifying portion 303, and ahead specifying portion 304, and a selecting portion 305.

The transfer-request-information receiving portion 301 accepts the transfer request information issued by the transfer-target units 31 to 33, respectively. The transfer request information includes memory area information indicating memory areas to be accessed, and limit information indicating time limits for transfer pending. The memory area information includes a physical address in the SDRAM 35, a bank number in the SDRAM 35, or a pair of a bank number and a page number in the SDRAM 35, for example. The limit information includes a limit cycle number representing limits for the number of cycles permitted from the issue of the transfer request information to the completion of the corresponding transfer, for example. The transfer-request-information holding portion 302 holds each transfer request information accepted by the transfer-request-information receiving portion 301 until the corresponding transfer is allowed. The tail specifying portion 303 specifies a tail bank to be accessed at the last, or a pair of a tail bank and a tail page to be accessed at the last, in currently-accessed transfer request information or in preceding transfer request information to be accessed with higher priority. The head specifying portion 304 specifies for each transfer request information a head bank to be accessed first, or a pair of a head bank and a head page to be accessed first. The selecting portion 305 selects access to a memory area indicated by the transfer request information corresponding to the head bank representing a different bank from the tail bank, prior to access to a memory area indicated by transfer request information corresponding to the head bank representing the same bank as the tail bank. Alternatively, the selecting portion 305 selects access to a memory area indicated by the transfer request information corresponding to the head bank representing a different bank from the tail bank, and access to a memory area indicated by the transfer request information corresponding to the head bank representing the same bank as the tail bank and also corresponding to the head page representing the same page as the tail page, prior to access to a memory area indicated by the transfer request information corresponding to the head bank representing the same bank as the tail bank and also corresponding to the head page representing a different page from the tail page. The selecting portion 305 thus defines order of access immediately after the access to the memory area indicated by the preceding transfer request information. Besides, the selecting portion 305 judges whether each transfer request information is to exceed the limits indicated by the limit information or not, and thereby selects with the highest priority access to a memory area indicated by the transfer request information which is judged to most likely exceed the limits.

Figure 9:
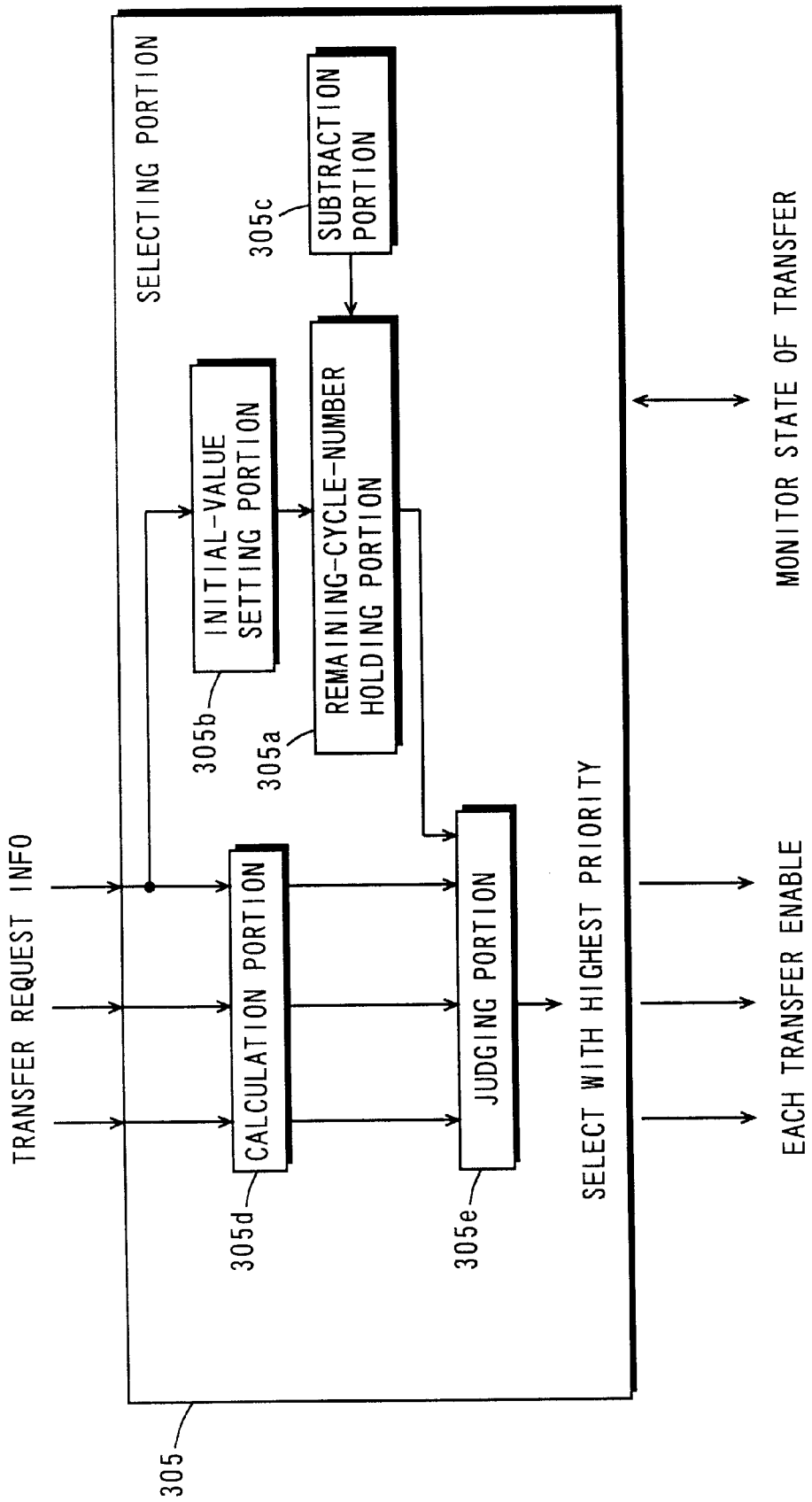
FIG. 9 is a block diagram showing an example of a structure of the selecting portion 305 shown in FIG. 8.

FIG. 9 shows an example of a structure of the selecting portion 305 in FIG. 8. It is possible that the selecting portion 305 has the structure including a remaining-cycle-number holding portion 305a, an initial-value setting portion 305b, a subtraction portion 305c, a calculation portion 305d, and a judging portion 305e as shown in FIG. 9, for example.

The remaining-cycle-number holding portion 305a holds, for each transfer request information, the remaining number of cycles representing limits for the number of cycles permitted from the present time until the transfer is completed. The initial-value setting portion 305b makes the remaining-cycle-number holding portion 305a hold the limit cycle number as an initial value of the remaining cycle number when the transfer request information is issued. The subtraction portion 305c subtracts one from the remaining cycle number held in the remaining-cycle-number holding portion 305a in each cycle. The calculation portion 305d calculates for each transfer request information "(the number of cycles required until the currently-executed access is completed)+(the number of cycles required for access corresponding to the transfer request information selected with higher priority)+(the number of cycles required to transfer data held in an amplifier for transfer to one predetermined page)+(the number of cycles required to transfer data stored in one predetermined page to an amplifier for transfer)+(the number of cycles required for its own access)=the prospective cycle number for completion" by the time when the currently-executed access is completed. The judging portion 305e judges that the corresponding transfer request information is to exceed the limits in the case of "the prospective cycle number for completion>the remaining cycle number".

Figure 10:
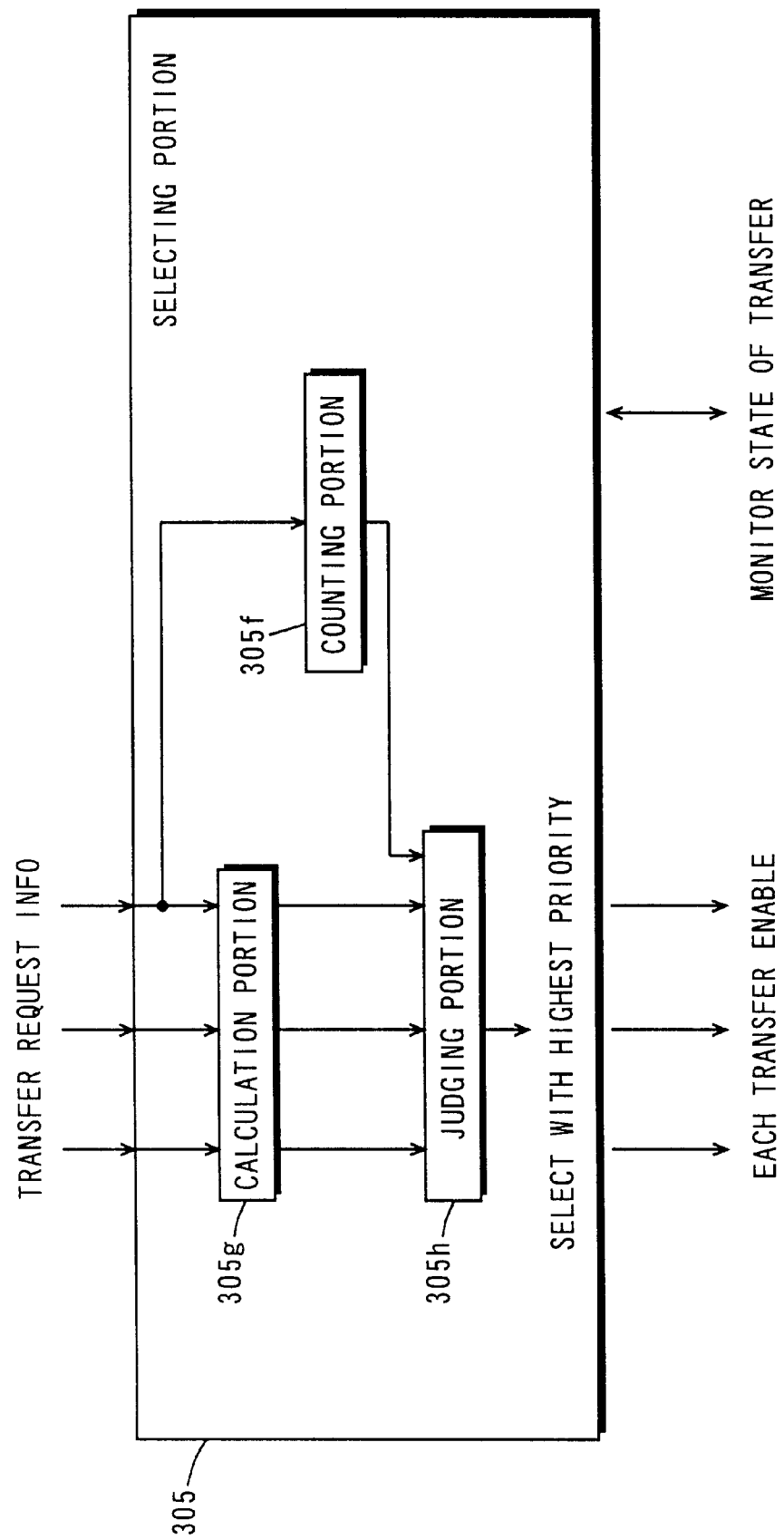
FIG. 10 is a block diagram showing another example of the structure of the selecting portion 305 shown in FIG. 8.

FIG. 10 shows another example of the structure of the selecting portion 305 in FIG. 8. It is also possible to include, in the structure of the selecting portion 305, a counting portion 305f, a calculating portion 305g, and a judging portion 305h as shown in FIG. 10, for example.

The counting portion 305f counts the number of queued cycles for each transfer request information in cycles from when the transfer request information is issued. The calculation portion 305g calculates for each transfer request information "(the number of queued cycles)+(the number of cycles required until the currently-executed access is completed)+(the number of cycles required for access corresponding to the transfer request information selected with higher priority)+(the number of cycles required to transfer data held in an amplifier for transfer to one predetermined page)+(the number of cycles required to transfer data stored in one predetermined page to an amplifier for transfer)+(the number of cycles required for its own access)=the prospective cycle number for completion" by the time when the currently-executed access is completed. The judging portion 305h judges that in the case of "the prospective cycle number for completion>the limit cycle number", the corresponding transfer request information is to exceed the limits indicated by the limit information.

Figure 11:
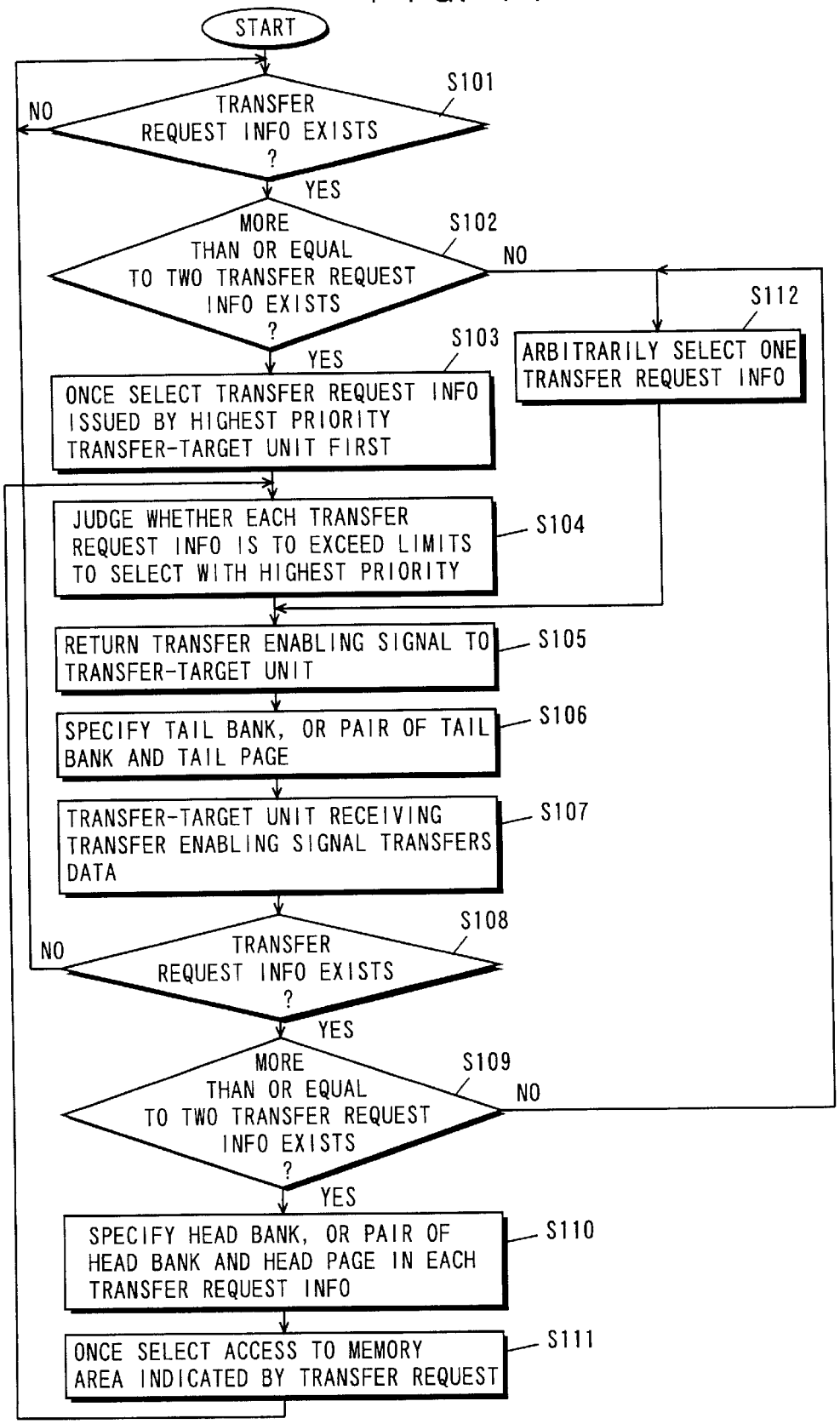
FIG. 11 is a flow chart delineating a method of optimizing order of executing access in a memory control unit according to the third embodiment of the present invention.
Figure 12:
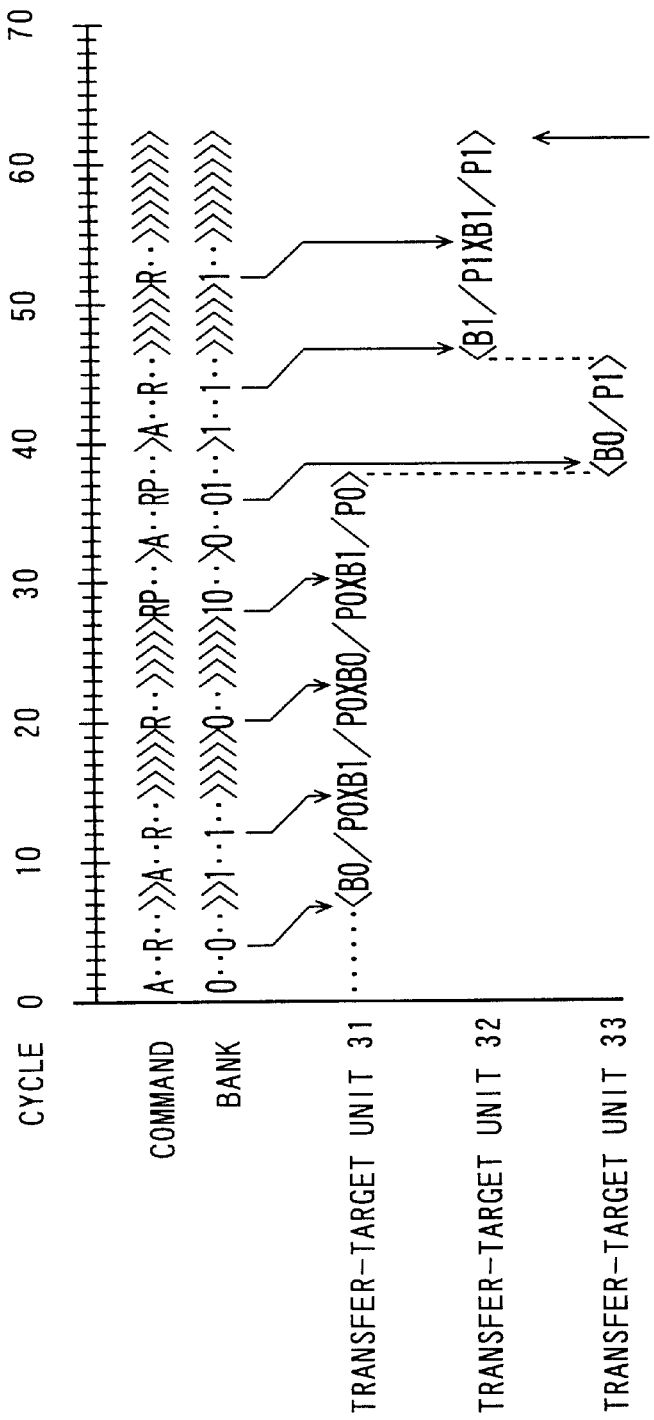
FIG. 12 shows transfer order in operation clocks in the case where data transfer as shown in FIG. 33 is simultaneously requested from transfer-target units in the memory system according to the third embodiment of the present invention.

Described next is an operation of the memory system according to the third embodiment, referring to FIGS. 11 and 12. FIG. 11 is a flow chart delineating a method of optimizing order of executing access in the memory system according to the third embodiment of the present invention. FIG. 12 shows order of transfer in operation clocks in the case where the data transfer as shown in FIG. 33 is simultaneously requested from the transfer-target units in the memory system according to the third embodiment of the present invention. It is also assumed in FIG. 12 that CAS latency is 3 and a burst length is 8. Since the CAS latency is 3 as in the case with FIG. 34, read data until one clock after a precharge command is inputted is effective, and it is assumed that an interval between a precharge command and an active command and an interval between an active command and a read command to the same bank both must be more than or equal to 3 clocks.

The flow chart shown in FIG. 11 is explained below.

It should be noted here that the transfer request information corresponding to each data transfer is always issued from each transfer-target unit, the transfer-request-information receiving portion 301 always accepts the issued transfer request information, and the transfer-request-information holding portion 302 holds the transfer request information until the corresponding transfer is permitted. Moreover, the initial-value setting portion 305b makes the remaining-cycle-number holding portion 305a hold each limit cycle number as an initial value of the remaining cycle number, and then the subtraction portion 305c subtracts one from the remaining cycle number in each cycle. It is assumed here that the transfer-target units simultaneously issue transfer request information corresponding to the data transfer as shown in FIG. 33. Specifically, it is assumed that the transfer-target unit 31 issues transfer request information including pairs of a bank number and a page number which align in order that they are accessed, i.e., "the page 0 in the bank 0, the page 0 in the bank 1, the page 0 in the bank 0, and the page 0 in the bank 1", and the limit cycle number "100", the transfer-target unit 32 issues transfer request information including a pair of a bank number and a page number to be accessed, i.e., "the page 1 in the bank 1", and the limit cycle number "100", and the transfer-target unit 33 issues transfer request information including a pair of a bank number and a page number to be accessed, i.e., "the page 1 in the bank 0", and the limit cycle number "100".

First, the arbiter 30 judges whether there is transfer request information held in the holding portion 302 or not (step S101). The judgement in step S101 is repeated until the transfer request information is found. In this example, the three pieces of transfer request information are held in transfer-request-information holding portion 302, and therefore it is judged as Yes. The arbiter 30 then judges whether there are more than or equal to two pieces of transfer request information held in transfer-request-information holding portion 302 or not (step S102). In this example, the three pieces of transfer request information are held in the transfer-request-information holding portion 302, and therefore it is judged as Yes.

When the arbiter 30 judges that there are more than or equal to two pieces of transfer request information (as Yes) in step S102, the selecting portion 305 once selects transfer request information issued by the highest-priority transfer-target unit first (step S103). On the other hand, when the arbiter 30 judges in step S102 that the transfer request information is less than two (as No), the selecting portion 305 arbitrarily selects one piece of transfer-request-information held in the transfer-request-information holding portion 302 (step S112), and then the procedure advances to step 5105. In this example, the transfer request information issued by the transfer-target unit 31 is once selected.

The calculating portion 305d then calculates for each transfer request information "(the number of cycles required until the currently-executed access is completed)+(the number of cycles required to access to the transfer request information once selected with the highest priority)+(the number of cycles required to transfer data held in an amplifier for transfer to one predetermined page)+(the number of cycles required to transfer data stored in one predetermined page to the amplifier for transfer)+(the number of cycles required for its own access)=the prospective number of cycles for completion". In response to the above, in the case of "the prospective number of cycles for completion>the remaining cycle number", the judging portion 305e judges that the corresponding transfer request information is to exceed the limits, and selects the same prior to the transfer request information once selected in step 5102 (step S104). In this example, it is calculated as "the prospective number of cycles for completion=0+32+3+3+16=54" with regard to the transfer request information issued by the transfer-target unit 32, and as "the prospective number of cycles for completion=0+32+3+3+8=46" with regard to the transfer request information issued by the transfer-target unit 33. As to both calculation results, the equation of "the prospective number of cycles for completion>the remaining number of cycles" is not satisfied, the judging portion 305e judges that the both transfer request information are not to exceed the limits, and does not select them with the highest priority.

In the case where the limit cycle number included in the transfer request information issued by the transfer-target unit 32 is "less than 54", or the limit cycle number included in the transfer request information issued by the transfer-target unit 33 is "less than 46", the judging portion 305e selects access to memory areas indicated by the transfer request information with the highest priority.

The arbiter 30 next returns a transfer enabling signal to the transfer-target unit corresponding to the transfer request information finally selected by the judging portion 305e, and deletes the corresponding transfer request information from the transfer-request-information holding portion 302 (step S105). In this example, the transfer enabling signal is returned to the transfer-target unit 31. After that, the tail specifying portion 303 specifies a tail bank to be accessed at the last, or a pair of a tail bank and a tail page to be accessed at the last in the currently-accessed transfer request information or the transfer request information to be accessed with higher priority (step S106). In this example, in the transfer request information issued by the selected transfer-target unit 31, "a tail bank 1 and a tail page 0" to be accessed last is assumed to be specified.

On the other hand, the transfer-target unit, after receiving the transfer enabling signal, transfers data with the SDRAM 35 through the SDRAM controller 34 (step S107). In this example, the transfer-target unit 31 transfers data with the SDRAM 35.

The arbiter 30 then judges again whether there is transfer request information held in the transfer-request-information holding portion 302 or not, just before the currently-performed data transfer is completed (step S108). When it is judged in step S108 that there is no transfer request information (as No), the procedure returns to step S101. In this example, the two pieces of transfer request information are held in the transfer-request-information holding portion 302, and therefore it is judged as Yes. To the contrary, when judging in step S108 that there is transfer request information, the arbiter 30 judges whether more than or equal to two pieces of transfer request information are held in the transfer-request-information holding portion 302, just before the currently-performed data transfer is completed (step S109). In this example, the two pieces of transfer request information are held in the transfer-request-information holding portion 302, therefore it is judged as Yes.

When the arbiter 30 judges in step S109 that there are more than or equal to two pieces of transfer request information (as Yes), the head specifying portion 304 specifies for each transfer request information, a head bank to be first accessed, or a pair of a head bank and a head page to be first accessed (step S110). To the contrary, when judging in step S109 that there are less than two pieces of transfer request information (as No), the arbiter 30 arbitrarily selects one piece of transfer request information held in the transfer-request-information holding portion 302 (step S112), and then the procedure moves to step S105. It is assumed in this example that "a head bank 1 and a head page 1" is specified in the transfer request information issued by the transfer-target unit 32, and "a head bank 0 and a head page 1" is specified in the transfer request information issued by the transfer-target unit 33.

The selecting portion 305 once selects access to the memory area indicated by the transfer request information based on the above-described contents (step S111). When there is no transfer request information to be selected with higher priority, the selecting portion 305 once selects transfer request information issued by the highest-priority transfer-target unit first. Since "the tail bank 1" and "the tail page 0" are assumed in this example, the transfer request information issued by the transfer-target unit 32 corresponds to the head bank 1 representing the same bank as the tail bank 1, and to the head page 1 representing a different page from the tail page 0, and the transfer request information issued by the transfer-target unit 33 corresponds to the head bank 0 representing a different bank from the tail bank 1. Accordingly, the transfer request information issued by the transfer-target unit 33 is once selected prior to the transfer request information issued by the transfer-target unit 32.

After the selection in step S111 is completed, the procedure returns to step S104, and the processing thereafter is continuously performed in accordance with the above-described procedure. In this example, in the case where calculation is done three cycles before the currently-performed data transfer is completed (i. e., in the thirty-fifth cycle from the beginning), it is calculated as "the prospective number of cycles for completion=3+16+3+3+16=41" with regard to the transfer request information issued by the transfer-target unit 32. At this time "the remaining cycle number=100−35=65", which means that "the prospective number of cycles for completion>the remaining cycle number" is not satisfied. Therefore, it is judged that the transfer request information is not to exceed the limits, and the transfer-target unit 32 is not selected with the highest priority.

As described above, the memory system according to the third embodiment of the present invention optimizes the order of access to the memory areas indicated by all transfer request information held in the transfer-request-information holding portion 302 which should be accessed a plurality of times so as to decrease the frequency of continuous access to memory areas in the same bank, or so as to decrease the frequency of continuous access to memory areas in different pages in the same bank. The memory system thus controls processing for memory so that the memory areas in memory are accessed in accordance with the optimized access order.

The numbers of cycles required until the end of the transfer in the conventional art and the present invention are compared below. The 69 cycles are required in the conventional art as shown in FIG. 34, whereas only 62 cycles are required in the present invention as shown in FIG. 12. That is, the required number of cycles in the present invention is fewer by the cycles of the overhead produced by the precharge command (seven cycles), which becomes unnecessary here.

Data transfer is selected just before the previous data transfer is completed in the above description, however, data transfer may be selected with any timing before the previous data transfer is completed. Data transfer may be selected before the previous data transfer is started, of course, and therefore it is also possible to decide order of entire data transfer before the start of entire data transfer. Moreover, it is assumed here that the pairs of the bank number and the page number aligned in the order of access are included in the transfer request information, however, any information may be available if it can specify the head and tail. Besides, if at least information capable of specifying the head and tail banks is included in the transfer request information, the same effect can be obtained by selecting the next data transfer such that the same bank number is not continuous. Moreover, even if information capable of specifying the tail bank is not be included in the transfer request information, it may be acquired from the SDRAM controller 34. Furthermore, there is another variation that an address in memory to be accessed is included in the transfer request information and the arbiter 30 or the SDRAM controller 34 specifies a bank number and a page number based on the address.

(Fourth Embodiment)

Figure 13:
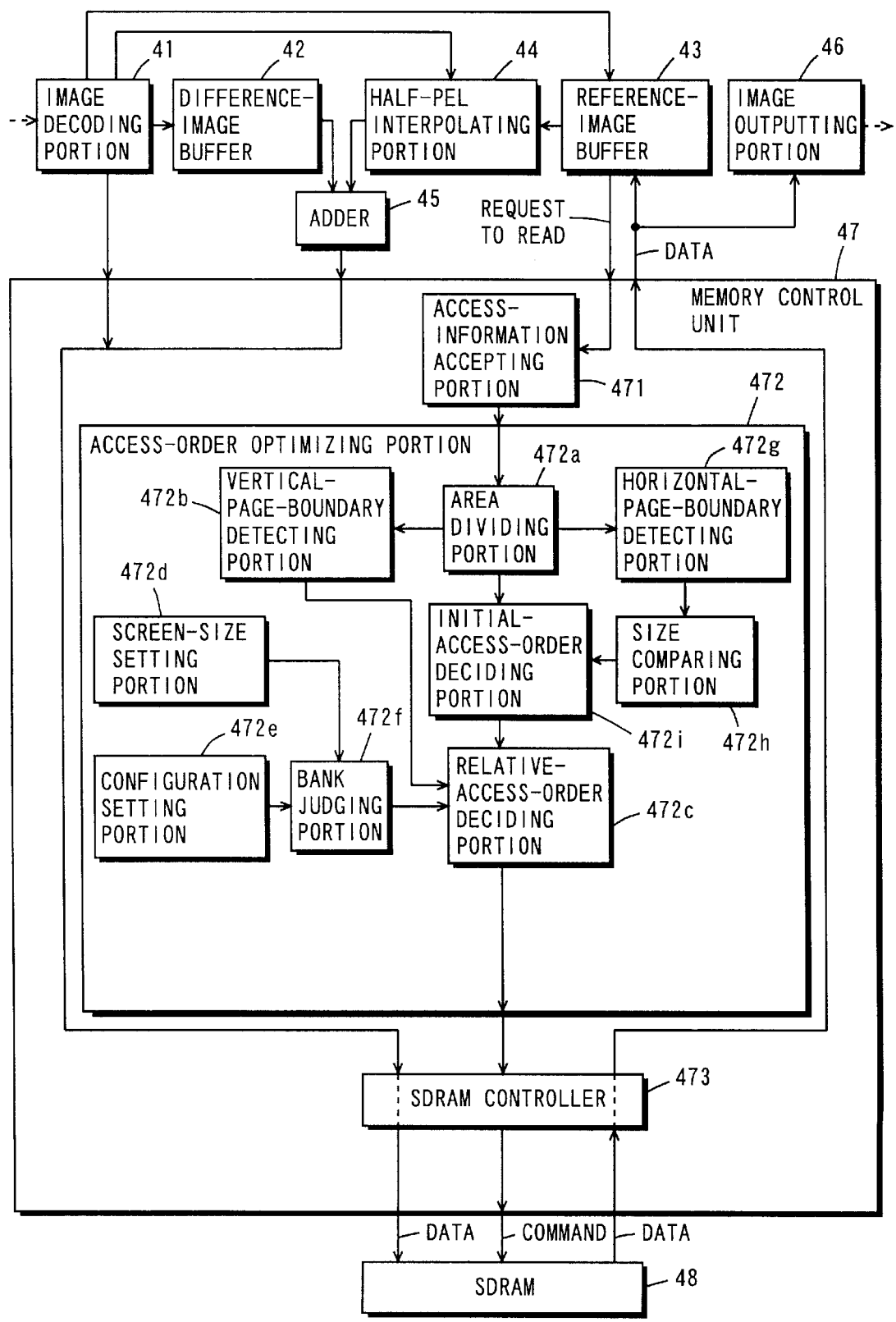
FIG. 13 is a block diagram showing a structure of an image decoding system (a video decoder) using a memory control unit according to a fourth embodiment of the present invention.

FIG. 13 is a block diagram showing a structure of an image decoding system (a video decoder) using a memory control unit according to a fourth embodiment of the present invention.

In FIG. 13, the image decoding system of the fourth embodiment comprises an image decoding portion 41, a difference-image buffer 42, a reference-image buffer 43, a half-pel interpolator 44, an adder 45, an image outputting portion 46, a memory controller 47, and an SDRAM 48.

The image decoding portion 41 decodes a coded reference image which is transmitted, and transfers the decoded reference image through the memory controller 47 to the SDRAM 48. The image decoding portion 41 also decodes a coded difference image, and outputs the decoded difference image to the difference-image buffer 42, an address of the reference image to the reference-image buffer 43, and an interpolating method to the half-pel interpolator 44. The difference-image buffer 42 temporarily stores the decoded difference image, and adjusts operation timing of the adder 45. The reference-image buffer 43 reads the reference image specified by the image decoding portion 41 from the memory controller 47, and temporarily stores the image to output to the half-pel interpolator 44 as required. The half-pel interpolator 44 interpolates the reference images stored in the reference-image buffer 43 according to the interpolating method specified by the image decoding portion 41, and outputs the images to the adder 45. The interpolating method performed here does not directly relate to the subjects of the present invention, and therefore its description is omitted here.

The adder 45 adds the difference image held by the difference-image buffer 42 and the reference image held by the reference-image buffer 43 to obtain an output image, and transfers the image through the memory controller 47 to the SDRAM 48. The image outputting portion 46 reads the decoded image data through the memory controller 47 from the SDRAM 48 in step with the timing of outputting the image, and outputs the data. The memory controller 47 controls the transfer of the decoded image data from the image decoding portion 41 to the SDRAM 48, the transfer of the reference image from the SDRAM 48 to the reference-image buffer 43, the transfer of the output image from the adder 45 to the SDRAM 48, and the transfer of the output image from the SDRAM 48 to the image outputting portion 46. The SDRAM 48 has the same structure and features as the SDRAM 35 in the third embodiment. The image data of respective output images obtained in the adder 45 are stored in respective unit areas in the SDRAM 48 each of which is composed of only a memory area of a single page in a single bank in predetermined order that the data is continuous in the display state. The unit areas contiguous to each other in storage order are composed of different banks.

Figure 14:
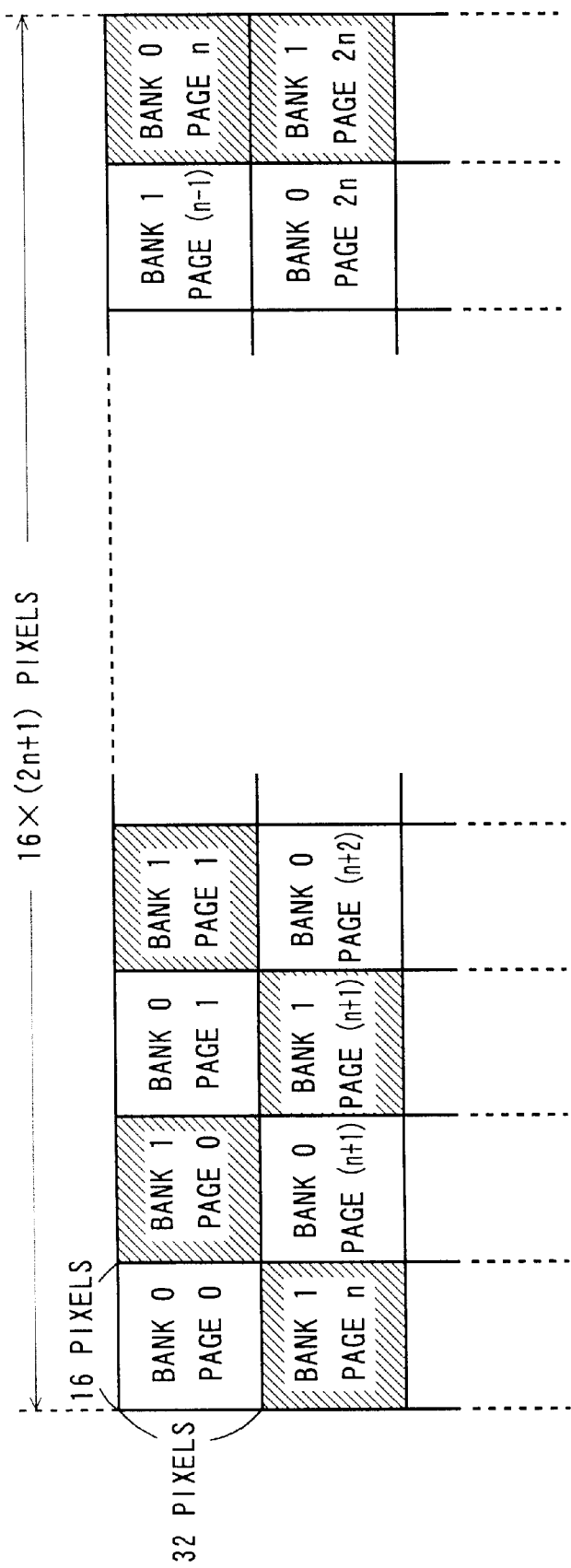
FIG. 14 shows bank numbers and page numbers of storage areas in which image data is stored.
Figure 15:
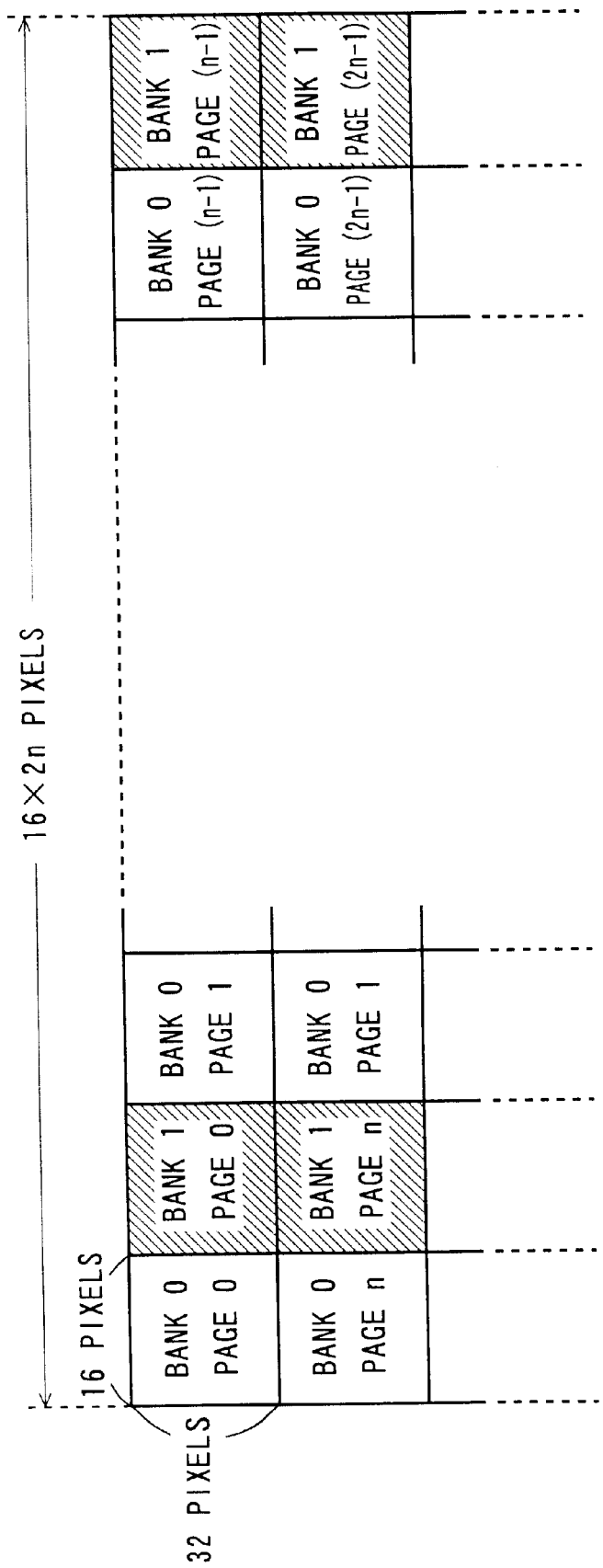
FIG. 15 is the same as FIG. 14 except that the number of horizontal pixels of image data to be stored is "16×2n'"

FIG. 14 shows bank numbers and page numbers of memory areas in which image data is stored, in the case where the image data, whose amount per one pixel (the amount represents "brightness", for example) is 8 bits, of "16×(2n+1)" pixels wide which is composed of rectangle unit areas each of 16 pixels wide by 32 pixels high is stored in the SDRAM 48 comprising two banks (banks 0 and 1) in which a bit width of a data bus is 8 bits, one column is 8 bits and one page includes 512 columns. Note that "n" is an integer of not less than 1. FIG. 15 is the same as FIG. 14 except that the number of pixels in the horizontal direction of the image data to be stored in FIG. 15 is "16×2n".

In FIGS. 14 and 15, each of the rectangle areas divided by solid lines is a memory area composed of a single page, and rectangle areas without shading represent the bank 0 and shaded rectangle areas represent the bank 1. In FIG. 14, data in single-page rectangle areas which are contiguous to each other in the vertical and horizontal directions are stored in the different banks. In FIG. 15, data in single-page rectangle areas which are contiguous to each other in the horizontal direction are stored in the different banks, however, data in single-page rectangle areas which are contiguous to each other in the vertical direction are stored in the same bank.

The transfer of the decoded image data from the image decoding portion 41 to the SDRAM 48, the transfer of the output image from the adder 45 to the SDRAM 48, and the transfer of the output image from the SDRAM 48 to the image outputting portion 46 are not described here since they are the same as those in conventional arts. Therefore, description is made below only about the transfer of the reference image from the SDRAM 48 to the reference-image buffer 43.

Figure 16:
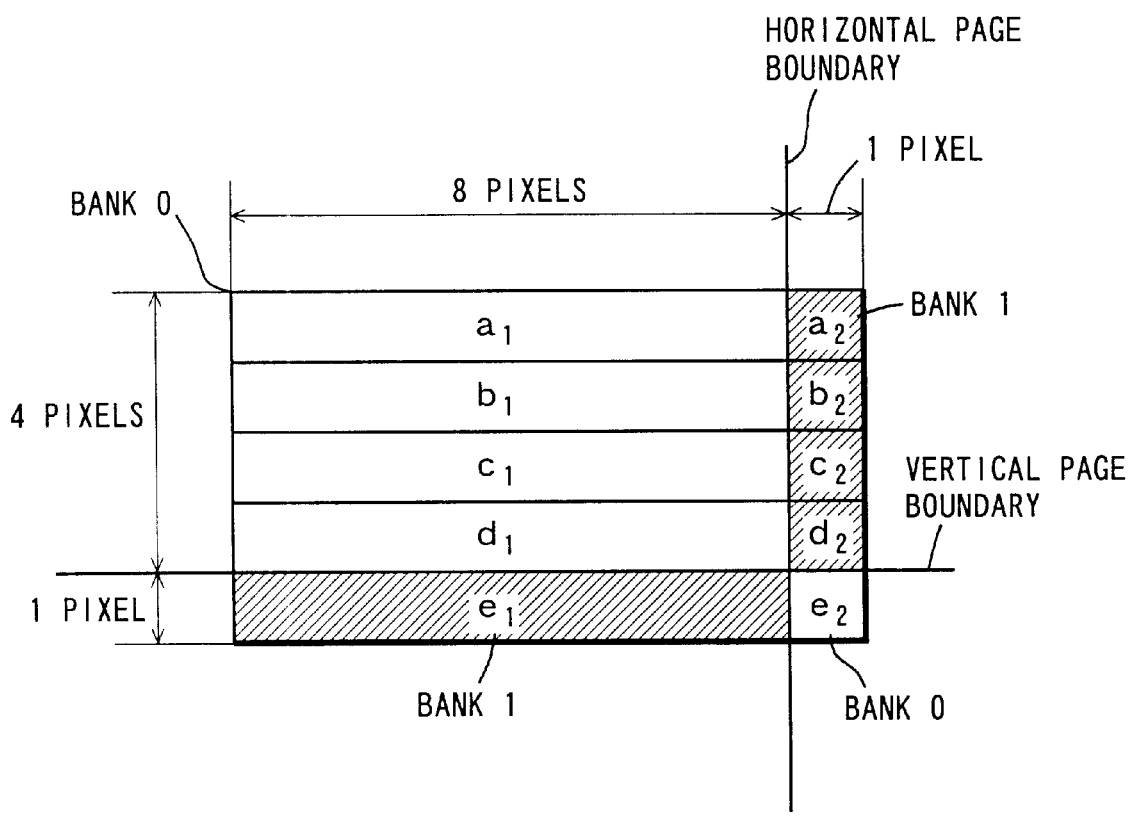
FIG. 16 is an example of a reference image to be read from the image data stored in the SDRAM 48 as shown in FIG. 14.
Figure 17:
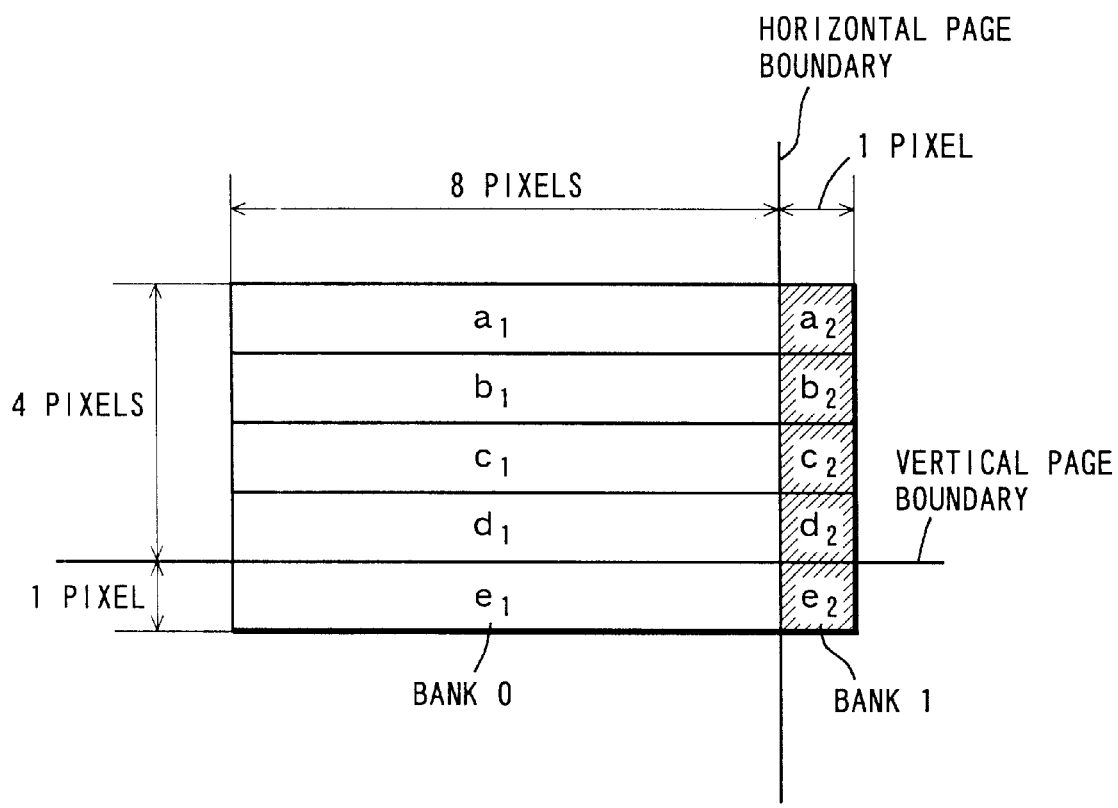
FIG. 17 shows an example of a reference image to be read from the image data stored in the SDRAM 48 as shown in FIG. 15.

FIG. 16 shows an example of a reference image read from the image data stored in the SDRAM 48 as shown in FIG. 14. FIG. 17 shows an example of a reference image read from the image data stored in the SDRAM 48 as shown in FIG. 15. The reference images shown in FIGS. 16 and 17 are each represented by a rectangle area of 9 pixels wide by 5 pixels high, and are generally read in display order, that is, the order of read becomes as "a1→a2→b1→b2→c1→c2→d1→d2→e1→e2".

The memory control unit 47 is constituted by an access-information accepting portion 471, an access-order optimizing portion 472, and an SDRAM controller 473.

The access-information accepting portion 471 accepts an address of a reference image to be read as access information from the reference-image buffer 43. The access-order optimizing portion 472 optimizes order of access to reference images to be read so as to decrease the frequency of continuous access to memory areas in the same bank. The SDRAM controller 473 generates control commands based on respective transfer requests from the image decoding portion 41, the reference-image buffer 43, the adder 45, and the image outputting portion 46, and outputs the commands to the SDRAM 48, thereby realizing data transfer. Especially when the reference image is read, the SDRAM controller 473 controls the SDRAM 48 so that the memory areas in the SDRAM 48 are accessed according to the access order optimized by the access-order optimizing portion 472.

The access-order optimizing portion 472 includes an area dividing portion 472a, a vertical-page-boundary detecting portion 472b, a relative-access-order deciding portion 472c, a screen-size setting portion 472d, a configuration setting portion 472e, a bank judging portion 472f, a horizontal-page-boundary detecting portion 472g, a size comparing portion 472h, and an initial-access-order deciding portion 472i.

The area dividing portion 472a divides a memory area in the SDRAM 48 indicated by an address of a reference image to be read into continuous single-page areas each of which is a memory area composed of a single page. In FIGS. 16 and 17, the memory area is divided into single-page areas of "a1, a2, b1, b2, c1, c2, d1, d2, e1 and e2". The vertical-page-boundary detecting portion 472b detects a boundary between unit areas which are contiguous to each other in the display state but not in the storage order. More specifically, the vertical-page-boundary detecting portion 472b always monitors whether a head address of a horizontal line requested for transfer is in the different unit area from a head address of a horizontal line to be requested for the next transfer or not. When detecting that they are in the different unit areas, the vertical-page-boundary detecting portion 472b judges to detect a vertical page boundary, and outputs a vertical-pagecross signal to the SDRAM controller 473. It should be noted that the vertical page boundary is detected here since the storage order of the unit areas is continuous in the horizontal direction, however, a horizontal page boundary is detected when the storage order is continuous in the vertical direction. In FIGS. 16 and 17, the vertical page boundaries as shown in the drawings are detected. The relative-access-order deciding portion 472c decides order of access to the single-page areas depending on whether unit areas vertically contiguous to each other across the vertical page boundary are composed of the same bank or the different banks. More specifically, when the unit areas contiguous to each other across the vertical page boundary are composed of the same bank, the order of access to the single-page areas below the vertical page boundary is defined as the same as the order of access to the single-page areas above the vertical page boundary, to the contrary, when the contiguous unit areas are composed of the different banks, the access order of the single-page areas below the vertical page boundary is defined as the reverse to the access order of the single-page areas above the vertical page boundary.

The screen-size setting portion 472d sets the number of pixels which are continuous in the storage order and in the display state as a screen size in the image data stored in the SDRAM 48 in response to an instruction from the external. The screen size here is the number of horizontal pixels of the image data to be decoded, that is, "16×(2n+1)" in the example of FIG. 14 and "16×2n" in the example of FIG. 15. The configuration setting portion 472e sets a shape of the unit area in response to an instruction from the external. In the examples shown in FIGS. 14 and 15, the unit area is a rectangle-shaped area of 16 pixels wide by 32 pixels high. The bank judging portion 472f judges whether the unit areas contiguous to each other across the vertical page boundary are composed of the same bank or the different banks based on the screen size and the shape of the unit area in the case where the generated image data is stored in the above-described order that the data is continuous in the display state. In the example of FIG. 14, the data in the single-page rectangle areas vertically contiguous to each other is stored in the different banks, and therefore it is judged that the data is composed of the different banks. In the example of FIG. 15, the data in the single-page rectangle areas vertically contiguous to each other is stored in the same bank, and therefore it is judged that the data is composed of the same bank.

The horizontal-page-boundary detecting portion 472g detects a boundary between unit areas contiguous to each other in the display state and storage order. More specifically, a boundary between unit areas in a horizontal line is detected as a horizontal page boundary. It should be noted that the horizontal page boundary is detected since the storage order of the unit areas here are continuous in the horizontal direction, however, a vertical page boundary is detected when the order is continuous in the vertical direction. In FIGS. 16 and 17, the horizontal page boundaries as shown in the drawings are detected. The size comparing portion 472h compares size of respective memory areas obtained by dividing the reference image by the horizontal page boundary. In FIGS. 16 and 17, it is judged that the memory area on the right side is smaller than that on the left side. The initial-access-order deciding portion 472i decides that the single-page areas above the vertical page boundary are read in order that the single-page boundary belonging to the memory area judged to be smaller by the size comparing portion 472h are read first.

In FIG. 16, the order of access to the lines above the vertical page boundary is from right to left, and the order of access to the lines below the vertical page boundary is from left to right. Therefore, the read order in this case becomes as "a2→a1→b2→b1→c2→c1→d2→d1→e1→e2". In FIG. 17, on the other hand, the order of access to the lines above the vertical page boundary is from right to left, and the order of access to the lines below the vertical page boundary is also from right to left. Therefore, the read access in this case becomes as "a1→a1→b2→b1→c2→c1→d2→d1→e2→e1".

Figure 18:
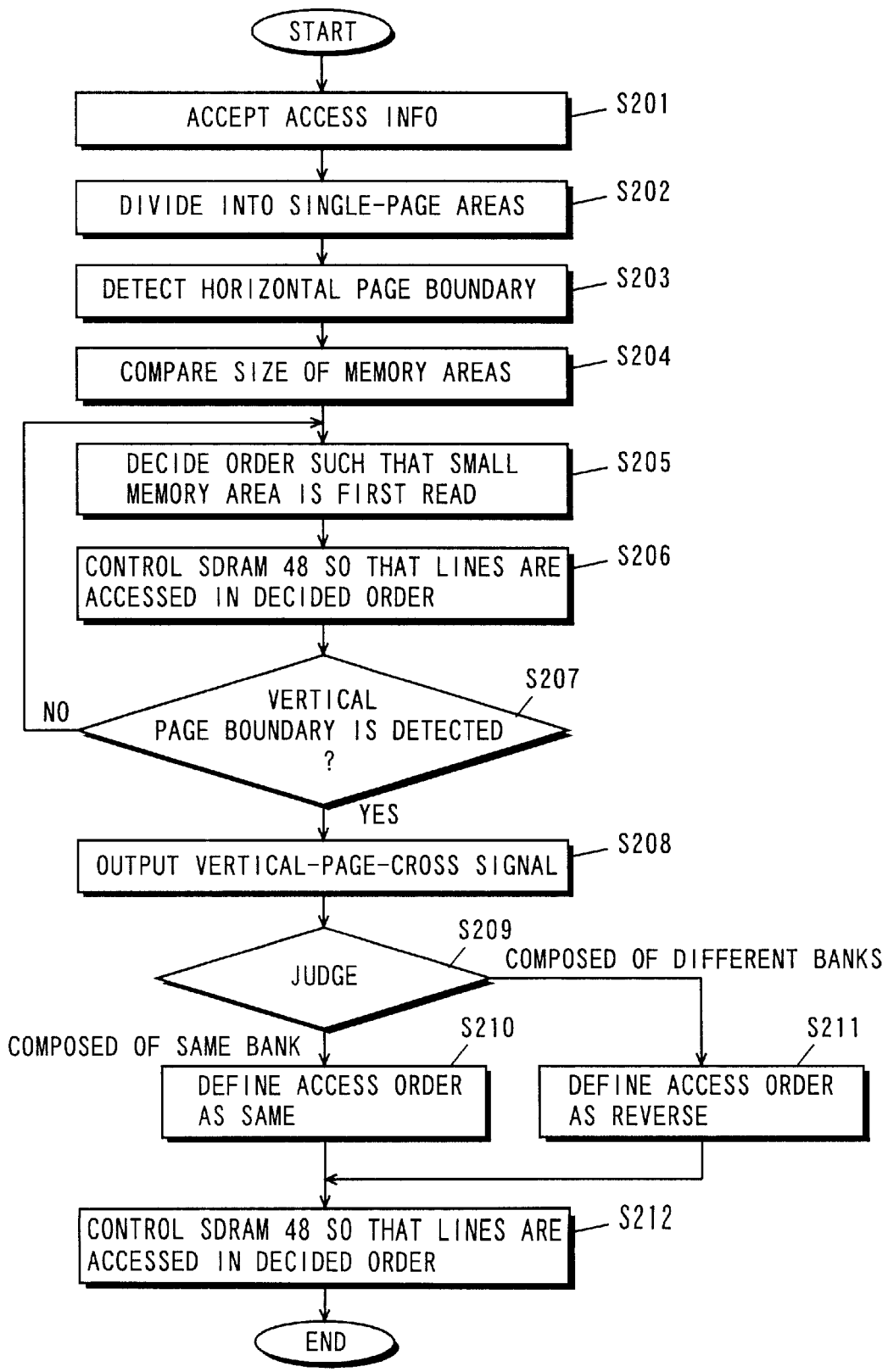
FIG. 18 is a flow chart delineating a method of optimizing order of executing access in the memory control unit according to the fourth embodiment.

Described next is an operation of the memory control unit according to the fourth embodiment, referring to FIG. 18. FIG. 18 is a flow chart delineating a method of optimizing the order of executing access in the memory control unit according to the fourth embodiment of the present invention.

Description is made first about a read order in the case where the reference image shown in FIG. 16 is read from the image data stored as in FIG. 14.

First, the access-information accepting portion 471 accepts access information (step S201). It is assumed in this example that access information about read of the reference image shown in FIG. 16 is accepted. The area dividing portion 472a divides a memory area in the SDRAM 48 indicated by an address of the reference image to be read into single-page areas (step S202). In this example, the memory area is divided into single-page areas of "a1, a2, b1, b2, c1, c2, d1, d2, e1, and e2" shown in FIG. 16. Next, the horizontal-page-boundary detecting portion 472g detects a horizontal page boundary (step S203). In this example, the horizontal page boundary as shown in FIG. 16 is detected. The size comparing portion 472h compares sizes of the memory areas into which the reference image is divided by the horizontal page boundary (step S204). In this example, the memory area on the right side are judged to be smaller than that on the left side.

Next, the relative-access-order deciding portion 472c decides that the lines above the vertical page boundary are accessed and read in ascending order of size of the memory areas (step S205). In this example, the memory area on the right side is smaller, and therefore is decided to be read first. The read order becomes as "a2→a1→b2→b1→c2→c1→d2→d1". Then the SDRAM controller 473 controls the SDRAM 48 so that the lines above the vertical page boundary are accessed in the order decided by the relative-access-order deciding portion 472c (step S206). In this example, the SDRAM controller 473 controls the SDRAM 48 so that the memory area on the right side is read first.

Next, the vertical-page-boundary detecting portion 472b detects a vertical page boundary (step S207), and when detecting the boundary, outputs a vertical-page-cross signal to the SDRAM controller 473 (step S208). In this example, after the read order is decided as "a2→a1→b2→b1→c2→c1→d2→d1", the vertical page boundary as shown in FIG. 16 is detected. Then, the bank judging portion 472f judges whether the unit areas contiguous to each other across the vertical page boundary are composed of the same bank or the different banks, based on the screen size set by the screen-size setting portion 472d and the shape set by the configuration setting portion 472e (step S209). In this example, the unit areas are judged to be composed of the different banks as shown in FIG. 14, based on the screen size of "16×(2n+1)" and the shape of "a rectangle area of 16 pixels wide by 32 pixels high".

When the bank judging portion 472f judges in step S209 that the unit areas contiguous to each other across the vertical page boundary are composed of the same bank, the relative-access-order deciding portion 472c defines the order of access to the single-page areas below the vertical page boundary as the same as the order of access to the single-page areas above the vertical page boundary (step S210). To the contrary, when the bank judging portion 472f judges in step S209 that the unit areas contiguous to each other across the vertical page boundary are composed of the different banks, the relative-access-order deciding portion 472c defines the order of access to the single-page areas below the vertical page boundary as the reverse to the order of access to the single-page areas above the vertical page boundary (step S211). In this example, since the unit areas are composed of the different banks as shown in FIG. 14, the access order of the single-page areas below the vertical page boundary is decided as order that the memory area on te left side is first read, that is, the read order becomes as "e1→e2".

Then, the SDRAM controller 473 controls the SDRAM 48 so that the lines below the vertical page boundary are accessed in the order decided by the relative-access-order deciding portion 472c (step S212). In this example, the SDRAM controller 473 controls the SDRAM 48 so that the memory area on the left side is first read. Accordingly, the read order of all single-page areas becomes as "a2→a1→b2→b1→c2→c1→d2→d1→e1→e2".

Next, similarly, described below is a read order in the case where the reference image shown in FIG. 17 is read from the image data stored as shown in FIG. 15, referring to FIG. 18.

It is assumed that access information about read of the reference image shown in FIG. 17 is accepted in step S201. In step S202, the memory area is divided into single-page areas of "a1, a2, b1, b2, c1, c2, d1, d2, e1 and e2" shown in FIG. 17. In step S203, the horizontal page boundary as shown in FIG. 11 is detected. In step S204, the memory area on the right side is smaller than that on the left side. In step S205, it is decided that the memory area on the right side is to be first read since it is smaller, and specifically, read order is decided as "a2→a1→b2→b1→c2→c1→d2→d1". In step S206, the SDRAM 48 is controlled so that the memory area on the right side is first read. After the read order is decided as "a2→a1→b2→b1→c2→c1→d2→d1", the vertical page boundary as shown in FIG. 17 is detected in step S208. In step S209, it is judged that the unit areas are composed of the same bank as shown in FIG. 15, based on the screen size of "16×2n" and the shape of "a rectangle area of 16 pixels wide by 32 pixels high". In steps S210 and S211, the unit areas are composed of the same bank as shown in FIG. 15, the access order is decided as the order that the memory area on the right side is first read, that is "e2→e1". In step S212, the SDRAM 48 is controlled so that the memory area on the right side is first read. Therefore, the read order of all single-page areas becomes "a2→a1→b2→b1→c2→c1→d2→d1→e2→e1".

Figure 19:
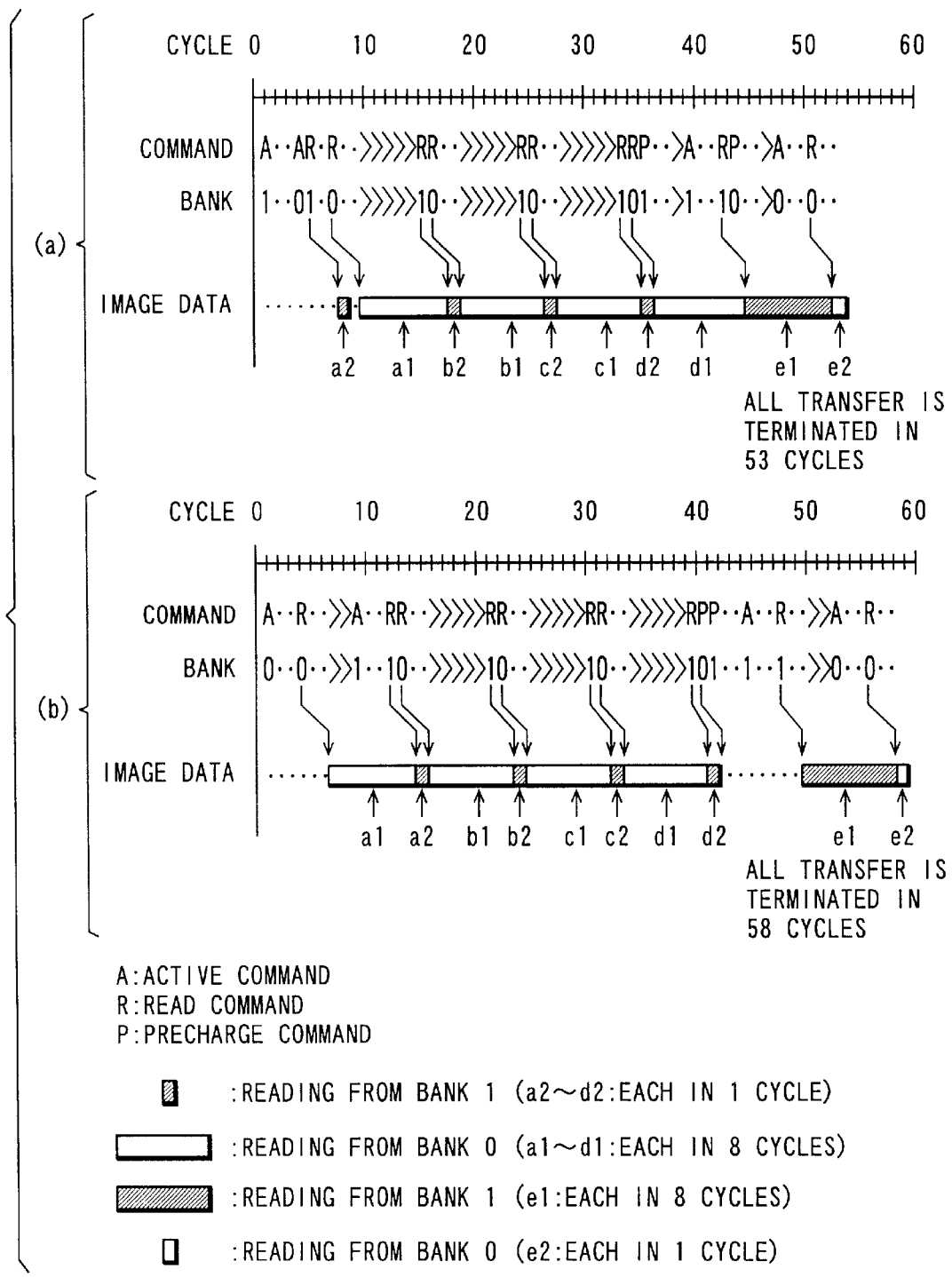
FIG. 19 shows read timing in operation clocks in the case where the reference image shown in FIG. 16 is read from the image data stored as in FIG. 14 in the image decoding system according to the fourth embodiment of the present invention.
Figure 20:
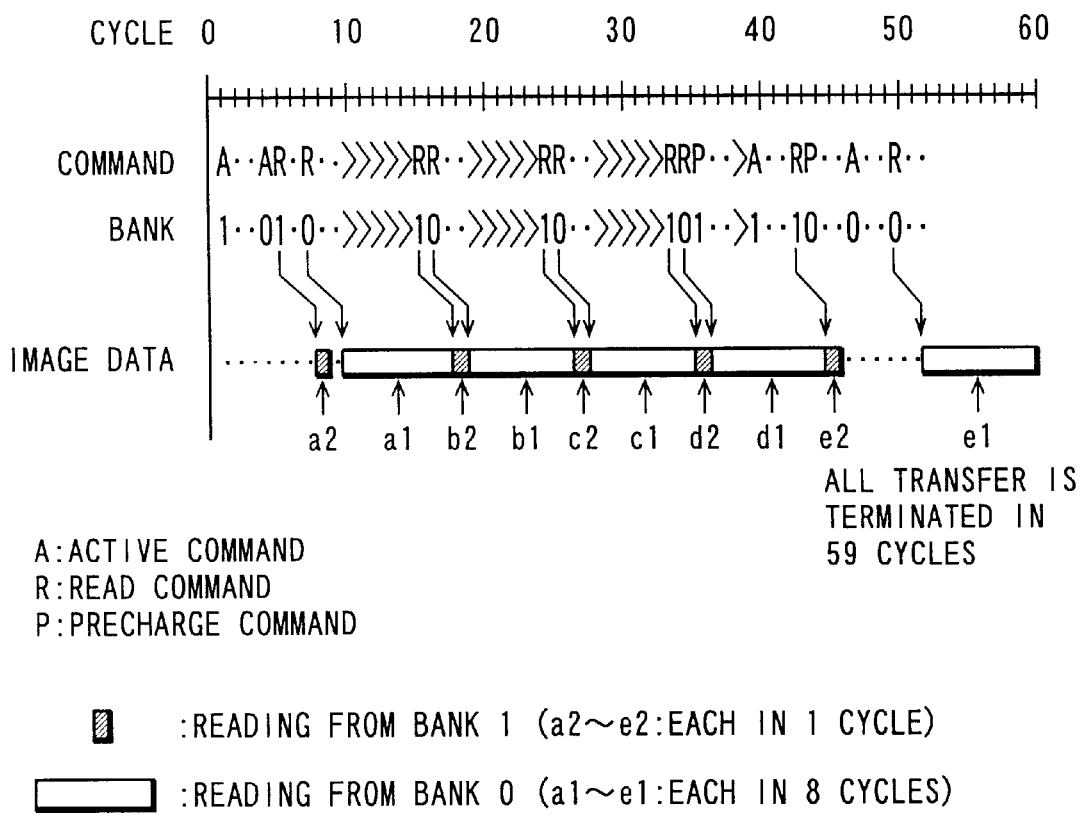
FIG. 20 shows read timing in operation clocks in the case where the reference image shown in FIG. 17 is read from the image data stored as in FIG. 15 in the image decoding system according to the fourth embodiment of the present invention.

Processing in (a) of FIG. 19 shows read timing in operation clocks in the case where the reference image shown in FIG. 16 is read from the image data stored as in FIG. 14 in the image decoding system according to the fourth embodiment. Processing in (b) of FIG. 19 shows read timing in operation clocks in the case where the reference image shown in FIG. 16 is read from the image data stored as in FIG. 14 in order of address in a conventional image decoding system. FIG. 20 shows read timing in operation clocks in the case where the reference image shown in FIG. 17 is read from the image data stored as in FIG. 15 in the image decoding system according to the fourth embodiment.

Note that CAS latency and a burst length are assumed to be 3 and 8 respectively, in the processing in (a) and (b) of FIG. 19 and FIG. 20. Besides, as in the case with FIG. 34, it is assumed here that read data until one clock after a precharge command is inputted is effective, and an interval between a precharge command and an active command and an interval between an active command and a read command to the same bank must be both more than or equal to 3 clocks. It is also assumed that an interval between active commands to the different banks must be 3 clocks.

It is assumed that processing shown in (a) of FIG. 19, processing (b) of FIG. 19, and processing in FIG. 20 require 53, 58, 59 cycles, respectively, to read entire reference images.

Description is now made of some modifications.

Figure 21:
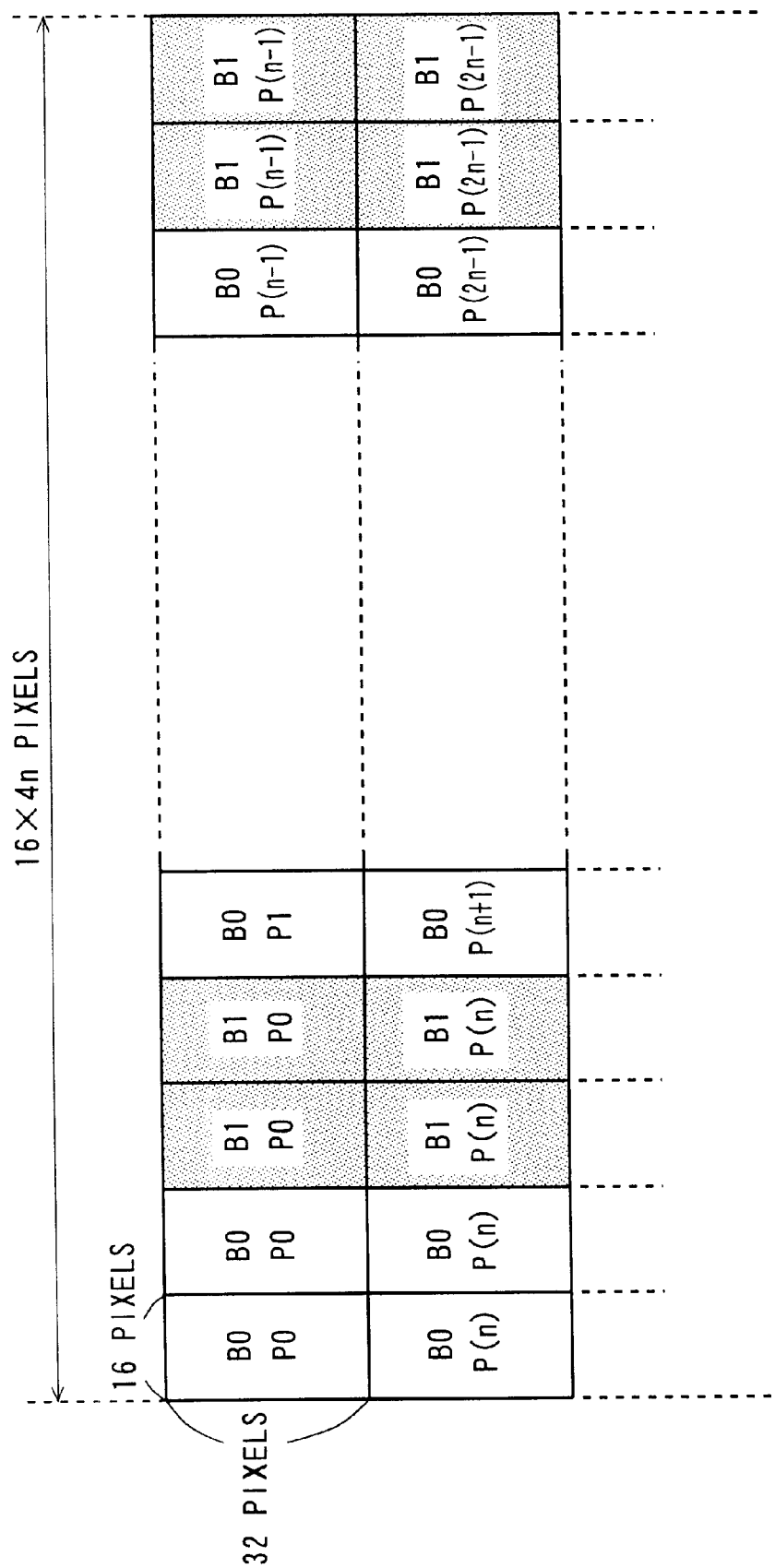
FIG. 21 shows bank numbers and page numbers of memory areas in which image data is stored.

FIG. 21 shows bank numbers and page numbers of memory areas in which image data is stored, in the case where the image data, whose amount per one pixel (the amount represents "brightness", for example) is 8 bits, of "16×(4n)" pixels wide which is composed of rectangle unit areas each of 32 pixels wide by 32 pixels high is stored in the SDRAM 48 comprising two banks (banks 0 and 1) in which a bit width of a data bus is 8 bits, one column is 8 bits and one page includes 1028 columns. Note that "n" is an integer of not less than 1. In FIG. 21, as in the case with FIG. 15, data in single-page rectangle areas horizontally contiguous to each other area stored in the different banks, however, the data in single-page rectangle areas vertically contiguous to each other area stored in the same bank. Therefore, access order in this case is defined as the same as that in the case of FIG. 15.

Figure 22:
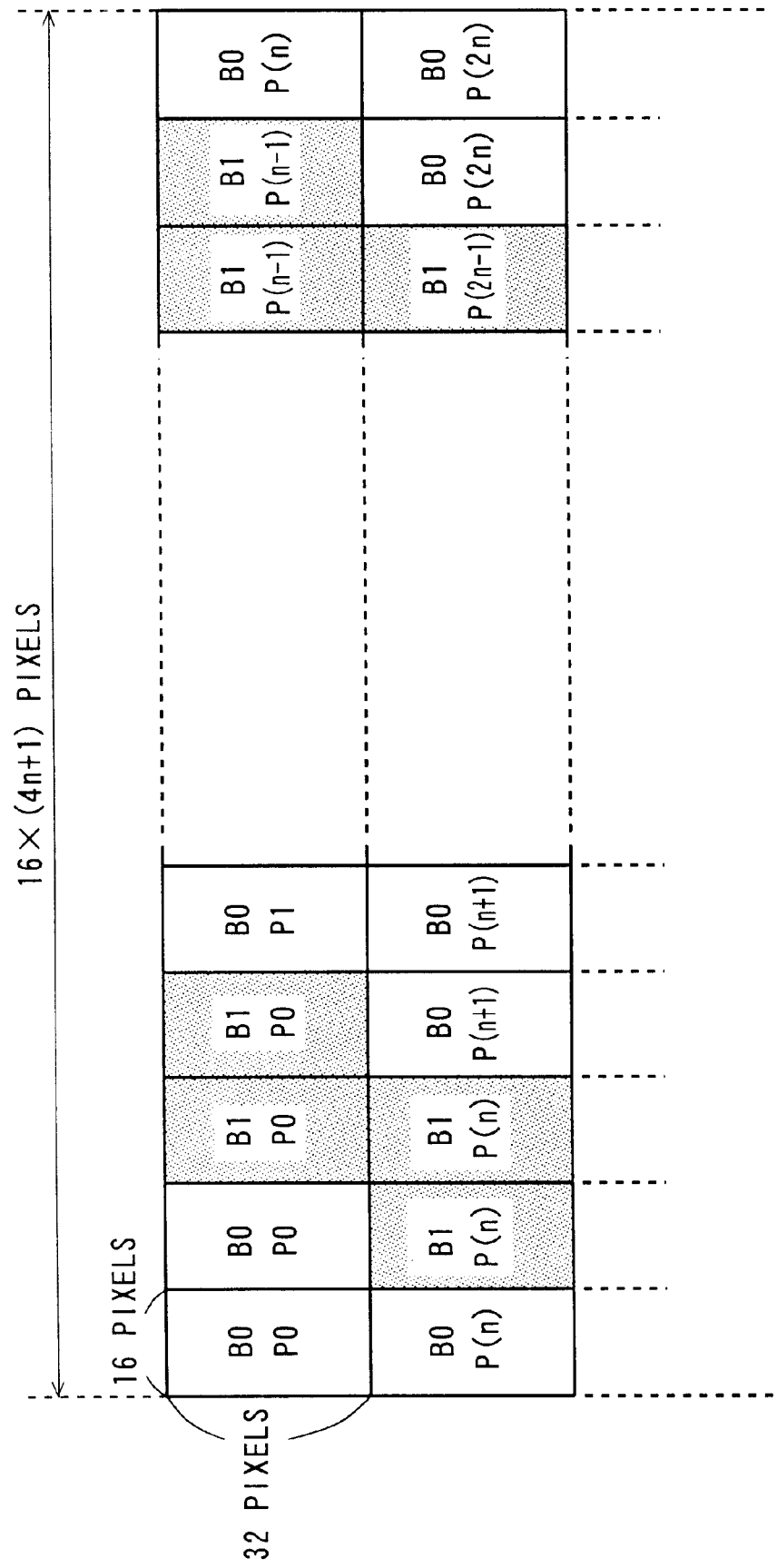
FIG. 22 is the same as FIG. 21 except that the number of horizontal pixels of image data to be stored is "16×(4n+1)"

FIG. 22 is the same as FIG. 21 except that the number of horizontal pixels of image data to be stored is "16×(4n+1)". Access order in this case, therefore, is defined as an order from right to left, independently of the presence of the vertical-page-cross signal.

Figure 23:
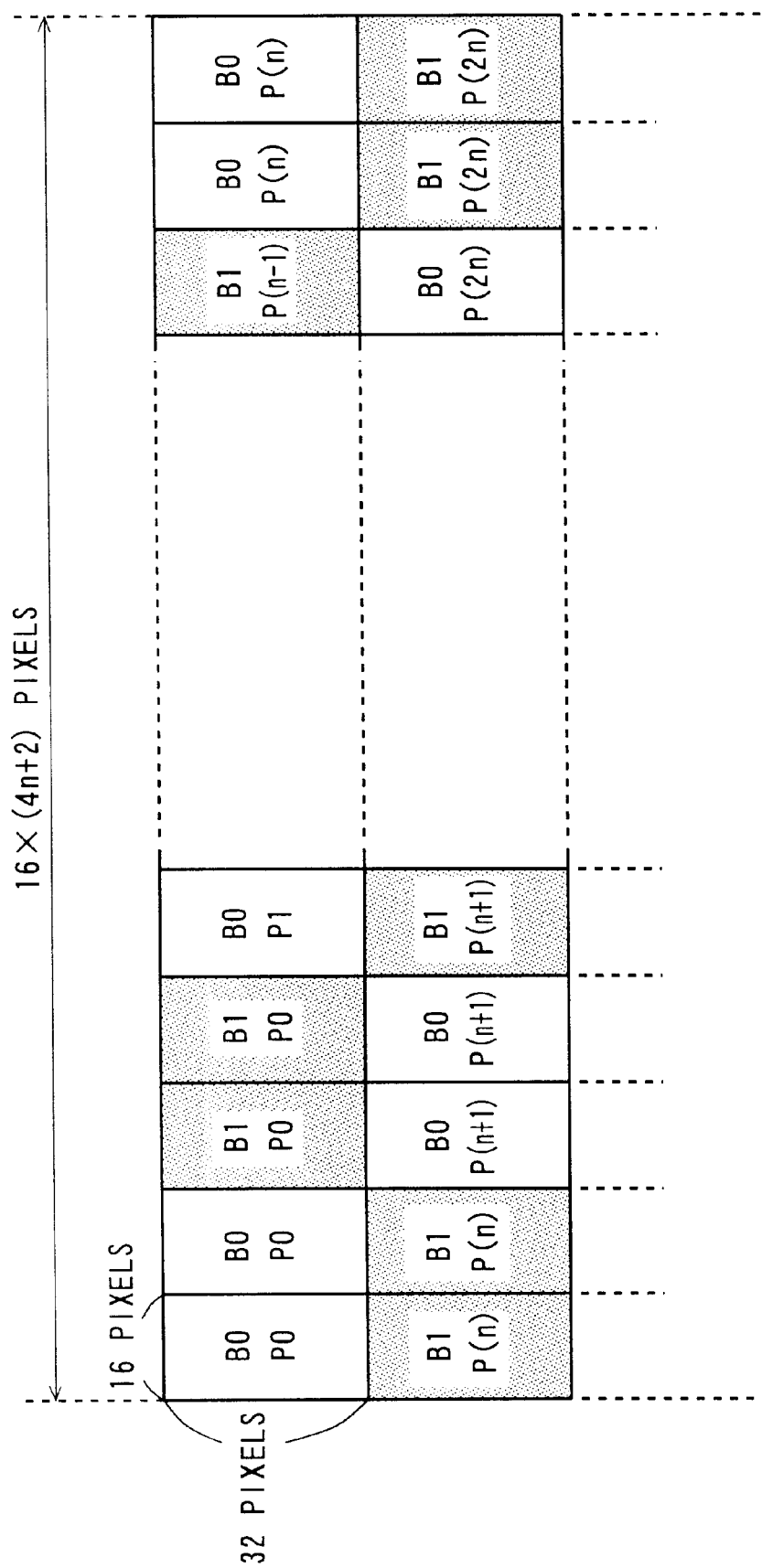
FIG. 23 is the same as FIG. 21 except that the number of horizontal pixels of image data to be stored is "16×(4n+2)"

FIG. 23 is the same as FIG. 21 except that the number of horizontal pixels of image data to be stored is "16×(4n+2)". In FIG. 23, as in the case with FIG. 15, the data in single-page rectangle areas vertically and horizontally contiguous to each other are stored in the different banks. Access order in this case, therefore, is defined as the same as that in the case in FIG. 15.

Figure 24:
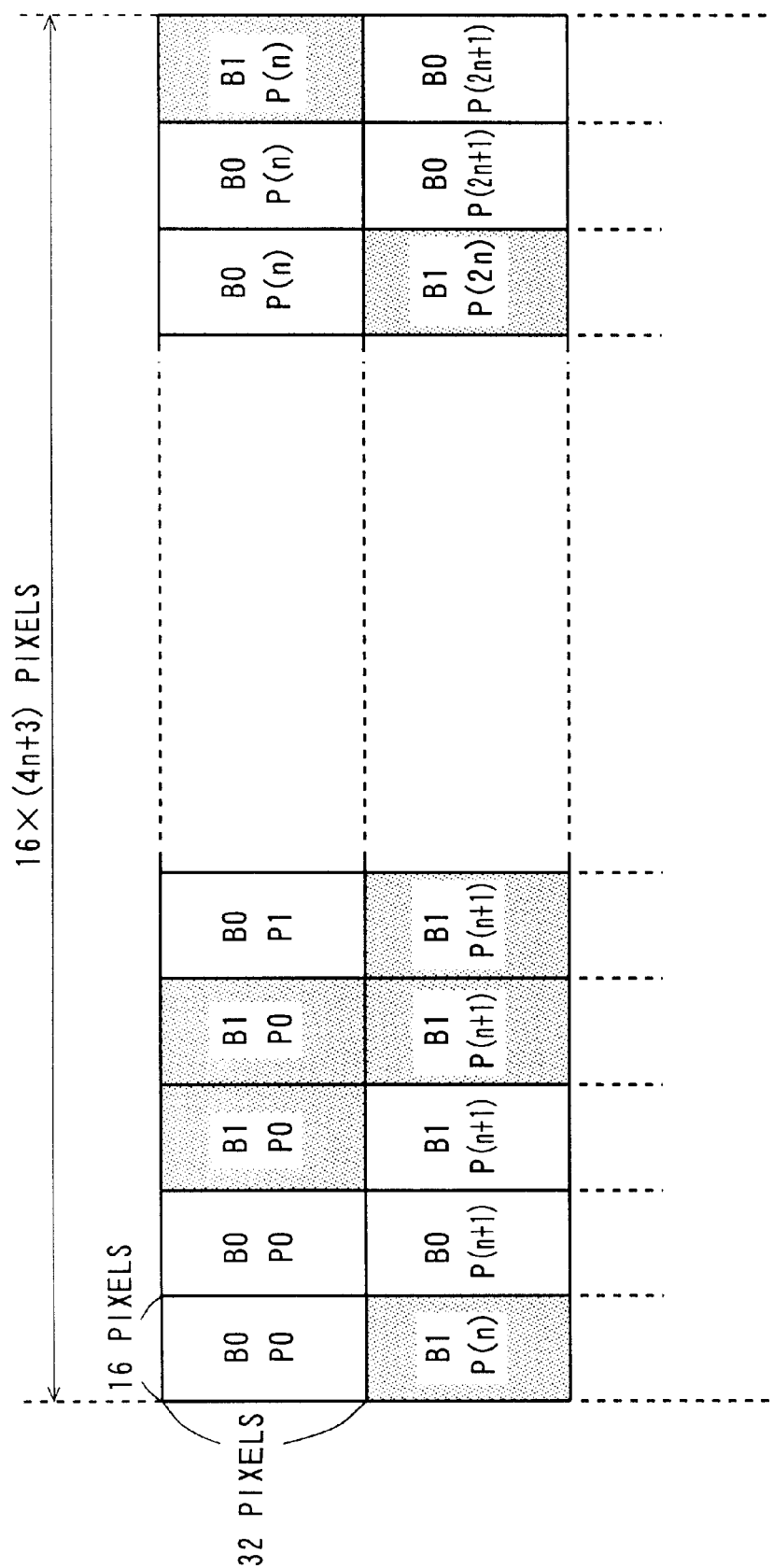
FIG. 24 is the same as FIG. 21 except that the number of horizontal pixels of image data to be stored is "16×(4n+3)"

FIG. 24 is the same as FIG. 21 except that the number of horizontal pixels of image data to be stored is "16×(4n+3)". Access order in this case is defined as an order from left to right, independently of the presence of the vertical-page-cross signal.

As described above, the memory control unit according to the fourth embodiment of the present invention optimizes the order of access to the reference image so that the frequency of continuous access to the memory areas in the same bank is decreased or the frequency of continuous access to the memory areas in different pages in the same memory are accessed according to the optimized access order.

(Fifth Embodiment)

Figure 25:
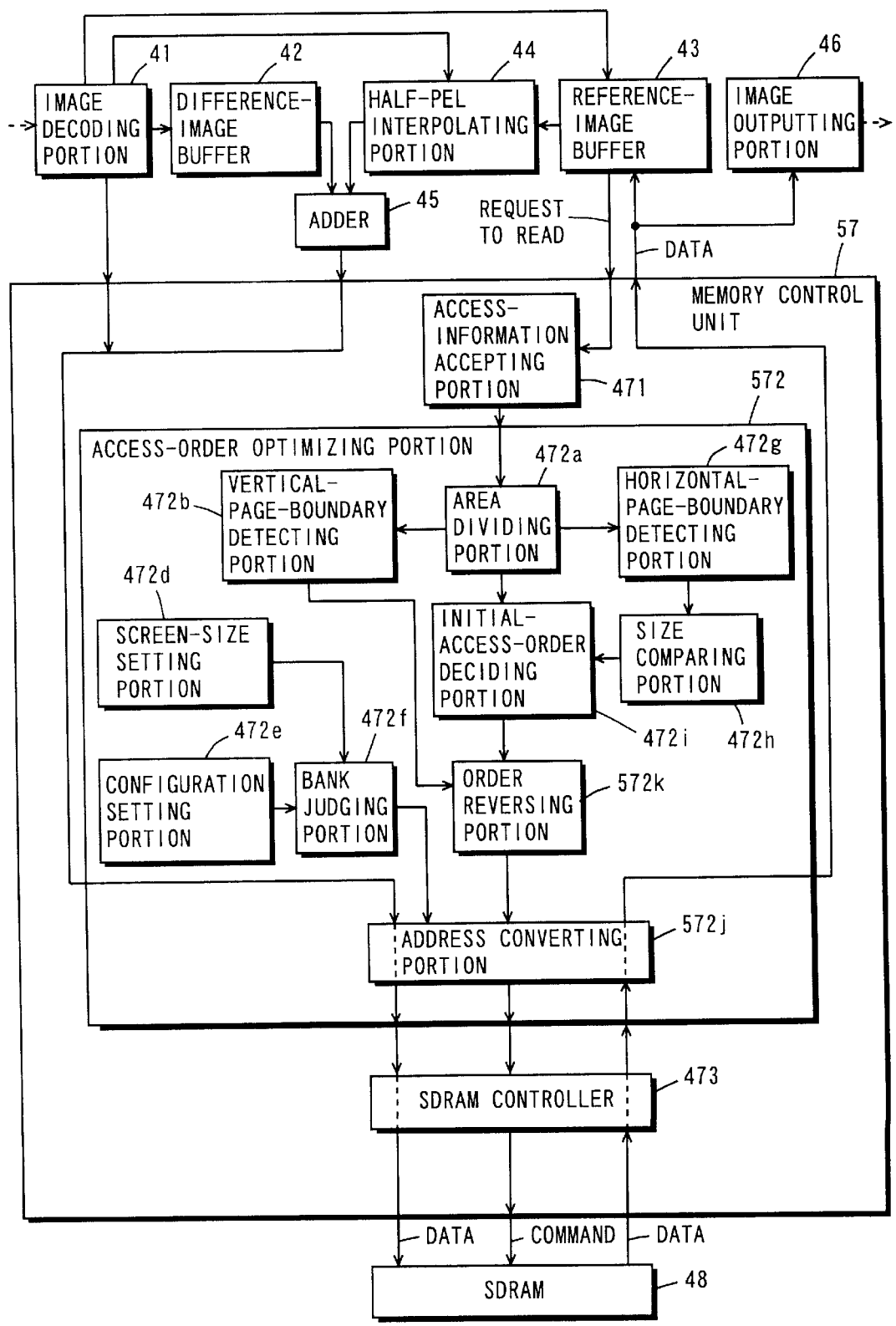
FIG. 25 is a block diagram showing a structure of an image decoding system using a memory control unit according to a fifth embodiment of the present invention.

FIG. 25 is a block diagram showing a structure of an image decoding system (a video decoder) using a memory control unit according to a fifth embodiment of the present invention.

In FIG. 25, the image decoding system according to the fifth embodiment comprises the image decoding portion 41, the difference-image buffer 42, the reference-image buffer 43, the half-pel interpolating portion 44, the adder 45, the image outputting portion 46, a memory controller 57, and an SDRAM 48.

The image decoding system according to the fifth embodiment has a structure in which the memory controller 47 in the image decoding system according to the fourth embodiment is replaced by the memory controller 57. Therefore, the other structure of the image decoding system according to the fifth embodiment is the same as that of the image decoding system according to the fourth embodiment, and the same reference numerals are assigned thereto and its explanation is omitted here.

The memory controller 57 is constituted by the access-information accepting portion 471, an access-order optimizing portion 572, and the SDRAM controller 473.

The access-order optimizing portion 572 includes the area dividing portion 472a, the vertical-page-boundary detecting portion 472b, the screen-size setting portion 472d, the configuration setting portion 472e, the bank judging portion 472f, the horizontal-page-boundary detecting portion 472g, the size comparing portion 472h, the initial-access-order deciding portion 472i, an address converting portion 572j, and an order reversing portion 572k.

The access-order optimizing portion 572 has a structure in which the relative-access-order deciding portion 472c is deleted from the access-order optimizing portion 472 in the fourth embodiment and the address converting portion 572j and the order reversing portion 572k are added thereto. Therefore, the other structure of the access-order optimizing portion 572 in the fifth embodiment is the same as that of the access-order optimizing portion 472 in the fourth embodiment, and the same reference numerals are assigned thereto and its explanation is omitted here.

The address converting portion 572j, in the case where generated image data is stored in predetermined order that memory areas are continuous in the in the display state as in the fourth embodiment and when the bank judging portion 472f judges that the unit areas contiguous to each other across the vertical page boundary are composed of the same bank, converts between a logical address in the image data and a physical address in the SDRAM 48 so that the unit areas are composed of different banks. In the example shown in FIG. 14, it is judged that data in single-page rectangle areas vertically contiguous to each other area stored in different banks, therefore, the address converting portion 572j performs no processing. In the example shown in FIG. 15, since the data in single-page rectangle areas vertically contiguous to each other are judged to be stored in the same bank, the address converting portion 572j converts between the logical address in the image data and the physical address in the SDRAM 48.

More specifically, if no processing is performed in the case shown in FIG. 15, while the data in the single-page rectangle areas horizontally contiguous to each other are stored in the different banks, however, the data in the single-page rectangle areas vertically contiguous to each other are not stored in the different banks. Accordingly, the memory area in the bank 0 and the memory area in the bank 1 which are horizontally contiguous to each other are interchanged (for example, in even-numbered columns) every other rows consisting of memory areas.

The order reversing portion 572k defines order of access to the single-page areas below the vertical page boundary as the reverse to order of access to the single-page areas above the vertical page boundary.

Described next is operation of the memory control unit according to the fifth embodiment.

FIG. 26 shows bank numbers and page numbers of memory areas in which image data is stored, in the case where the image data, whose amount per one pixel (the amount represents "brightness", for example) is 8 bits, of "16×2n" pixels wide which is composed of rectangle unit areas each of 16 pixels wide by 32 pixels high is stored in the SDRAM 48 comprising two banks (bank 0 and 1) in which a bit width of a data bus is 8 bits, one column is 8 bits and one page includes 512 columns while the address converting portion 572j converts an address in the image data. Note that "n" is an integer of not less than 1.

In this case, the address converting portion 572j performs address conversion according to vertical positions of pixel as follows. Note that "m" is an integer of not less than one.

(a) In the case of 64 (m−1)≦the vertical pixel position≦{64 (m−1)+31}, the address conversion is not performed.

(b) In the case of {64 (m−1)+32}≦the vertical pixel position≦{64 (m−1)+63}, the bank 0 is converted into the bank 1 and the bank 1 is converted into the bank 0, thereby performing the address conversion so that the memory area in the bank 0 and the memory area in the bank 1 which are contiguous to each other are interchanged.

It should be noted that when the horizontal pixel number of the image data is "16×(2n+1)", the data in single-page rectangle areas which are contiguous to each other vertically and horizontally in the display state of the image data stored in the different banks in the SDRAM 48 even when no processing is performed, and therefore the address converting portion 572j performs no address conversion.

Accordingly, layout of the bank numbers in which the image data of "16×(2n+1)" pixels wide is stored becomes the same as that for the image data of "16×(2n+1)" pixels wide. As a result, read timing in both cases becomes the same, thereby shortening read time from 59 cycles to 53 cycles as described in the fourth embodiment.

As described above, the memory control unit according to the fifth embodiment of the present invention converts between the logical address in the image data and the physical address in the SDRAM 48 so that data in single-page rectangle areas vertically contiguous to each other is not stored in the same bank, then optimizes the order of access to the reference image so as to decrease the frequency of continuous access to memory areas in the same bank, or frequency of continuous access to memory areas in different pages in the same bank, and thereby controls processing for memory so that the memory areas in memory are accessed according to the optimized access order.

Although the examples of an image decoding system area described in the fourth and fifth embodiments, the present invention can be applied to an image encoding system (a video encoder).

While the invention has been described in detail, the foregoing description is in all aspects illustrative and not restrictive. It is understood that numerous other modifications and variations can be devised without departing from the scope of the invention.

What is claimed is:

1. A memory control unit for controlling a synchronous memory composed of a plurality of banks for reading and writing data using a clock, said memory control unit comprising:

a transfer-target device operable to output commands for data reading and data writing;

an address generating device operable to receive the commands, generate and output previously-determined control signals in accordance with the commands, and output a transfer size of read data in one bank of the plurality of banks to which processing is to be performed;

a command generating device operable to generate and output the clock, receive the control signals, generate and output previously-determined control commands in accordance with the control signals, and thereby control the synchronous memory;

a counter operable to count a number of times of issuing read commands by said command generating device, and receive the transfer size to subtract a burst length from the transfer size with each count; and a data processing device operable to receive the control commands, and mediate data transfer between said transfer-target device and the synchronous memory in accordance with the control commands;

wherein said counter, when the transfer size after the subtraction becomes not more than the burst length, notifying said command generating device of the fact, and in response to the notification, said command generating device issuing a next read command as a read command with precharge for automatically performing precharge processing after the read processing is terminated.

2. A memory control method for controlling a synchronous memory composed of a plurality of banks for reading and writing data using a clock, said method comprising:

outputting commands for data reading and data writing;

generating and outputting previously-determined control signals in accordance with the commands, and outputting a transfer size of read data in one bank of the plurality of banks to which processing is to be performed;

counting the number of times of issuing read commands to the synchronous memory;

subtracting a burst length from the transfer size with each count, and outputting a previously-determined notification when the transfer size after the subtraction becomes not more than the burst length; and generating control commands based on the control signals and the notification, and at the same time, when receiving the notification, issuing a next read command as a read command with precharge for automatically performing precharge processing after the read processing is terminated.

3. A memory control unit for controlling a memory having memory areas divided into a plurality of banks, wherein:

each of the plurality of banks are split into a plurality of split banks; and a delay developing in the memory when access to memory areas in different split banks in a same bank is continuous;

said memory control unit comprising:

an accepting device operable to accept, from an external apparatus, access information indicating two or more memory areas in a bank or banks to be accessed by a plurality of unit access;

an optimizing device operable to optimize and decide an order of access of the plurality of unit access based on whether the memory areas for the plurality of unit access indicated by the access information are in the same bank or different banks so as to decrease a frequency of continuous access to the memory areas in the same bank; and a control device operable to control the memory so that the memory area in the memory is accessed according to the access order optimized and decided by said optimizing device.

4. The memory control unit according to claim 3, wherein said optimizing device is operable to optimize and decide the order of access of the plurality of unit access based on whether the memory areas for the plurality of unit access indicated by the access information are in the same bank or different banks and in the same split bank or different split banks so as to decrease the frequency of continuous access not to memory areas in the same bank but to memory areas in different split banks in the same bank.

5. The memory control unit according to claim 3, wherein:

the external apparatus is constituted by one or more transfer-target units;

the access information is composed of two or more specific access information issued from said transfer-target units; and each of the specific access information is composed of the one or more unit access;

said optimizing device comprises:

a tail specifying device operable to specify a tail bank to be accessed last in currently-accessed specific access information or in preceding specific access information to be accessed first;

a head specifying device operable to specify a head bank to be accessed first in each of the specific access information; and a selecting device operable to select access to a memory area indicated by specific access information corresponding to the head bank representing a different bank from the tail bank prior to access to a memory area indicated by specific access information corresponding to the head bank representing the same bank as the tail bank, and define an order of access immediately after access to a memory area indicated by the preceding specific access information.

6. The memory control unit according to claim 5, wherein:

said tail specifying device is further operable to specify a tail split bank to be accessed last in the preceding specific access information;

said head specifying device is further operable to specify a head split bank to be accessed first in each of the specific access information;

said selecting device is operable to select access to the memory area indicated by the specific access information corresponding to the head bank representing a different bank from the tail bank and access to a memory area indicated by specific access information corresponding to the head split bank representing the same split bank as the tail split bank, prior to access to a memory area indicated by specific access information corresponding to the head bank representing the same bank as the tail bank and also corresponding to the head split bank representing a different split bank from the tail split bank, and define the order of access immediately after the access to the memory area indicated by the preceding specific access information.

7. The memory control unit according to claim 6, wherein:

the specific access information each includes limit information indicating time limits for transfer pending; and said selecting device is operable to judge whether each of the specific access information is to exceed the limits indicated by the limit information or not, and select with the highest priority access to a memory area indicated by specific access information judged to most likely exceed the limits.

8. The memory control unit according to claim 7, wherein:

the memory comprises amplifiers for transfer, each provided for each of the banks for holding data in one predetermined split bank, and access to the memory area in the memory is always made through said amplifiers for transfer;

the delay is the sum of "time required to transfer data held in an amplifier for transfer to one split bank which is accessed just before" and "time required to transfer data stored in one split bank which is currently accessed to an amplifier for transfer"; and the limit information is the number of limit cycles representing limits for the number of cycles permitted from when specific access information is issued to when transfer is completed;

said selecting device comprises:

a remaining-cycle-number holding device operable to hold, for each of the specific access information, the number of remaining cycles representing limits for the number of cycles permitted from a present time to when transfer is completed;

an initial-value setting device operable to make said remaining-cycle-number holding device hold the number of limit cycles as an initial value of the number of remaining cycles when specific access information is issued;

a subtraction device operable to subtract one from the number of remaining cycles held in said remaining-cycle-number holding device in one cycle unit;

a calculation device operable to calculate, for each of the specific access information, "(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access)=the number for prospective cycles for completion" by time when the currently-executed access is completed; and a judging device operable to judge, in a case of "the number of prospective cycles for completion>the number of remaining cycles", that corresponding specific access information is to exceed the limits.

9. The memory control unit according to claim 7, wherein the memory comprises amplifiers for transfer, each provided for each of the banks for holding data in one predetermined split bank, and access to the memory area in the memory is always made through said amplifier for the transfer";

the delay is a sum of "time required to transfer data held in an amplifier for transfer to one split bank which is accessed just before" and "time required to transfer data stored in one split bank which is currently accessed to an amplifier for transfer"; and the limit information is the number of limit cycles representing limits for the number of cycles permitted from when specific access information is issued to when corresponding transfer is completed;

said selecting device comprises:

a counting device operable to count, for each of the specific access information, the number of queued cycles in one cycle unit since the specific access information is issued;

a calculation device operable to calculate, for each of the specific access information, "(said number of queued cycles)+(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access)=the number of prospective cycles for completion" by time when the currently-executed access is completed; and a judging device operable to judge, in a case of "the number of prospective cycles for completion>the number of limit cycles", that corresponding specific access information is to exceed the limits.

10. The memory control unit according to claim 5, wherein:

the specific access information each includes limit information indicating time limits for transfer pending; and said selecting device is operable to judge whether each of the specific access information is to exceed the limits indicated by the limit information or not, and select with the highest priority access to a memory area indicated by specific access information judged to most likely exceed the limits.

11. The memory control unit according to claim 10, wherein said memory comprises amplifiers for transfer each provided for each of the banks for holding data in one predetermined split bank, and access to the memory area in said memory is always made through the amplifiers for transfer, said delay is a sum of "time required to transfer data held in an amplifier for transfer to one split bank which is accessed just before" and "time required to transfer data stored in one split bank which is currently accessed to an amplifier for transfer", said limit information is the number of limit cycles representing limits for the number of cycles permitted from when specific access information is issued to when transfer is completed, and said selecting means includes:

remaining-cycle-number holding means for holding for each of the specific access information the number of remaining cycles representing limits for the number of cycles permitted from a present time to when transfer is completed;

initial-value setting means for making said remaining-cycle-number holding means hold the number of limit cycles as an initial value of the number of remaining cycles when specific access information is issued;

subtraction means for subtracting one from the number of remaining cycles held in said remaining-cycle-number holding, means in one cycle unit;

calculation means for calculating for each of the specific access information "(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access) =the number for prospective cycles for completion" by time when the currently-executed access is completed; and judging means for judging, in a case of "said number of prospective cycles for completion>said number of remaining cycles", that corresponding specific access information is to exceed the limits.

12. The memory control unit according to claim 10, wherein:

the memory comprises amplifiers for transfer, each provided for each of the banks for holding data in one predetermined split bank, and access to the memory area in the memory is always made through said amplifiers for transfer;

the delay is a sum of "time required to transfer data held in an amplifier for transfer to one split bank which is accessed just before" and "time required to transfer data stored in one split bank which is currently accessed to an amplifier for transfer"; and the limit information is the number of limit cycles representing limits for the number of cycles permitted from when specific access information is issued to when transfer is completed;

said selecting device comprises:

a counting device operable to count, for each of the specific access information, the number of queued cycles in one cycle unit since the specific access information is issued;

a calculation device operable to calculate, for each of the specific access information, "(said number of queued cycles)+(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access)=the number of prospective cycles for completion" by time when the currently-executed access is completed; and a judging device operable to judge, in a case of "the number of prospective cycles for completion>the number of limit cycles", that corresponding specific access information is to exceed the limits.

13. The memory control unit according to claim 3, wherein:

the external apparatus is a video decoding apparatus decoding coded image data, or a video encoding apparatus encoding image data;

generated image data is temporarily stored in the memory, and then part of the image data stored in the memory which is continuous in a display state thereof is read to generate new image data;

the generated image data is distributed in unit areas in the memory each composed of a memory area in a single split bank, and stored in predetermined order that the unit areas are continuous in the display state;

unit areas contiguous to each other in storage order are composed of different banks or the same split bank; and the access information indicates a memory area including unit areas contiguous to each other in the display state and in the storage order, and unit areas contiguous to each other in the display state but not contiguous in the storage order, and is issued from said video decoding apparatus or said video encoding apparatus to generate new image data;

said optimizing device comprises:

a dividing device operable to divide a memory area indicated by the access information into continuous single split bank areas each of which is a memory area in a single split bank;

a non-contiguous boundary detecting device operable to detect a non-contiguous boundary representing a boundary between unit areas contiguous to each other in the display state but not contiguous in the storage order; and a relative-order deciding device operable to decide an order of access to the single split bank areas based on whether the unit areas contiguous to each other across the non-contiguous boundary are composed of the same bank or different banks.

14. The memory control unit according to claim 13, wherein said relative-order deciding device is operable to define an order of access to the single split bank areas below the non-contiguous boundary as the same as order of access to the single split bank areas above the non-contiguous boundary when the unit areas contiguous to each other across the non-contiguous boundaries are composed of the same bank, and define the access order as the reverse when the unit areas are composed of different banks.

15. The memory control unit according to claim 14, wherein said optimizing device further comprises:

a screen-size setting device operable to set the number of pixels which are continuous in the storage order and in the display state in image data to be stored in the memory as a screen size;

a configuration setting device operable to set a shape of the unit area; and a bank judging device operable to judge whether the unit areas contiguous to each other across the non-contiguous boundary are composed of the same bank or different banks based on the screen size and the shape in the case where the generated image data is stored in predetermined order that the image data is continuous in the display state.

16. The memory control unit according to claim 15, wherein said optimizing device further comprises:

a contiguous-boundary detecting device operable to detect a contiguous boundary representing a boundary between the unit areas contiguous to each other in the display state and in the storage order;

a comparing device operable to compare size of memory areas obtained by dividing the memory area indicated by the access information by the contiguous boundary; and an initial-order deciding device operable to define an order of access to the single split bank areas above the non-contiguous boundary as order that single split bank areas belonging to a memory area judged to be smaller by the comparison made by said comparing device are read first.

17. The memory control unit according to claim 14, wherein said optimizing device further comprises:

a contiguous-boundary detecting device operable to detect a contiguous boundary representing a boundary between the unit areas contiguous to each other in the display state and in the storage order;

a comparing device operable to compare size of memory areas obtained by dividing the memory area indicated by the access information by the contiguous boundary; and an initial-order deciding device operable to define an order of access to the single split bank areas above the non-contiguous boundary as order that single split bank areas belonging to a memory area judged to be smaller by the comparison made by said comparing device are read first.

18. The memory control unit according to claim 13, wherein said optimizing device further comprises:

a screen-size setting device operable to set the number of pixels which are continuous in the storage order and in the display state in image data to be stored in the memory as a screen size;

a configuration setting device operable to set a shape of the unit area; and a bank judging device operable to judge whether the unit areas contiguous to each other across the non-contiguous boundary are composed of the same bank or different banks based on the screen size and the shape in the case where the generated image data is stored in predetermined order that the image data is continuous in the display state.

19. The memory control unit according to claim 18, wherein said optimizing device further comprises:

a contiguous-boundary detecting device operable to detect a contiguous boundary representing a boundary between the unit areas contiguous to each other in the display state and in the storage order;

a comparing device operable to compare size of memory areas obtained by dividing the memory area indicated by the access information by the contiguous boundary; and an initial-order deciding device operable to define an order of access to the single split bank areas above the non-contiguous boundary as order that single split bank areas belonging to a memory area judged to be smaller by the comparison made by said comparing device are read first.

20. The memory control unit according to claim 13, wherein said optimizing device further comprises:

a contiguous-boundary detecting device operable to detect a contiguous boundary representing a boundary between the unit areas contiguous to each other in the display state and in the storage order;

a comparing device operable to compare size of memory areas obtained by dividing the memory area indicated by the access information by the contiguous boundary; and an initial-order deciding device operable to define an order of access to the single split bank areas above the non-contiguous boundary as order that single split bank areas belonging to a memory area judged to be smaller by said comparison made by said comparing device are read first.

21. The memory control unit according to claim 3, wherein:

the external apparatus is a video decoding apparatus decoding coded image data, or a video encoding apparatus encoding image data;

generated image data is temporarily stored in the memory, and then part of the image data stored in the memory which is continuous in a display state thereof is read to generate new image data;

the generated image data is distributed in unit areas in the memory each composed of a memory area in a single split bank, and stored in predetermined order that the unit areas are continuous in the display state;

unit areas contiguous to each other in storage order are composed of different banks or the same split bank; and the access information indicates a memory area including unit areas contiguous to each other in the display state and in the storage order, and unit areas contiguous to each other in the display state but not contiguous in the storage order, and is issued from said video decoding apparatus or said video encoding apparatus to generate new image data;

said optimizing device comprises:
  a dividing device operable to divide a memory area indicated by the access information into continuous single split bank areas each of which is a memory area in a single split bank;
  a non-contiguous-boundary detecting device operable to detect a non-contiguous boundary representing a boundary between unit areas contiguous to each other in the display state but not contiguous in the storage order;
  an address converting device operable to convert between a logical address in the image data and a physical address in the memory so that the unit areas contiguous to each other across the non-contiguous boundary are composed of different banks when the unit areas are composed of the same bank in a case where the generated image data is stored in predetermined order that the image data is continuous in the display state; and
  an order reversing device operable to define an order of access to the single split bank areas below the non-contiguous boundary as the reverse to order of access to the single split bank areas above the non-contiguous boundary.

22. The memory control unit according to claim 13, wherein said optimizing device further comprises:
  a screen-size setting device operable to set the number of pixels which are continuous in the storage order and in the display state in image data to be stored in the memory as a screen size;
  a configuration setting device operable to set a shape of the unit area; and
  a bank judging device operable to judge whether the unit areas contiguous to each other across the non-contiguous boundary are composed of the same bank or different banks based on the screen size and the shape in the case where the generated image data is stored in predetermined order that the image data is continuous in the display state.

23. The memory control unit according to claim 22, wherein said optimizing device further comprises:
  a contiguous-boundary detecting device operable to detect a contiguous boundary representing a boundary between the unit areas contiguous to each other in the display state and in the storage order;
  a comparing device operable to compare size of memory areas obtained by dividing the memory areas indicated by the access information by the contiguous boundary; and
  an initial-order deciding device operable to define an order of access to the single split bank areas above the non-contiguous boundary as order that single split bank areas belonging to a memory area judged to be smaller by the comparison made by said comparing device are read first.

24. The memory control unit according to claim 21, wherein said optimizing device further comprises:
  a contiguous-boundary detecting device operable to detect a contiguous boundary representing a boundary between the unit areas contiguous to each other in the display state and in the storage order;
  a comparing device operable to compare size of memory areas obtained by dividing the memory area indicated by the access information by the contiguous boundary; and
  an initial-order deciding device operable to define an order of access to the single split bank areas above the non-contiguous boundary as order that single split bank areas belonging to a memory area judged to be smaller by the comparison made by said comparing device are read first.

25. A computer readable recording medium containing a program for realizing an operational environment in a computer, wherein a synchronous memory is provided which is composed of plurality of banks for reading and writing data using a clock, said operational environment realized by said program contained on said recording medium comprising:

outputting commands for data reading and data writing;
  generating and outputting previously-determined control signals in accordance with the commands, and outputting a transfer size of read data in one bank of the plurality of banks to which processing is to be performed;
  counting the number of times of issuing read commands to the synchronous memory;
  subtracting a burst length from the transfer size with each count, and outputting a previously-determined notification when the transfer size after the subtraction becomes not more than the burst length; and
  issuing control commands based on the control signals and the notification, and at the same time, when receiving the notification, issuing a next read command as a read command with precharge for automatically performing precharge processing after the read processing is terminated.

26. A computer readable recording medium containing a program for realizing an operational environment in a computer, wherein a memory area is provided which is divided into a plurality of banks each divided into a plurality of split banks in which a delay develops due to continuous access to memory areas in different split banks in the same bank, said operational environment realized by said program contained on said recording medium comprising:

accepting, from an external apparatus, access information indicating two or more memory areas in a bank or banks to be accessed by a plurality of unit access;

optimizing and deciding an order of access of the plurality of unit access based on whether the memory areas for the plurality of unit access indicated by the access information are in the same banks or different banks so as to decrease a frequency of continuous access to the memory areas in the same bank; and controlling the memory so that the memory area in the memory is accessed according to the access order optimized and decided by said optimizing.

27. The computer readable recording medium according to claim 26, wherein said optimizing and deciding optimizes and decides the order of access of the plurality of unit access based on whether the memory areas for the plurality of unit access indicated by the access information are in the same bank or different banks and in the same split bank or different split banks and so as to decrease the frequency of continuous access not to memory areas in the same bank but to memory areas in different split banks in the same bank.

28. The computer readable recording medium according to claim 26, wherein:

the external apparatus is constituted by one or more transfer-target units;

the access information is composed of two or more specific access information issued from the transfer-target units; and each of said specific access information is composed of the one or more unit access;

said optimizing and deciding further comprises:
specifying a tail bank to be accessed last in currently-accessed specific access information or in preceding specific access information to be accessed first;
specifying a head bank to be accessed first in each of the specific access information; and
selecting access to a memory area indicated by specific access information corresponding to the head bank representing a different bank from the tail bank prior to access to a memory area indicated by specific access information corresponding to the head bank representing the same bank as the tail bank, and defining an order of access immediately after access to a memory area indicated by the preceding specific access information.

29. The computer readable recording medium according to claim 28, wherein:

said tail-specifying further specifies a tail split bank to be accessed last in the preceding specific access information;

said head-specifying further specifies a head split bank to be accessed first in each of the specific access information; and said order-defining selects access to the memory area indicated by the specific access information corresponding to the head bank representing a different bank from the tail bank and access to a memory area indicated by specific access information corresponding to the head split bank representing the same split bank as the tail bank, prior to access to a memory area indicated by specific access information corresponding to the head bank representing the same bank as the tail bank and also corresponding to the head split bank representing a different split bank from the tail split bank, and defines the order of access immediately after the access to the memory area indicated by the preceding specific access information.

30. The computer readable recording medium according to claim 29, wherein:

the specific access information each includes limit information indicating time limits for transfer pending; and said order-defining judges whether each of the specific access information is to exceed the limits indicated by the limit information or not, and selects with the highest priority access to a memory area indicated by specific access information judged to most likely exceed the limits.

31. The computer readable recording medium according to claim 30, wherein:

the memory comprises amplifiers for transfer, each provided for each of the banks for holding data in one predetermined split bank, and access to the memory area in the memory is always made through said amplifiers for transfer;

the delay is a sum of "time required to transfer data held in an amplifier for transfer to one split bank which is accessed just before" and "time required to transfer data stored in one split bank which is currently accessed to an amplifier for transfer"; and the limit information is the number of limit cycles representing limits for the number of cycles permitted from when specific access information is issued to when transfer is completed;

said order-defining further comprises:
holding, for each of the specific access information, the number of remaining cycles representing limits for the number of cycles permitted from a present time to when transfer is completed;
making said holding hold the number of limit cycles as an initial value of the number of remaining cycles when specific access information is issued;
subtracting one from the number of remaining cycles held in said holding in one cycle unit;
calculating, for each of the specific access information, "(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access)=the number for prospective cycles for completion" by time when the currently-executed access is completed; and
judging, in a case of "the number of prospective cycles for completion>the number of remaining cycles", that corresponding specific access information is to exceed the limits.

32. The computer readable recording medium according to claim 30, wherein:

the memory comprises amplifiers for transfer, each provided for each of the banks for holding data in one predetermined split bank, and access to the memory area in the memory is always made through the amplifiers for transfer;

the delay is a sum of "time required to transfer data held in an amplifier for transfer to one split bank which is accessed just before" and "time required to transfer data stored in one split bank which is currently accessed to an amplifier for transfer"; and the limit information is the number of limit cycles representing limits for the number of cycles permitted from when specific access information is issued to when corresponding transfer is completed;

said order-defining further comprises:

counting, for each of the specific access information, the number of queued cycles in one cycle unit since the specific access information is issued;

calculating, for each of the specific access information, "(the number of queued cycles)+(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access)=the number of prospective cycles for completion" by time when the currently-executed access is completed; and judging, in a case of "the number of prospective cycles for completion>the number of limit cycles", that corresponding specific access information is to exceed the limits.

33. The computer readable recording medium according to claim 28, wherein:

the specific access information each includes limit information indicating time limits for transfer pending; and said order-defining judges whether each of the specific access information is to exceed the limits indicated by the limit information or not, and selects with the highest priority access to a memory area indicated by specific access information judged to most likely exceed the limits.

34. The computer readable recording medium according to claim 33, wherein the memory comprises amplifiers for transfer, each being provided for each of the banks for holding data in one predetermined split bank, and access to the memory area in the memory is always made through said amplifiers for transfer;

the delay is a sum of "time required to transfer data held in an amplifier for transfer to one split bank which is accessed just before" and "time required to transfer data stored in one split bank which is currently accessed to an amplifier for transfer"; and the limit information is the number of limit cycles representing limits for the number of cycles permitted from when specific access information is issued to when transfer is completed;

said order-defining further comprises:

holding, for each of the specific access information, the number of remaining cycles representing limits for the number of cycles permitted from a present time to when transfer is completed;

making said holding hold the number of limit cycles as an initial value of the number of remaining cycles when specific access information is issued;

subtracting one from the number of remaining cycles held in said holding in one cycle unit;

calculating, for each of the specific access information, "(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+(the number of cycles required for its own access)=the number for prospective cycles for completion" by time when the currently-executed access is completed; and judging, in a case of "the number of prospective cycles for completion>the number of remaining cycles", that corresponding specific access information is to exceed the limits.

35. The computer readable recording medium according to claim 33, wherein:

the memory comprises amplifiers for transfer, each provided for each of the banks for holding data in one predetermined split bank, and access to the memory area in the memory is always made through the amplifiers for transfer;

the delay is a sum of "time required to transfer data held in an amplifier for transfer to one split bank which is accessed just before" and "time required to transfer data stored in one split bank which is currently accessed to an amplifier for transfer"; and the limit information is the number of limit cycles representing limits for the number of cycles permitted from when specific access information is issued to when transfer is completed;

said order-defining further comprises:

counting, for each of the specific access information, the number of queued cycles in one cycle unit since the specific access information is issued;

calculating, for each of the specific access information, "(the number of queued cycles)+(the number of cycles required until currently-executed access is completed)+(the number of cycles required to access specific access information selected with higher priority)+(the number of cycles required to transfer data held in an amplifier for transfer to one predetermined split bank)+(the number of cycles required to transfer data stored in one predetermined split bank to an amplifier for transfer)+( the number of cycles required for its own access)=the number of prospective cycles for completion" by time when the currently-executed access is completed; and judging, in a case of "the number of prospective cycles for completion>the number of limit cycles", that corresponding specific access information is to exceed the limits.

36. The computer readable recording medium according to claim 26, wherein:

the external apparatus is a video decoding apparatus decoding coded image data, or a video encoding apparatus encoding image data;

generated image data is temporarily stored in the memory, and then part of the image data stored in the memory which is continuous in a display state thereof is read to generate new image data;

the generated image data is distributed in unit areas in the memory each composed of a memory area in a single split bank, and stored in predetermined order that the unit areas are continuous in the display state;

unit areas contiguous to each other in storage order are composed of different banks or the same split bank; and the access information indicates a memory area including unit areas contiguous to each other in the display state and in the storage order, and unit areas contiguous to each other in the display state but not contiguous in the storage order, and is issued from the video decoding apparatus or the video encoding apparatus to generate new image data;

said optimizing and deciding further comprises:

dividing a memory area indicated by the access information into continuous single split bank areas each of which is a memory area in single split bank;

detecting a non-contiguous boundary representing a boundary between unit areas contiguous to each other in the display state but not contiguous in the storage order; and deciding an order of access to the single split bank areas based on whether the unit areas contiguous to each other across the non-contiguous boundary are composed of the same bank or different banks.

37. The computer readable recording medium according to claim 36, wherein said deciding defines an order of access to the single split bank areas below the non-contiguous boundary as the same as order of access to the single bank areas above the non-contiguous boundary when the unit areas contiguous to each other across the non-contiguous boundary are composed of the same bank, and defines the access order as the reverse when the unit areas are composed of different banks.

38. The computer readable recording medium according to claim 37, wherein said optimizing and deciding further comprises:

setting the number of pixels which are continuous in the storage order and in the display state in image data to be stored in the memory as a screen size;

setting a shape of the unit area; and judging whether the unit areas contiguous to each other across the non-contiguous boundary are composed of the same bank or different banks based on the screen size and the shape in the case where the generated image data is stored in predetermined order that the image data is continuous in the display state.

39. The computer readable recording medium according to claim 38, wherein said optimizing and deciding further comprises:

detecting a contiguous boundary representing a boundary between the unit area contiguous to each other in the display state and in the storage order;

comparing size of memory areas obtained by dividing the memory area indicated by the access information by the contiguous boundary; and defining an order of access to the single split bank areas above the non-contiguous boundary as order that single split bank areas belonging to a memory area judged to be smaller by the comparison made by said comparing are read first.

40. The computer readable recording medium according to claim 37, wherein said optimizing and deciding further comprises:

detecting a contiguous boundary representing a boundary between the unit areas contiguous to each other in the display state and in the storage order;

comparing size of memory areas obtained by dividing the memory area indicated by the access information by the contiguous boundary; and defining an order of access to the single split bank areas above the non-contiguous boundary as order that single split bank areas belonging to a memory area judged to be smaller by the comparison made by said comparing are read first.

41. The computer readable recording medium according to claim 36, wherein said optimizing and deciding further comprises:

detecting a contiguous boundary representing a boundary between the unit areas contiguous to each other in the display state and in the storage order;

comparing size of memory areas obtained by dividing the memory area indicated by the access information by the contiguous boundary; and defining an order of access to the single split bank areas above the non-contiguous boundary as order that single split bank areas belonging to a memory area judged to be smaller by the comparison made by said comparing are read first.

42. The computer readable recording medium according to claim 26, wherein:

the external apparatus is a video decoding apparatus decoding coded image data, or a video encoding apparatus encoding image data;

generated image data is temporarily stored in the memory, and then part of the image data stored in the memory which is continuous in a display state thereof is read to generate new image data;

the generated image data is distributed in unit areas in the memory each composed of a memory area in a single split bank, and stored in predetermined order that the unit areas are continuous in the display state;

unit areas contiguous to each other in storage order are composed of different banks or the same split bank; and the access information indicates a memory area including unit areas contiguous to each other in the display state and in the storage order, and unit areas contiguous to each other in the display state but not contiguous in the storage order, and is issued from the video decoding apparatus or the video encoding apparatus to generate new image data;

said optimizing and deciding further comprises:

dividing a memory area indicated by the access information into continuous single split bank areas each of which is a memory area in a single split bank;

detecting a non-contiguous boundary representing a boundary between unit areas contiguous to each other in the display state but not contiguous in the storage order;

converting between a logical address in the image data and a physical address in the memory so that the unit areas contiguous to each other across the non-contiguous boundary are composed of different banks when the unit areas are composed of the same bank in a case where the generated image data is stored in predetermined order that the image data is continuous in the display state; and defining an order of access to the single split bank areas below the non-contiguous boundary as the reverse to order of access to the single split bank areas above the non-contiguous boundary.

43. The computer readable recording medium according to claim 42, wherein said optimizing and deciding further comprises:

setting the number of pixels which are continuous in the storage order and in the display state in image data to be stored in the memory as a screen size;

setting a shape of the unit area; and judging whether the unit areas contiguous to each other across the non-contiguous boundary are composed of the same bank or different banks based on the screen size and the shape in the case where the generated image data is stored in predetermined order that the image data is continuous in the display state.

44. The computer readable recording medium according to claim 43, wherein said optimizing and deciding further comprises:

detecting a contiguous boundary representing a boundary between the unit areas contiguous to each other in the display state and in the storage order;

comparing size of memory areas obtained by dividing the memory area indicated by the access information by the contiguous boundary; and defining an order of access to the single split bank areas above the non-contiguous boundary as order that single split bank areas belonging to a memory area judged to be smaller by the comparison made by said comparing are read first.

45. The computer readable recording medium according to claim 42, wherein said optimizing and deciding further comprises:

detecting a contiguous boundary representing a boundary between the unit areas contiguous to each other in the display state and in the storage order;

comparing size of memory areas obtained by dividing the memory area indicated by the access information by the contiguous boundary; and defining an order of access to the single split bank areas above the non-contiguous boundary as order that single split bank areas belonging to a memory area judged to be smaller by the comparison made by said comparing are read first.

46. The computer readable recording medium according to claim 36, wherein said optimizing and deciding further comprises:

setting the number of pixels which are continuous in the storage order and in the display state in image data to be stored in the memory as a screen size;

setting a shape of the unit area; and judging whether the unit areas contiguous to each other across the non-contiguous boundary are composed of the same bank or different banks based on the screen size and the shape in the case where the generated image data is stored in predetermined order that the image data is contiguous in the display state.

47. The computer readable recording medium according to claim 46, wherein said optimizing and deciding further comprises:

detecting a contiguous boundary representing a boundary between the unit area contiguous to each other in the display state and in the storage order;

comparing size of memory areas obtained by dividing the memory area indicated by the access information by the contiguous boundary; and defining an order of access to the single split bank areas above the non-contiguous boundary as order that single split bank areas belonging to a memory area judged to be smaller by said comparison made by said comparing are read first.

* * * * *